United States Patent
Yasui et al.

(10) Patent No.: US 6,473,890 B1
(45) Date of Patent: Oct. 29, 2002

(54) CLOCK CIRCUIT AND METHOD OF DESIGNING THE SAME

(76) Inventors: Takuya Yasui, 1-1-10, Himuro-cho, Takatsuki, Osaka 569-1141 (JP); Keiichi Kurokawa, 2-11-15-614, Minamihibarigaoka, Takarazuka-shi, Hyogo 665-0811 (JP); Masahiko Toyonaga, 1-3-85, Seiwadai-nishi, Kawanishi-shi, Hyogo 666-0143 (JP); Atsushi Takahashi, 1-17-3-803, Watarida, Kawasaki-ku, Kawasaki-shi, Kanagawa 210-0837 (JP); Yoji Kajitani, 22-28, Sakuradai, Aoba-ku, Yokohama-shi, Kanagawa 227-0061 (JP)

( * ) Notice: Subject to any disclaimer, the term of this patent is extended or adjusted under 35 U.S.C. 154(b) by 158 days.

(21) Appl. No.: 09/663,933

(22) Filed: Sep. 18, 2000

(30) Foreign Application Priority Data

Sep. 20, 1999 (JP) .......................... 11-265826
Mar. 24, 2000 (JP) ......................... 2000-084643
Jul. 14, 2000 (JP) ......................... 2000-213805

(51) Int. Cl.$^7$ .................. G06F 17/50; H03K 23/40; H03K 19/096; H03L 7/00
(52) U.S. Cl. .............. 716/10; 716/7; 716/11; 326/46; 326/47; 326/93; 327/144
(58) Field of Search .............. 716/1–21; 326/93–98, 326/101–103, 40–41, 46–47; 327/144–153, 108–112, 291–299, 164–165, 170, 172, 178, 184

(56) References Cited

U.S. PATENT DOCUMENTS

| | | | | |
|---|---|---|---|---|
| 4,714,924 A | * | 12/1987 | Ketzler ............... 340/825.21 |
| 5,313,501 A | * | 5/1994 | Thacker ............... 375/369 |
| 5,418,822 A | * | 5/1995 | Schlachter et al. ........ 375/354 |
| 5,481,573 A | * | 1/1996 | Jacobowitz et al. ........ 375/356 |
| 5,579,510 A | * | 11/1996 | Wang et al. .............. 716/6 |
| 5,638,410 A | * | 6/1997 | Kuddes ............... 375/357 |
| 5,796,624 A | | 8/1998 | Sridhar et al. ............ 703/14 |
| 5,849,610 A | | 12/1998 | Zhu ............... 438/129 |
| 5,896,299 A | | 4/1999 | Ginetti et al. ........... 716/4 |
| 5,917,350 A | * | 6/1999 | Graf, III ............ 327/144 |
| 5,939,919 A | * | 8/1999 | Proebsting ........... 327/295 |
| 6,297,668 B1 | * | 10/2001 | Schober ............ 326/101 |
| 6,359,479 B1 | * | 3/2002 | Oprescu ............ 327/141 |
| 6,359,480 B1 | * | 3/2002 | Isobe et al. ......... 327/141 |

FOREIGN PATENT DOCUMENTS

| | | | | |
|---|---|---|---|---|
| EP | 306662 A2 | * | 3/1989 | ...... H03K/5/13 |
| JP | 9-63291 | | 3/1997 | ...... G11C/19/00 |

OTHER PUBLICATIONS

NN9106302 ("Cycle Time Optimization Subject to Performance Constraints", IBM Technical Disclosure Bulletin, vol. 34, No. 1, Jun. 1991, pp. 302–307 (9 pages)).*
Afghahi et al. ("Performance of Synchronous and Asynchronous Schemes for VLSI Systems", IEEE Transactions on Computer, vol. 41, No. 7, Jul. 1992, pp. 858–872).*

(List continued on next page.)

Primary Examiner—Vuthe Siek
Assistant Examiner—Phallaka Kik
(74) Attorney, Agent, or Firm—McDermott, Will & Emery

(57) ABSTRACT

Based on the arrangement of a plurality of synchronous devices in an integrated circuit or on timing constraints, a group of discrete clock delay values composed of a finite number of discrete values to be allocated as respective clock delay values to the individual synchronous devices is determined. Then, the clock delay value selected from the group of discrete clock delay values is allocated as a selected clock delay value to each of the synchronous devices, while the operation of the integrated circuit is ensured. Thereafter, a clock circuit for supplying a clock signal to each of the synchronous devices in accordance with the selected clock delay value is designed.

30 Claims, 27 Drawing Sheets

OTHER PUBLICATIONS

Lockyear et al. ("Optimal Retiming of Level–Clocked Circuits Using Symmetric Clock Schedules", IEEE Transactions on Computer–Aided Design of Integrated Circuits and Systems, vol. 13, No. 9, Sep. 1994, pp. 1097–1109).*

Andrew et al. ("Design of Synchronous Circuits with Multiple Clocks", 1995 IEEE International Symposium on Circuits and Systems, vol. 2, Apr. 28, 1995, pp. 933–936).*

"Optimization by Simulated Annealing" by Kirkpatrick et al., *Science*, vol. 220, No. 4598 (May 13, 1983), pp. 671–680.

"Clock Scheduling with Consideration of Modification Cost in Semi–Synchronous Circuit" by Yoda et al., *Technical Report of IEICE*, CAS99–36, VLD99–36, DSP99–52 (Jun. 1999), pp. 45–52, English Abstract.

"Transient Response of Damped Linear Networks with Particular Regard to Wideband Amplifiers" by Elmore, *Journal of Applied Physics*, vol. 19 (Jan. 1948), pp. 55–63.

* cited by examiner

NUMERALS ENCLOSED WITHIN
PARENTHESES DENOTE CLOCK DELAY
VALUES (IN UNIT OF ps)

NUMERALS ENCLOSED WITHIN
PARENTHESES DENOTE CLOCK DELAY
VALUES (IN UNIT OF ps)

LAYOUT REGION

CLOCK INPUT TERMINAL

NUMERALS ENCLOSED WITHIN
PARENTHESES DENOTE CLOCK DELAY
VALUES (IN UNIT OF ps)

LAYOUT REGION

CLOCK INPUT TERMINAL

NUMERALS ENCLOSED WITHIN
PARENTHESES DENOTE CLOCK DELAY
VALUES (IN UNIT OF ps)

NUMERALS ENCLOSED WITHIN
PARENTHESES DENOTE CLOCK DELAY
VALUES (IN UNIT OF ps)

NUMERALS ENCLOSED WITHIN
PARENTHESES DENOTE CLOCK DELAY
VALUES (IN UNIT OF ps)

NUMERALS ENCLOSED WITHIN PARENTHESES
DENOTE CLOCK DELAY VALUES

NUMERALS ENCLOSED WITHIN PARENTHESES
DENOTE CLOCK DELAY VALUES

NUMERALS ENCLOSED WITHIN PARENTHESES
DENOTE CLOCK DELAY VALUES

NUMERALS ENCLOSED WITHIN PARENTHESES
DENOTE CLOCK DELAY VALUES

Figure 19

| CLOCK DELAY VALUE OF CLUSTER C2 | CIRCUIT OPERATION TIME T (BETWEEN $F_1$ AND $F_2$) | CIRCUIT OPERATION TIME T (BETWEEN $F_2$ AND $F_3$) |
|---|---|---|
| 350ps | 5580ps | 5450ps |
| 380ps | 5550ps | 5480ps |
| 400ps | 5530ps | 5500ps |

NUMERALS ENCLOSED WITHIN
PARENTHESES DENOTE CLOCK DELAY
VALUES (IN UNIT OF ps)

NUMERALS ENCLOSED WITHIN PARENTHESES DENOTE CLOCK DELAY VALUES (IN UNIT OF ps)

CLOCK CIRCUIT AND METHOD OF DESIGNING THE SAME

BACKGROUND OF THE INVENTION

The present invention relates to a clock circuit utilizing a clock delay and a method of designing the same.

For easy adjustment of the input/output timing, an increasing number of semiconductor integrated circuits (LSIs: hereinafter referred to as circuits) have adopted a synchronous design method in which signal transfer in a circuit is performed in synchronization with a clock signal.

Since the synchronous design method normally assumes simultaneous supply of a clock signal to each of synchronous devices, designing a circuit such that a maximum delay in signal processing (signal critical path delay) falls within a clock period ensures the operation of the entire circuit.

The arrival times of the clock signal at the individual synchronous devices, i.e., the difference between clock delay values are termed skew (clock skew). In the synchronous design method, it is required to design a clock circuit (portion of the circuit used to transmit and receive the clock signal) with zero skew.

As a representative of the synchronous design method, there has been proposed a method of designing a clock circuit wherein the number of devices and a wiring length are equal in each of clock signal supply paths extending from a clock source to the individual synchronous devices, such as one disclosed in U.S. Pat. No. 5,849,610 (Qing Zhu, "Method for Constructing a Planar Equal Path Length Clock Tree", 1998).

It is to be noted that a signal delay is determined by a device delay DD and a wiring delay WD in a signal propagation path. With process variations during LSI fabrication or ambient variations such as voltage or temperature variations during LSI operation, the device delay DD undergoes a variation of ΔDD per unit device and the wiring delay WD undergoes a variation of ΔWD per unit wiring length.

Since the number of devices and the wiring length are equal in each of the clock signal supply paths in the aforementioned method of designing an equal path length clock circuit, the signal delay in each of the clock signal supply paths varies in the same manner so that the clock signal is supplied, while the skew is held minimum against the process variations, the temperature variations, or the like.

FIG. 25 shows variations in device delay, wiring delay, and signal delay resulting from temperature variations.

In FIG. 25, the graph plotted as the fine solid line represents variations in device delay (transistor delay) Dtr, the graph plotted as the fine broken line represents variations in wiring delay Dwr, the graph plotted as the thick solid line represents variations in first signal delay Dp1 in a first signal supply path in which the wiring delay is longer than the device delay, and the graph plotted as the thick broken line represents variations in second signal delay Dp2 in a second signal supply path in which the device delay is longer than the wiring delay. In FIG. 25, the horizontal axis represents temperature and the vertical axis represents delay time. Room temperature is designated at room (the dot-dash line in the drawing). A temperature lower than the room temperature and a temperature higher than the room temperature are designated at Tcool and Thot, respectively.

As shown in FIG. 25, if the proportion of device delay to wiring delay is different from one signal supply path to another, the variations in signal delay resulting from the variations in temperature are also different. By providing an equal proportion of device delay to wiring delay in each of the clock signal supply paths, i.e., by providing an equal number of devices and an equal wiring length in each of the clock signal supply paths, it is possible to provide an equal clock delay in each of the synchronous devices against the temperature variations.

However, with an increase in the number of devices integrated in an LSI and a relative increase in wiring resistance resulting from miniaturization, it has become extremely difficult to generate a clock circuit in which an equal number of devices and an equal wiring length is provided in each of clock signal supply paths. In other words, it has become difficult to design a clock circuit with zero clock skew. If clock skew is produced in the synchronous design method, the individual synchronous devices receive the signal at different times. As a result, part of signal transfer is not completed within a reception time so that the phenomenon of so-called mislatch (reception of a signal different from a target signal) occurs. Consequently, the circuit cannot perform correct signal transfer any more.

If a wire width larger than 0.5 μm is used in semiconductor fabrication, the conventional synchronous design method, i.e., the zero skew clock design method can ignore the influence of a wiring resistance R on the clock delay, which allows the clock delay to be regarded as a time required by the driving device to supply charge equal to the wiring capacitance (including an input terminal capacitance at a signal reception point).

If a wire width smaller than 0.5 μm is used in semiconductor fabrication, on the other hand, the influence of the wiring resistance R on the clock delay cannot be ignored any more. According to the approximation by Elmore (W. C. Elmore, "The Transient Response of Damped Linear Networks with Particular Regard to Wideband Amplifiers", Journal of Applied Physics, Vol.19, 1948, pp.55–63), the wiring delay from a point P1 to a point P2 is proportional to the wiring resistance R1 from the point P1 to the point P2 and a total wiring capacitance (total wiring charge capacitance) C of the point P2 and its successors. Even if the circuit is designed such that each of the clock signal supply paths has an equal total wiring capacitance C0, clock delays (combination of R and C) in the individual synchronous devices are different depending on the configuration of branch lines, a wire width, or the like so that an increase in skew is unavoidable in the conventional zero skew clock design method.

As an example of a method of solving the foregoing problem caused by the introduction of miniaturization technology, while retaining the advantages of the conventional synchronous design method, Japanese Unexamined Patent Publication No. HEI 9-63291 (Yoda, Iida, Sasano, et al., "clock Distributing Method", 1997) discloses a method wherein logic design and clock circuit design are performed sequentially based on a zero skew clock circuit and then a skew value is calculated. Thereafter, a clock supply source is adjusted in accordance with a shortest delay in the synchronous devices to ensure the operation of the entire circuit. On the other hand, U.S. Pat. No. 5,896,299 (Arnold Ginetti et al., "Method and System for Fixing Hold Time Violations in Hierarchical Designs", 1999) proposes a method wherein logic design and clock circuit design are performed sequentially based on a zero skew clock circuit and then delay analysis is performed based on the result of the layout as the result of the design processes. Thereafter, a logic circuit is designed again by assuming that the clock skew from the clock source to each of the synchronous devices is Ts to ensure the operation of the entire circuit.

However, since each of the methods proposed by Japanese Unexamined Patent Publication No. HEI 9-63291 and U.S. Pat. No. 5,896,299 is based on the conventional zero skew clock circuit and aims at ensuring circuit operation by compensating the clock circuit or logic circuit, the foregoing problem caused by the introduction of miniaturization technology cannot be solved completely.

Besides the methods proposed by Japanese Unexamined Patent Publication No. HEI 9-63291 and U.S. Pat. No. 5,896,299, a semi-synchronous design method (Yoda, Sasaki, Takahashi, et al., "Clock Scheduling with Consideration of Modification Cost in Semi-Synchronous Circuit", Technical Report of Institute of Electronics, Information and Communication Engineers, CAS99-36, pp.45–52, 1999) has been proposed as a method of improving circuit performance, which is not based on a zero skew clock circuit. In accordance with the semi-synchronous design method, a clock circuit is designed by predetermining a clock delay value in each of the synchronous devices (skew scheduling) such that the number of devices and a wiring length in the clock circuit are minimized and circuit operation is ensured instead of targeting a zero skew clock circuit. The clock delay value in each of the synchronous devices is determined to satisfy the two inequalities given by the following expressions (1) and (2):

$$s(u)-s(v)+dmax(u, v) \leq T \quad (1)$$

$$0 < dmin(u, v)+s(u)-s(v) \quad (2).$$

In the expressions (1) and (2), s(u) and s(v) are respective clock delay values from a clock source to synchronous devices u and v, dmax(u, v) and dmin(u, v) are maximum and minimum values of the signal delay between the synchronous devices u and v (hereinafter referred to as a signal maximum delay value and a signal minimum delay value), and T is a circuit operation time (clock period). It is assumed that the signal propagates from the synchronous device u to the synchronous device v.

The expression (1) indicates that signal transfer between the synchronous devices u and v is performed correctly, i.e., the circuit operates normally if the clock period T is larger than the sum of the skew value between the 25 synchronous devices u and v and the signal maximum delay value dmax.

The expression (2) indicates that the circuit operates correctly if the skew value between the synchronous devices u and v is not so small as to cancel out the signal minimum delay value dmin.

The semi-synchronous design method provides a clock period T shorter than in a zero skew clock circuit, i.e., a circuit operation speed higher than in a zero skew clock circuit by realizing a clock circuit using clock delay values satisfying the expressions (1) and (2), i.e., by realizing a clock circuit which implements the result of skew scheduling.

In accordance with the semi-synchronous design method, a clock circuit which implements the result of skew scheduling can be realized easily by adjusting a wiring length or the like.

FIG. 26(a) shows an example of clock delay values in eight synchronous devices F1 to F8 obtained by skew scheduling. FIG. 26(b) shows an example of a clock circuit using the clock delay values shown in FIG. 26(a) for a two-dimensional layout arrangement of the synchronous devices F1 to F8. In FIG. 26(a), the vertical axis represents, by using the clock delay value in the synchronous device F1 as a standard (0), the clock delay values in the synchronous devices F1 to F8 as skew values from the standard.

As shown in FIG. 26(a), the synchronous devices F1 to F8 have the clock delay values within the range of 0 to 2000 pico-second (ps). As shown in FIG. 26(b), the clock circuit has redundant wiring inserted therein to implement the clock circuit using the clock delay values shown in FIG. 26(a).

In the semi-synchronous design method, a clock circuit which implements the result of skew scheduling can also be realized by adjusting the number of devices, i.e., a device delay instead of adjusting a wiring length, i.e., a wiring delay.

FIG. 27 shows an example of a clock circuit having buffers (driving devices) inserted therein such that the result of skew scheduling is implemented.

As shown in FIG. 27, the clock signal supply path between the clock input terminal and the synchronous device F1 is intervened by a first middle buffer MB1, a second middle buffer MB2, a third middle buffer MB3, and a first terminal buffer LB1. The clock signal supply path between the clock input terminal and the synchronous device F2 is intervened by the first middle buffer MB1, a fourth middle buffer MB4, and a second terminal buffer LB2. The clock signal supply path between the clock input terminal and the synchronous device F3 is intervened by the first middle buffer MB1 and a third terminal buffer LB3.

However, the semi-synchronous design method has encountered the problem that, as the miniaturization of an LSI advances, the determination of clock delay values satisfying the expressions (1) and (2), i.e., skew scheduling requires a longer time and the realization of a clock circuit which implements the result of skew scheduling becomes more difficult. Consequently, it becomes difficult to generate a clock circuit, while improving circuit performance including the operation speed of the circuit.

In the semi-synchronous design method, if the wiring length is adjusted to realize a clock circuit which implements the result of skew scheduling, a significant amount of redundant wiring is inserted in a clock circuit, as shown in FIG. 26(b), to disadvantageously increase power consumption or layout area. Similar problems also occur when a clock circuit which implements the result of skew scheduling is realized by adjusting the number of devices. If the total wiring length of the clock circuit increases, an increasing number of wires are brought closer and adjacent to each other, which leads to the problem that the influence of crosstalk (wire-to-wire interference resulting from a change in signal voltage) is likely to increase.

Since the semi-synchronous design method adjusts the wiring length or the number of devices without considering variations in clock delay values resulting from process variations, temperature variations, or the like, the proportion of device delay to wiring delay is different in the different clock signal supply paths from the clock source to the individual synchronous devices. This causes the problem that delay variations (variations in the respective clock delay values of the synchronous devices), i.e., skew errors resulting from process variations, temperature variations, or the like are increased.

SUMMARY OF THE INVENTION

In view of the foregoing, it is therefore an object of the present invention to effect efficient skew scheduling and ensures the realization of a clock circuit which implements the result of skew scheduling. It is another object of the present invention to provide a clock circuit capable of improving circuit performance, inhibiting power consumption or layout area from being increased, and suppressing skew errors resulting from process variations, temperature variations, or the like.

To attain the objects, a first method of designing a clock circuit according to the present invention is based on a method of designing a clock circuit for supplying a clock signal to each of a plurality of synchronous devices in an integrated circuit and comprises: a discrete clock determining step of determining a group of discrete clock delay values composed of a finite number of discrete values to be allocated as respective clock delay values to the plurality of synchronous devices based on an arrangement of the synchronous devices or on timing constraints; a clock allocating step of allocating, as a selected clock delay value, the clock delay value selected from the group of discrete clock delay values to each of the plurality of synchronous devices, while ensuring an operation of the integrated circuit; and a clock circuit designing step of designing the clock circuit for supplying the clock signal to each of the plurality of synchronous devices in accordance with the selected clock delay value.

In accordance with the first method of designing a clock circuit, the group of discrete clock delay values composed of a finite number of discrete values is determined and then a selected clock delay value selected from the group of discrete clock delay values is allocated to each of the synchronous devices. Thereafter, a clock circuit for supplying a clock signal to each of the synchronous devices in accordance with the selected clock delay value is designed. Since the clock delay value to be allocated to each of the synchronous devices is selected from the group of discrete clock delay values, the range in which the selected clock delay values are searched for is limited so that efficient skew scheduling is performed. Since the selected clock delay values allocated to the respective synchronous devices are limited, a clock circuit which implements the result of skew scheduling can be generated positively by adjusting, e.g., the number of devices, the wiring length, or the like.

In the first method of designing a clock circuit, the group of discrete clock delay values is preferably composed of integral multiples of a basic clock delay unit time determined based on the arrangement of the plurality of synchronous devices or on the timing constraints.

This allows easy determination of the group of discrete clock delay values.

If the group of discrete clock delay values is composed of integral multiples of the basic clock delay unit time, the basic clock delay unit time is a signal delay value produced when a driving device used in the clock circuit drives a specified capacitance and the specified capacitance is preferably determined based on a total charge capacitance which is a total sum of a wiring capacitance when the plurality of synchronous devices are connected to each other with a shortest wiring length based on the arrangement of the synchronous devices and respective input terminal capacitances of the synchronous devices or on the timing constraints.

This allows easy determination of the basic clock delay unit time.

In the first method of designing a clock circuit, the discrete clock determining step preferably includes the step of: calculating maximum and minimum values of implementable clock delay values as a maximum clock delay value and a minimum clock delay value based on the number of driving devices used in the clock circuit or on an area of the integrated circuit and determining the group of discrete clock delay values within a range from the minimum clock delay value to the maximum clock delay value.

This further limits the range in which the clock delay value to be allocated to each of the synchronous devices is searched for and allows more efficient skew scheduling. Since the selected clock delay values allocated to the synchronous devices are further limited, the clock circuit which implements the result of skew scheduling can be generated more positively by adjusting, e.g., the number of devices, the wiring length, or the like.

Preferably, the first method of designing a clock circuit further comprises, prior to the discrete clock determining step, the step of: calculating a shortest operation period for the integrated circuit, wherein the discrete clock determining step preferably includes the step of: calculating maximum and minimum values of the clock delay values which can implement the shortest operation period as a maximum clock delay value and a minimum clock delay value and determining the group of discrete clock delay values within a range from the minimum clock delay value to the maximum clock delay value.

This further limits the range in which the clock delay value to be allocated to each of the synchronous devices is searched for and allows more efficient skew scheduling. Since the selected clock delay value of each of the synchronous devices is further limited, the clock circuit which implements the result of skew scheduling can be generated more positively by adjusting, e.g., the number of devices or the wiring length. Since the selected clock delay value of each of the synchronous devices is limited to the range in which the shortest operation period of the integrated circuit, i.e., the system limit operation period is implementable, it becomes possible to bring the clock period to a value in the vicinity of the system limit operation period and thereby improve the performance of the circuit (LSI).

Preferably, the first method of designing a clock circuit further comprises, prior to the clock allocating step, the step of: determining a clock delay objective value which is an objective value of the clock delay value to be allocated to each of the plurality of synchronous devices, wherein the clock allocating step preferably includes the step of: minimizing an evaluation function value determined based on a difference between the clock delay value selected from the group of discrete clock delay values and allocated to each of the synchronous devices and the clock delay objective value and on an operation time of the integrated circuit.

This brings the clock delay value of each of the synchronous devices closer to the clock delay objective value, reduces the operation time of the integrated circuit, and thereby improves the performance of the integrated circuit.

If the first method comprises the step of determining the clock delay objective value, the clock delay objective value is preferably a constant common to each of the plurality of synchronous devices.

By thus using the clock delay value (constant common to each of the synchronous devices) of each of the synchronous devices that has been obtained in accordance with, e.g., a zero skew clock design method as the clock delay objective value of each of the synchronous devices, it is possible to improve the performance of the integrated circuit by only performing a reduced number of correction steps with respect to the zero skew clock circuit.

Preferably, the first method of designing a clock circuit further comprises, prior to the clock allocating step, the step of: determining, for each of the plurality of synchronous devices, the synchronous device adjacent thereto based on the arrangement of the synchronous devices, wherein the clock allocating step preferably includes the step of: minimizing an evaluation function value determined based on a difference between the clock delay value selected from the group of discrete clock delay values and allocated to each of the plurality of synchronous devices and the clock delay value selected from the group of discrete clock delay values and allocated to the adjacent synchronous device thereof and on an operation time of the integrated circuit.

This adjusts the respective clock delay values of the adjacent synchronous devices to equal or nearly equal values, reduces the operation time of the integrated circuit, and thereby improves the performance of the integrated circuit. If the clock delay values of the adjacent synchronous devices are adjusted to equal or nearly equal values, the synchronous devices can be connected to each other with a short wire so that the wiring length of the clock circuit is reduced and power consumption and layout area are also reduced.

Preferably, the first method of designing a clock circuit further comprises, prior to the clock allocating step, the step of: determining, for each of the plurality of synchronous devices, the synchronous device adjacent thereto based on the arrangement of the synchronous devices, wherein the clock allocating step preferably includes the step of: minimizing an evaluation function value determined based on a ratio of a difference between the clock delay value selected from the group of discrete clock delay values and allocated to each of the plurality of synchronous devices and the clock delay value selected from the group of discrete clock delay values and allocated to the adjacent synchronous device thereof to a distance between each of the synchronous devices and the adjacent synchronous device thereof and on an operation time of the integrated circuit.

This adjusts the respective clock delay values of those of the adjacent synchronous devices disposed at a relatively small distance to equal or nearly equal values, reduces the operation time of the integrated circuit, and thereby improves the performance of the integrated circuit. If the clock delay values of those of the adjacent synchronous devices disposed at a relatively small distance are adjusted to equal or nearly equal values, the synchronous devices can be connected to each other with a shorter wire so that the wiring length of the clock circuit is further reduced and power consumption and layout area are also further reduced.

Preferably, the first method of designing a clock circuit further comprises, prior to the clock allocating step, the step of: determining, for each of the plurality of synchronous devices, the synchronous device adjacent thereto based on the arrangement of the synchronous devices and determining a power source line connected to each of the synchronous devices based on power source line data, wherein the clock allocating step preferably includes the step of: minimizing an evaluation function value determined based on an operation time of the integrated circuit and on a function value which assumes a specified value other than zero at the time when the power source line connected to each of the plurality of synchronous devices is coincident with the power source line connected to the adjacent synchronous device thereof and the clock delay value selected from the group of discrete clock delay values and allocated to each of the synchronous devices is the same as the clock delay value selected from the group of discrete clock delay values and allocated to the adjacent synchronous device thereof and assumes zero at all other times.

This reduces the operation time of the integrated circuit and thereby improves the performance of the integrated circuit, while preventing a situation where clock delay values equal or nearly equal to each other are allocated to the synchronous devices connected to the same power source line and adjacent to each other. If such a situation is prevented, the synchronous devices connected to the same power source line and adjacent to each other are prevented from operating simultaneously, so that a local increase in the amount of consumed current is suppressed.

If the first method comprises the step of determining the adjacent synchronous device and the power source line to be connected, the adjacent synchronous device is preferably determined among those of the plurality -of synchronous devices which are positioned at a specified distance or farther away from a basic power source line based on the power source line data.

This eases constraints during skew scheduling and thereby allows easy skew scheduling.

In the first method of designing a clock circuit, the clock circuit designing step preferably includes: a cluster forming step of forming at least one or more clusters each composed of those of the plurality of synchronous devices to which the same selected clock delay value has been allocated in the clock allocating step such that a signal delay value when the synchronous devices contained in each of the clusters are connected to each other with a minimum wiring length based on the arrangement of the synchronous devices and when the cluster is driven by one driving device is not more than a discrete clock delay value difference which is a difference between one of the selected clock delay values corresponding to the cluster and the other of the selected clock delay values smaller than and closest to the one of the selected clock delay values; and a driving device placing step of placing one driving device in each of the clusters and determining a wiring connection between an output terminal of the driving device and an input terminal of each of the synchronous devices contained in the cluster in which the driving device has been placed such that a signal delay value when the cluster is driven by the driving device is equal to the discrete clock delay value difference.

By thus connecting the individual driving devices, a clock circuit which implements the result of skew scheduling can be generated positively.

If the clock circuit designing step includes the cluster forming step and the driving device placing step, the cluster forming step preferably includes the step of: determining the number of clusters to be formed by using a total sum of a wiring capacitance when the synchronous devices to which the same selected clock delay value has been allocated are connected to each other with a minimum wiring length based on the arrangement of the plurality of synchronous devices and respective input terminal capacitances of the synchronous devices to which the same selected clock delay value has been allocated.

This ensures the adjustment of a signal delay value when the synchronous devices contained in each of the clusters are connected with a minimum wiring length and when each of the clusters is driven by one driving device to a value not more than the discrete clock delay value difference.

If the clock circuit designing step includes the cluster forming step and the driving device placing step, the driving device placing step preferably includes the step of: placing the same type of driving devices in the individual clusters.

This allows the step of determining the number of clusters to be performed easily and thereby allows the clusters to be generated easily.

If the clock circuit designing step includes the cluster forming step and the driving device placing step, the clock circuit designing step preferably further includes, after the driving device placing step, the step of: adjusting a location of the driving device such that the driving device is closer to, of the synchronous devices to which the other of the selected clock delay values has been allocated, that one closest to the driving device.

This achieves a reduction in redundant wiring in each of the clusters.

If the clock circuit designing step includes the cluster forming step and the driving device placing step, the clock circuit designing step preferably further includes, between the cluster forming step and the driving device placing step: a cluster changing step of reallocating, if an operation of the integrated circuit is ensured, the selected clock delay value corresponding to the one of the clusters formed in the cluster forming step to the synchronous device to which the selected clock delay value smaller than the selected clock delay value corresponding to the one of the clusters has been allocated and inserting, in the one of the clusters, the synchronous device to which the selected clock delay value has been reallocated.

By thus additionally inserting the synchronous device, the cluster delay value in one of the clusters (a signal delay value when one of the clusters is driven by one driving device) can be brought closer to the discrete clock delay value difference so that redundant wiring in one of the clusters is reduced and power consumption and layout area are also reduced thereby. Since the number of synchronous devices contained in each of the clusters is increased, the total number of clusters, i.e., the total number of driving devices placed in the respective clusters is reduced so that power consumption and layout area are further reduced.

If the clock circuit designing step includes the cluster changing step, the cluster changing step preferably includes the step of: reallocating the selected clock delay value corresponding to the one of the clusters to, of the plurality of synchronous devices, that one which is located adjacent the synchronous device contained in the one of the clusters and to which the smaller selected clock delay value has been allocated.

This reduces the wiring length of the clock circuit and thereby suppresses increased power consumption and increased layout area.

If the clock circuit designing step includes the cluster changing step, the clock circuit designing step preferably includes, between the cluster changing step and the driving device placing step, the step of: allocating the clock delay value selected from the group of discrete clock delay values to the unclustered one of the synchronous devices to which the smaller selected clock delay value has been allocated, while ensuring the operation of the integrated circuit.

This allows the selected clock delay value allocated to the unclustered synchronous device to be improved by using a specified evaluation function value and allows easier clustering of the synchronous devices.

If the clock circuit designing step includes the cluster forming step and the driving device placing step, the first method further comprises, after the clock circuit designing step: a cluster changing step of reallocating, if an operation of the integrated circuit is ensured, the selected clock delay value corresponding to one of the clusters formed in the cluster forming step to the synchronous device contained in another of the clusters formed in the cluster forming step and inserting, in the one of the clusters, the synchronous device to which the selected clock delay value has been reallocated.

By thus moving the locations of the synchronous devices between the clusters, the cluster delay value of each of the clusters can be brought closer to the discrete clock delay value difference so that redundant wiring in each of the clusters is reduced and power consumption and layout area are also reduced. In the case where all the synchronous devices contained in the other of the clusters can be inserted in the one of the clusters, the total number of clusters, i.e., the total number of driving devices placed in the respective clusters is reduced so that power consumption and layout area are further reduced.

If the clock circuit designing step includes the cluster forming step and the driving device placing step, the first method preferably further comprises, after the clock circuit designing step: a clock reallocating step of reallocating, to each of the clusters, a continuous clock delay value which is one of continuous values from a cluster minimum clock delay value to a cluster maximum clock delay value by using, as the cluster minimum clock delay value, the clock delay value when the wiring connection within each of the clusters is achieved with the cluster minimum wiring length and using, as the cluster maximum clock delay value, the selected clock delay value corresponding to each of the clusters so as to implement an actualized circuit operation time which is an operation time of the integrated circuit implemented when the clock signal is supplied to each of the plurality of synchronous devices in accordance with the selected clock delay value and redetermining the wiring connection within each of the clusters such that the clock signal is supplied to the synchronous device contained in each of the clusters in accordance with the continues clock delay value reallocated to each of the clusters.

In the arrangement, the wiring connection within each of the clusters is achieved with a minimum wiring length except for the case where the actualized circuit operation time is not implemented. By thus reducing unnecessary redundant wiring, increased power consumption and increased layout area resulting from clock wiring can be prevented.

If the first method comprises the clock reallocating step, the clock reallocating step is preferably performed once with respect to each of the clusters in decreasing order of the selected clock delay values corresponding to the respective clusters.

This allows easy reallocation of the continuous clock delay value to each of the clusters.

If the first method comprises the clock reallocating step, the clock reallocating step preferably includes the step of: setting the selected clock delay value corresponding to each of the clusters as an initial value of the cluster maximum clock delay value and renewing the cluster maximum delay value with the continuous clock delay value reallocated to each of the clusters, the step being performed at least once with respect to each of the clusters till the cluster maximum clock delay value is no more renewed with a new value.

This further reduces the continuous clock delay value reallocated to each of the clusters and further reduces unnecessary redundant wiring.

If the clock circuit designing step includes the cluster forming step and the driving device placing step, the first method preferably further comprises, after the clock circuit designing step: a clock reallocating step of reallocating, to each of the clusters, a continuous clock delay value which is one of continuous values from a cluster minimum clock delay value to a cluster maximum clock delay value by using, as the cluster minimum clock delay value, the clock delay value when the wiring connection within each of the clusters is achieved with the minimum wiring length and using, as the cluster maximum clock delay value, the selected clock delay value corresponding to each of the clusters so as to minimize an operation time of the integrated circuit and redetermining the wiring connection within each of the clusters such that the clock signal is supplied to the synchronous device contained in each of the clusters in accordance with the continuous clock delay value reallocated to each of the clusters.

This adjusts the operation time of the integrated circuit shorter than the actualized circuit operation time and closer to the system limit operation period, so that the performance of the circuit (LSI) is improved.

A second method of designing a clock circuit according to the present invention is based on a method of designing a clock circuit for supplying a clock signal to each of a plurality of synchronous devices in an integrated circuit and comprises: a first step of determining, for a non-inverting operation synchronous device which operates on a rising edge of the clock signal, a first operation response time between inputting of the clock signal and the operation of the non-inverting operation synchronous device and determining, for an inverting operation synchronous device which operates on a falling edge of the clock signal, a second operation response time between the inputting of the clock signal and the operation of the inverting operation synchronous device; and a second step of allocating, as a clock delay value, either of the first and second operation response times to each of the plurality of synchronous devices, while ensuring an operation of the integrated circuit, and replacing that one of the plurality of synchronous devices to which the first operation response time has been allocated as the clock delay value with the non-inverting operation synchronous device, while replacing that one of the plurality of synchronous devices to which the second operation response time has been allocated as the clock delay value with the inverting operation synchronous device.

In accordance with the second method of designing a clock circuit, the first operation response time is determined for the non-inverting operation synchronous device and the second operation response time is determined for the inverting operation synchronous device. Then, either of the first and second operation response times is allocated as the clock delay value to each of the synchronous devices. Thereafter, the synchronous device to which the first operation response time has been allocated is replaced with the non-inverting operation synchronous device and the synchronous device to which the second operation response time has been allocated is replaced with the inverting operation synchronous device. Since the clock delay value to be allocated to each of the synchronous devices is selected from the first and second operation response times, the range in which the clock delay value is searched for is limited so that efficient skew scheduling is performed. Since the clock circuit is generated by replacing the synchronous device to which the first or second operation response time has been allocated with the non-inverting or inverting operation synchronous device, a clock circuit which implements the result of skew scheduling can be generated positively without adjusting a delay in the driving device, a wiring capacitance, or the like, i.e., without changing the wiring connection in the clock circuit or the like. The performance of the circuit can be improved easily by changing the setting of the first or second operation response time.

A clock circuit according to the present invention is based on a clock circuit for supplying a clock signal to each of a plurality of synchronous devices in an integrated circuit, wherein the clock signal is supplied to each of the plurality of synchronous devices in accordance with a selected clock delay value which is a clock delay value allocated to each of the synchronous devices, while an operation of the integrated circuit is ensured, the selected clock delay value being selected from a group of discrete clock delay values composed of a finite number of discrete values to be allocated as the respective clock delay values to the plurality of synchronous devices.

In the clock circuit according to the present invention, the clock signal is supplied to each of the synchronous devices in accordance with the selected clock delay value selected from the group of discrete clock delay values and allocated to each of the synchronous devices. This limits the range in which the clock delay value to be allocated to the synchronous device is searched for so that efficient skew scheduling is performed. Since the clock delay value to be allocated to each of the synchronous devices is limited, a clock circuit which implements the result of skew scheduling can be generated positively by adjusting, e.g., the number of devices or the wiring length.

In the clock circuit according to the present invention, at least one or more clusters are preferably formed from the plurality of the synchronous devices, each of the clusters being composed of the synchronous devices to which the same selected clock delay value has been allocated, one driving device is preferably placed in each of the clusters, and a wiring connection between an output terminal of the driving device and an input terminal of each of the synchronous devices contained in the cluster in which the driving device has been placed is preferably determined such that a signal delay value when the cluster is driven by the driving device is equal to a discrete clock delay value difference which is a difference between one of the selected clock delay values corresponding to the cluster and the other of the selected clock delay values smaller than and closest to the one of the selected clock delay values.

By thus connecting the individual driving devices, a clock circuit which implements the result of skew scheduling can be generated positively.

In this case, the same type of driving devices are preferably placed in the individual clusters.

This allows easy formation of the clusters.

In the clock circuit according to the present invention, the clock circuit is preferably composed of a plurality of driving devices of the same type and a total charge capacitance which is a total sum of respective wiring capacitances and respective input terminal capacitances of the synchronous devices driven by each of the plurality of driving devices is preferably adjusted to an equal specified value within a 20% error.

This reduces variations in signal delay produced in the individual stages of each of the clock signal supply paths for supplying a clock signal from the clock source to each of the synchronous devices so that skew errors resulting from process variations, temperature variations, or the like are suppressed.

In the clock circuit according to the present invention, the clock circuit preferably has a plurality of clock signal supply path for supplying the clock signal from a clock source to each of the plurality of synchronous devices and a ratio between an amount of wiring delay and an amount of transistor delay in each of the plurality of clock signal supply paths is preferably adjusted to an equal specified value within a 20% error based on an arrangement of the plurality of synchronous devices or on timing constraints.

Since the ratio between the amount of wiring delay and the among of transistor delay in each of the clock signal supply paths has thus been adjusted to a nearly equal specified value, the clock delays when the clock signal is supplied to each of the synchronous devices change in association in response to a temperature change so that circuit operation is compensated over a wide temperature range.

In this case, the equal specified value is preferably a ratio between an amount of wiring delay and an amount of transistor delay in a critical path of the integrated circuit.

Since the ratio between the amount of wiring delay and the amount of transistor delay in each of the clock signal supply paths has thus been adjusted to a value nearly equal to the ratio between the amount of transistor delay and the amount of wiring delay in the critical path, the clock delays when the clock signal is supplied to each of the synchronous devices change in association with the signal delay in the critical path in response to a temperature change so that circuit operation is compensated positively over a wide temperature range.

BRIEF DESCRIPTION OF THE DRAWINGS

FIG. 19 shows an example of a circuit operation time calculated by the method of designing a clock circuit according to the second variation of the sixth embodiment;

DETAILED DESCRIPTION OF THE INVENTION

Embodiment 1

Figure 1:
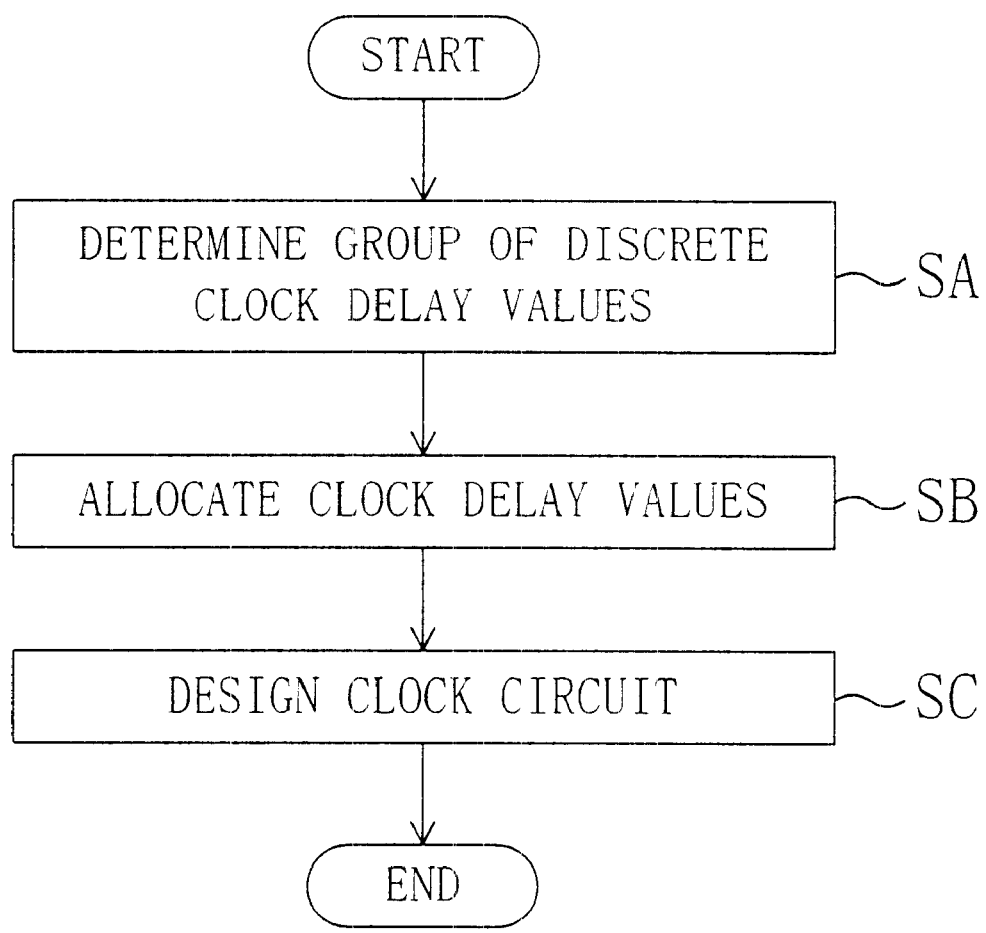
FIG. 1 is a flow chart illustrating the individual steps of a method of designing a clock circuit according to a first embodiment of the present invention.

Referring now to the drawings, a clock circuit and a method of designing the same according to a first embodiment of the present invention will be described.

In the first embodiment, a clock circuit for supplying a clock signal to each of M (M is a natural number) synchronous devices F1 to FM (a group of synchronous devices FG) in a semiconductor integrated circuit (hereinafter referred to as a circuit) is to be designed.

In the first embodiment, it is assumed that, before the initiation of the process shown in FIG. 1, the design of functional specifications including timing constraints has been completed and the arrangement of the synchronous devices F1 to FM has been determined or estimated.

FIG. 1 is a flow chart illustrating the individual steps of a method of designing a clock circuit according to the first embodiment.

First, in Step SA, a group GS of discrete clock delay values composed of N (N is a natural number) discrete values that can be allocated as clock delay values to the individual synchronous devices F1 to FM is determined based on the arrangement of the synchronous devices F1 to FM or on the timing constraints.

A description will be given herein below to the process performed in Step SA by using, as an example, the case where the clock circuit is formed by using a driving device B.

In the first embodiment, a basic clock delay unit time TU is determined based on the arrangement of the synchronous devices F1 to FM, the timing constraints, or the like and then the group GS of discrete clock delay values each composed of an integral multiple of the basic clock delay unit time TU is determined.

Specifically, the basic clock delay unit value TU is given by the following expression (3) by using a signal delay value Tbc when the driving device B drives a capacitance Cc as the basic clock delay unit time TU:

$$TU = Tbc = Tb + \Delta Tb \times Cc \quad (3).$$

In the expression (3), Tb is a specific delay of the driving device B and ΔTb is a driving delay per unit capacitance. For example, Cc is determined in consideration of a total charge capacitance which is the sum of a wiring capacitance when connections are provided between the synchronous devices F1 to FM with a minimum wiring length based on the arrangement of the individual synchronous devices F1 to FM and the respective input terminal capacitances of the synchronous devices F1 to FM.

If consideration is given to the timing constraints such as a constraint on the inclination (slew) of a signal waveform, e.g., the basic clock delay unit time TU is given by the following expression (4):

$$TU = Tb + \Delta Tb \times Ccmax \quad (4).$$

In the expression (4), Ccmax is, e.g., a limit driving capacitance placed on Cc as the second term on the right side of the expression (3) to adjust the inclination of the signal waveform to a determined time or less.

Next, in Step SB, the clock delay value selected from the group GS of discrete clock delay values is allocated as a selected clock delay value to each of the synchronous devices F1 to FM, while the operation of the circuit is ensured, specifically, such that the following expressions (5) and (6) are satisfied:

$$s(u) - s(v) + dmax(u, v) \leq T \quad (5)$$

$$0 < dmin(u, v) + s(u) - s(v) \quad (6).$$

In the expressions (5) and (6), s(u) and s(v) are clock delay times from a clock source to the synchronous devices u and v, respectively, dmax(j, v) and dmin(u, v) are maximum and minimum values of the signal delay between the synchronous devices u and v (hereinafter referred to as a signal maximum delay value and a signal minimum delay value), and T is a circuit operation time (clock period). It is assumed that a signal propagates from the synchronous device u to the synchronous device v.

Next, in Step SC, a clock circuit which implements the result of skew scheduling obtained in Step SB, i.e., a clock circuit for supplying a clock signal to each of the synchronous devices F1 to FM in accordance with the selected clock delay value selected from the group GS of discrete clock delay values and allocated to each of the synchronous devices F1 to FM is designed. The clock circuit which implements the result of skew scheduling obtained in Step SB can be generated easily by adjusting the number of driving devices, i.e., a device delay or a wiring length, i.e., a wiring delay (wiring capacitance).

Figure 2A:
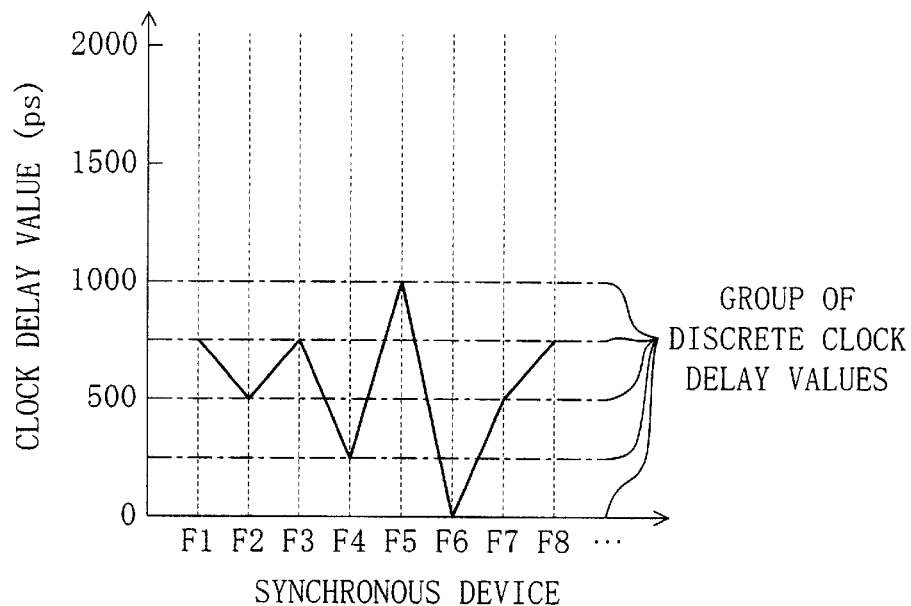
FIG. 2(a) shows an example of selected clock delay values allocated to eight synchronous devices by using the method of designing a clock circuit according to the first embodiment and FIG. 2(b) shows an example of a clock circuit for supplying a clock signal to each of the eight synchronous devices in accordance with the selected clock delay values shown in FIG. 2(a)
Figure 2B:
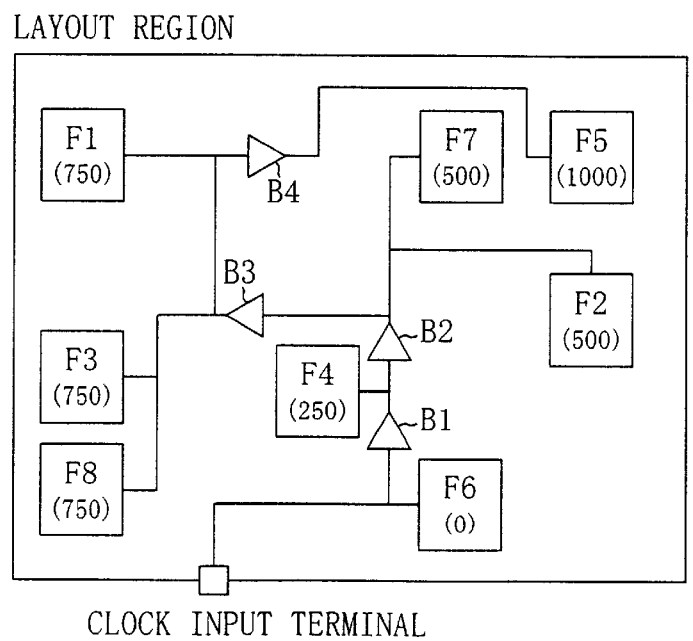

FIG. 2(a) shows an example of the selected clock delay values allocated to the eight synchronous devices F1 to F8 in Step SB. FIG. 2(b) shows an example of the clock circuit for supplying a clock signal to each of the synchronous devices F1 to F8 in accordance with the selected clock delay values shown in FIG. 2(a). In FIG. 2(a), the vertical axis represents the selected clock delay values allocated to the synchronous devices F1 to F8 by using, as a standard (0), the selected clock delay value allocated to the synchronous device F6.

As shown in FIG. 2(a), the selected clock delay values allocated to the synchronous devices F1 to F8 are 750 ps, 500 ps, 750 ps, 250 ps, 1000 ps, 0 ps, 500 ps, and 750 ps, respectively, each of which is an integral multiple of the basic clock delay unit time TU (250 ps).

As shown in FIG. 2(b), a driving device B1 is interposed between the synchronous devices F6 and F4. Since the sum of the wiring capacitance driven by the driving device B and the input terminal capacitance of the synchronous device F4 has been adjusted, the synchronous device F4 is driven at a speed lower than the speed at which the synchronous device F6 is driven by 250 ps. Likewise, the synchronous device F2 or synchronous device F7 is driven by the driving device B2 at a speed lower than the speed at which the synchronous device F4 is driven by 250 ps, the synchronous device F1, synchronous device F3, or synchronous device F8 is driven by the driving device B3 at a speed lower than the speed at which the synchronous device F2 or synchronous device F7 is driven by 250 ps, and the synchronous device F5 is driven by the driving device B4 at a speed lower than the speed at which the synchronous device F1, synchronous device F3, or synchronous device F8 is driven by 250 ps.

Thus, according to the first embodiment, the group GS of discrete clock delay values composed of a finite number of discrete values is determined and then a selected clock delay value selected from the group GS of discrete clock delay values is allocated to each of the synchronous devices F1 to FM. Thereafter, the clock circuit for supplying a clock signal to each of the synchronous devices F1 to FM in accordance with the selected clock delay value is designed. Since the clock delay value to be allocated to each of the synchronous devices F1 to FM is selected from the group GS of discrete clock delay values, the range in which the selected clock delay values are searched for is limited so that efficient skew scheduling is performed. Since the selected clock delay values allocated to the synchronous devices F1 to FM are limited, a clock circuit which implements the result of skew scheduling can surely be generated by adjusting, e.g., the number of devices, a wiring length, or the like.

According to the first embodiment, the basic clock delay unit time TU is determined based on the arrangement of the synchronous devices F1 to FM or on timing constraints and then the group GS of discrete clock delay values each composed of an integral multiple of the basic clock delay unit time TU is determined, which enables easy determination of the group GS of discrete clock delay values.

Although the first embodiment has used the group GS of discrete clock delay values each composed of an integral multiple of the basic clock delay unit time TU, i.e., has provided equal differences between the individual discrete clock delay values composing the group GS of discrete clock delay values, it is also possible to provide unequal differences between the individual discrete clock delay values composing the group GS of discrete clock delay values.

Embodiment 2

A clock circuit and a method of designing the same according to a second embodiment of the present invention will be described.

The second embodiment is based on the method of designing the clock circuit according to the first embodiment and is different from the first embodiment in that upper and lower limits are predetermined for the group GS of discrete clock delay values when the group GS of discrete clock delay values is determined in Step SA.

When the clock delay values are adjusted in an actual clock circuit by adjusting, e.g., the number of devices (hereinafter referred to as the number of gate stages), i.e., a device delay or a wiring length, i.e., a wiring delay, there are cases where maximum and minimum values are determined for a range in which the clock delay values are adjusted. The reason for this is that it is impossible to supply the clock signal to the synchronous device, such as a register, earlier than the inputting of the clock signal to the circuit and it is impossible to adjust the clock delay values by using the number of gate stages or a wiring length which exceed the accuracy with which the circuit is analyzed or the range in which process variations or the like are compensated.

In the second embodiment, therefore, the maximum and minimum values of implementable clock delay values are calculated as a maximum clock delay value Tsmax and a minimum clock delay value Tsmin based on, e.g., the number of gate stages, a wiring length, a circuit area, or the like and the group GS of discrete clock delay values is determined within the range from the minimum clock delay value Tsmin to the maximum clock delay value Tsmax.

If the basic clock delay unit time is designated at TU and the maximum and minimum values of the group GS of discrete clock delay values are designated at Mmax×TU and Mmin×TU (each of Mmax and Mmin is an integer), the following expressions (7) and (8) are satisfied:

$$Mmax \times TU < Tsmax \quad (7)$$

$$Mmin \times TU > Tsmin \quad (8).$$

The second embodiment achieves the following effects in addition to the effects achieved by the first embodiment. Since the second embodiment calculates the maximum and minimum values of implementable clock delay values as the maximum and minimum clock delay values Tsmax and Tsmin and determines the group GS of discrete clock delay values within the range from the minimum clock delay value Tsmin to the maximum clock delay value Tsmax, the range in which the clock delay value to be allocated to each of the synchronous devices F1 to FM is searched for is further limited so that skew scheduling is performed more efficiently. Since the selected clock delay values allocated to the synchronous devices F1 to FM are further limited, a clock circuit which implements the result of skew scheduling can be generated more positively by adjusting, e.g., the number of devices, a wiring length, or the like.

Variation of Embodiment 2

A clock circuit and a method of designing the same according to a variation of the second embodiment of the present invention will be described.

The variation of the second embodiment is different from the second embodiment in its method of calculating the maximum clock delay value Tsmax and the minimum clock delay value Tsmin.

Specifically, the second embodiment has calculated the maximum and minimum clock delay value Tsmax and Tsmin based on the number of gate stages, a wiring length, a circuit area, or the like and then determined the group GS of discrete clock delay values within the range from the minimum clock delay value Tsmin to the maximum clock delay value Tsmax in Step SA. By contrast, the variation of the second embodiment calculates a shortest operation period for the circuit, i.e., a system limit operation period $T_{lim}$ prior to Step SA in which the maximum and minimum values of the clock delay values which can implement the system limit operation period $T_{lim}$ are calculated as the maximum and minimum clock delay values Tsmax and Tsmin and then the group Gs of discrete clock delay values is determined within the range from the minimum clock delay value Tsmin to the maximum clock delay value Tsmax.

By way of example, a description will be given to the case of using the method by Yoda et al. ("Clock Scheduling with Consideration of Modification Cost in Semi-Synchronous Circuit", Technical Report of Institute of Electronics, Information and Communication Engineers, CAS99-36, pp.45–52, 1999) to calculate the system limit operation period $T_{lim}$.

First, a digraph is produced in which the synchronous devices of the circuit such as storage devices (registers) are represented by nodes, a maximum delay path of all the signal supply paths is represented by a backward branch having a negative delay value, and a minimum delay path of all the signal supply paths is represented by a forward branch having a positive delay value. Then, of closed paths composed of the branches of the digraph, a closed path in which the total sum SP of the values of the branches is negative. Thereafter, a value B is calculated by dividing the total sum SP of the values of the branches of the closed path by the number Z of branches having negative delay values and the system limit operation period $T_{lim}$ is calculated as $T_{lim}$=−B.

Next, a clock delay value which can implement the system limit operation period $T_{lim}$ is allocated to each of the registers. Then, a skew value is determined for each of the registers by using, as a standard, an arbitrary one of the clock delay values allocated to the respective registers. Thereafter, the maximum clock delay value Tsmax and the minimum clock delay value Tsmin are calculated based on the range of the skew values and the group GS of discrete clock delay values is determined within the range from the minimum clock delay value Tsmin to the maximum clock delay value Tsmax.

The variation of the second embodiment achieves the following effect in addition to the effects achieved by the second embodiment. In the variation of the second embodiment, the maximum and minimum values of the previously calculated clock delay values which can implement the system limit operation period Trim are calculated as the maximum and minimum clock delay values Tsmax and Tsmin and the group GS of discrete clock delay values is determined within the range from the minimum clock delay value Tsmin to the maximum clock delay value Tsmax. As a consequence, the selected clock delay value allocated to each of the synchronous devices F1 to FM is limited to the range in which the system limit operation period $T_{lim}$ is implementable so that the clock period T is brought closer to a value in the vicinity of the system limit operation period $T_{lim}$ and the performance of the circuit (LSI) is thereby improved.

Embodiment 3

A clock circuit and a method of designing the same according to a third embodiment of the present invention will be described.

The third embodiment is based on the method of designing a clock circuit according to the first embodiment and is different from the first embodiment in that an objective value of the clock delay value to be allocated to each of the synchronous devices F(i) (i is an integer of 1 to M) (hereinafter referred to as a clock delay objective value) is determined prior to Step SB and that skew scheduling (allocation of the clock delay values to the synchronous devices) is performed in Step SB by using, e.g., a simulated-annealing method (S. Kirkpatrick et al., "Optimization by Simulated Annealing", SCIENCE, Vol. 220, No. 4598, pp. 671–680, 1983: hereinafter referred to as the SA method).

Specifically, the clock delay value is selected from the group GS of discrete clock delay values and allocated to each of the synchronous devices F(i) such that the relations represented by the expressions (5) and (6) are established and an evaluation function value given by the following expression (9) is minimized:

$$\text{COST}=T+\Sigma_i\{S(i)-St(i)\}^2 \tag{9}$$

In the expression (9), S(i) is a clock delay value selected from the group GS of discrete clock delay values and allocated to each of the synchronous devices F(i), St(i) is a clock delay objective value of each of the synchronous device F(i), and T is a circuit operation time when the clock signal is supplied to each of the synchronous devices F(i) in accordance with the clock delay value S(i), while $\Sigma_i$ indicates a summing operation for i.

Thus, the evaluation function value given by the expression (9) is the sum of the circuit operation time T and the total sum of the squares of the differences between the clock delay values S(i) and the clock delay objective values St(i).

The third embodiment achieves the following effects in addition to the effects achieved by the first embodiment. Since the third embodiment performs skew scheduling such that the evaluation function value given by the expression (9) is minimized, the clock delay value S(i) allocated to each of the synchronous devices F(i) can be brought closer to the clock delay objective value St(i) and circuit performance can be improved by reducing the circuit operation time T. At this time, if the clock delay value ST0 (which is a constant common to each of the synchronous devices F(i)) for each of the synchronous devices F(i) is predetermined for a target circuit by, e.g., a zero skew clock design method and the clock delay objective value St(i) for each of the synchronous devices F(i) is set to ST0, circuit performance can be improved by only performing a reduced number of correction steps with respect to a zero skew clock circuit.

Figure 3A:
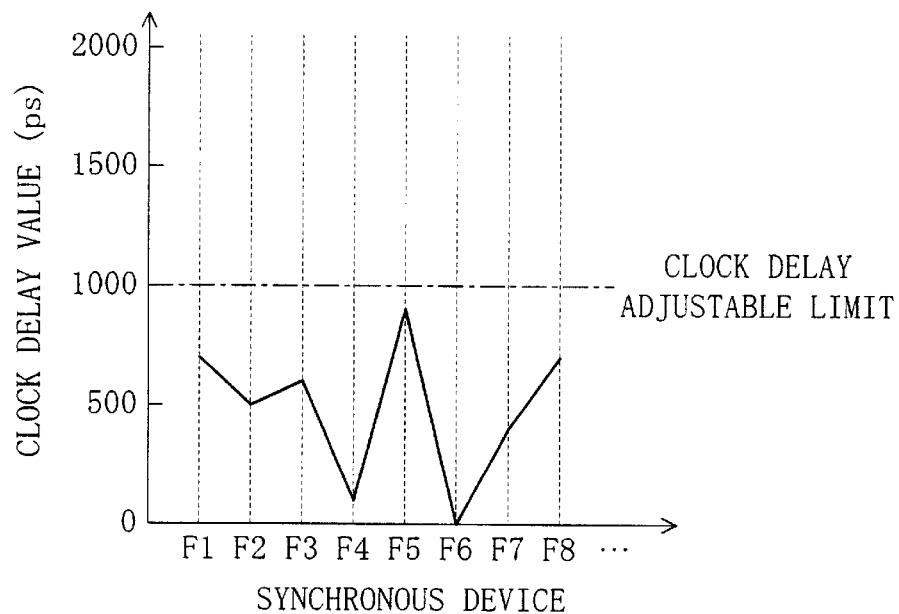
FIG. 3(a) shows an example of selected clock delay values allocated to eight synchronous devices by using a method of designing a clock circuit according to a third embodiment of the present invention and FIG. 3(b) shows an example of a clock circuit for supplying a clock signal to each of the eight synchronous devices in accordance with the selected clock delay values shown in FIG. 3(a)
Figure 3B:
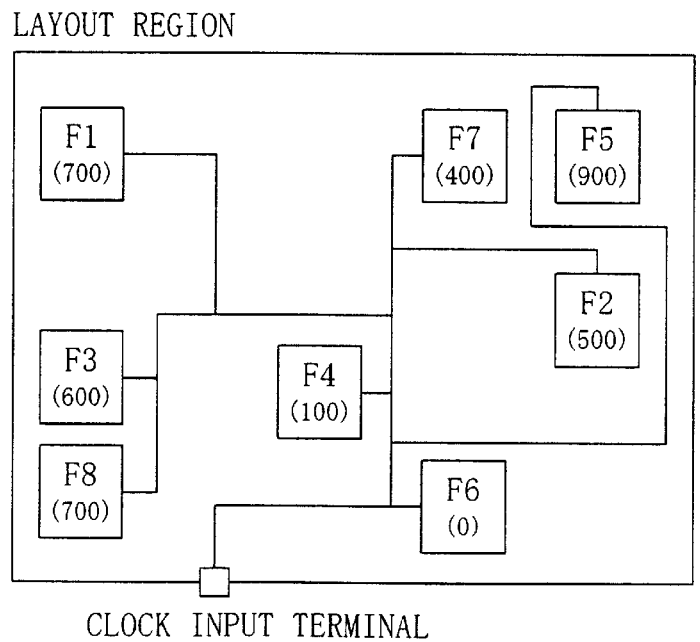

FIG. 3(a) shows an example of the selected clock delay values allocated to the eight synchronous devices F1 to F8 in Step SB by using the expression (9). FIG. 3(b) shows an example of a clock circuit for supplying a clock signal to each of the synchronous devices F1 to F8 in accordance with the selected clock delay values shown in FIG. 3(a). In FIG. 3(a), the vertical axis represents the selected clock delay values allocated to the synchronous devices F1 to F8 by using, as a standard, the selected clock delay value allocated to the synchronous device F6.

In the third embodiment, an evaluation function value obtained by replacing the second term on the right side of the expression (9) with the total sum of the absolute values of the differences between the clock delay values S(i) and the clock delay objective values St(i) may also be used instead of the expression (9). Alternatively, an evaluation function value obtained by multiplying the first and second terms on the right side of the expression (9) by proportional constants (may or may not be the same) or an evaluation function value containing the expression (9) may also be used instead of the expression (9).

Variation 1 of Embodiment 3

A clock circuit and a method of designing the same according to a first variation of the third embodiment of the present invention will be described.

The first variation of the third embodiment is different from the third embodiment in that the synchronous device F(j) (j is a given number specified among the integers from 1 to M (however, j≠i)) adjacent to each of the synchronous devices F(i) (hereinafter referred to as an adjacent synchronous device) is determined based on the arrangement of the synchronous devices F(i) prior to Step SB and that the following expression (10) is used as the (evaluation function value in Step SB.

$$\text{COST}=T+\text{COST\_NB} \tag{10}$$

$$(\text{COST\_NB}=\Sigma_i\Sigma_j\{S(i)-S(j)\}^2)$$

In the expression (10), S(i) is a clock delay value selected from the group GS of discrete clock delay values and allocated to each of the synchronous devices F(i), S(j) is a clock delay value selected from the group GS of discrete clock delay values and allocated to the adjacent synchronous device F(j), and T is a circuit operation time when a clock signal is supplied to each of the synchronous devices F(i) in accordance with the clock delay value S(i), while $\Sigma_i$ indicates a summing operation for i and $\Sigma_j$ indicates a summing operation for j.

Thus, the evaluation function value given by the expression (10) is the sum of the circuit operation time T and the total sum of the squares of the differences between the clock delay values S(i) and the clock delay values S(j).

The first variation of the third embodiment achieves the following effect in addition to the effects achieved by the first embodiment. Since the first variation of the third embodiment performs skew scheduling such that the evaluation function value given by the expression (10) is minimized, the clock delay values allocated to the synchronous devices adjacent to each other can be the same or close to each other and circuit performance can be improved by reducing the circuit operation time T. If the clock delay values allocated to the synchronous devices adjacent to each other are the same or close to each other, the adjacent synchronous devices can be connected with a short wire so that the wiring length of the clock circuit is reduced and power consumption and a layout area are also reduced.

In the first variation of the third embodiment, an evaluation function value obtained by replacing the second term on the right side of the expression (10) with the total sum of the absolute values of the differences between the clock delay values S(i) and the clock delay values S(j) may also be used instead of the expression (10). Alternatively, an evaluation function value obtained by multiplying the first and second terms on the right side of the expression (10) by respective proportional constants (may have the same value or different values) or an evaluation function value including the expression (10) may also be used instead of the expression (10).

Variation 2 of Embodiment 3

A clock circuit and a method of designing the same according to a second variation of the third embodiment of the present invention will be described.

The second variation of the third embodiment is different from the third embodiment in that the synchronous device F(j) (j is a given number specified among the integers from 1 to M (however, j≠i)) adjacent to each of the synchronous devices F(i) (hereinafter referred to as adjacent synchronous device) is determined based on the arrangement of the synchronous devices F(i) prior to Step SB and that the following expression (11) is used as the evaluation function value in Step SB.

$$COST = T + COST\_NB2_{tm} \quad (11)$$

$$(COST\_NB2 = \Sigma_i \Sigma_j \{\{S(i) - S(j)\}/L(i, j)\}^2).$$

In the expression (11), S(i) is a clock delay value selected from the group GS of discrete clock delay values and allocated to each of the synchronous devices F(i), S(j) is a clock delay value selected from the group GS of discrete clock delay values and allocated to the adjacent synchronous device F(j), L(i, j) is the distance between each of the synchronous device F(i) and the adjacent synchronous device F(j), and T is a circuit operation time when a clock signal is supplied to each of the synchronous devices F(i) in accordance with the clock delay value S(i), while $\Sigma_i$ indicates a summing operation for i and $\Sigma_j$ indicates a summing operation for j.

Thus, the evaluation function value given by the expression (11) is the sum of the circuit operation time T and the total sum of the squares of the ratios of the differences between the clock delay values S(i) and the clock delay values S(j) to the distances L(i, j).

The second variation of the third embodiment achieves the following effect in addition to the effects achieved by the first embodiment. Since the second variation of the third embodiment performs skew scheduling such that the evaluation function value given by the expression (11) is minimized, the clock delay values allocated to those of the adjacent synchronous devices disposed at a relatively small distance can be the same or close to each other and circuit performance can be improved by reducing the circuit operation time T. If the clock delay values allocated to those of the adjacent synchronous devices disposed at a relatively small distance are the same or close to each other, the adjacent synchronous devices can be connected with a shorter wire so that the wiring length of the clock circuit is further reduced and power consumption and a layout area are also further reduced.

Figure 4A:
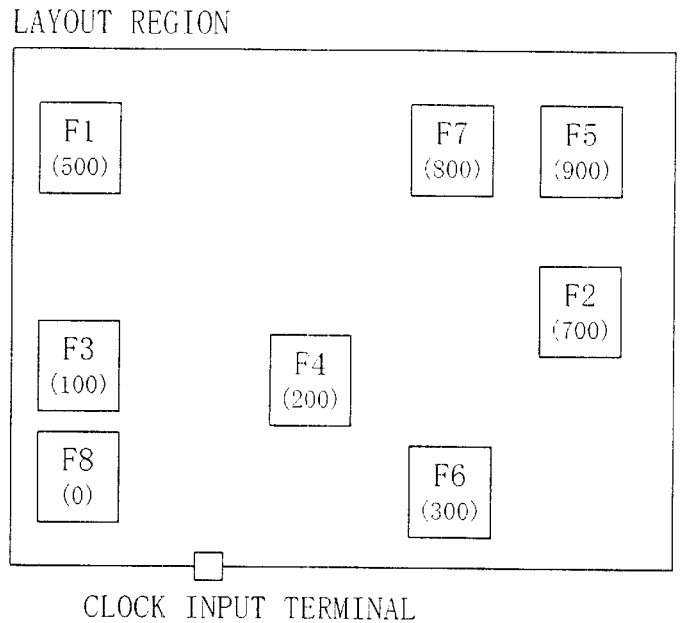
FIG. 4(a) shows an example of selected clock delay values allocated to eight synchronous devices by using a method of designing a clock circuit according to a second variation of the third embodiment of the present invention and FIG. 4(b) shows an example of a clock circuit for supplying a clock signal to each of the eight synchronous devices in accordance with the selected clock delay values shown in FIG. 4(a)
Figure 4B:
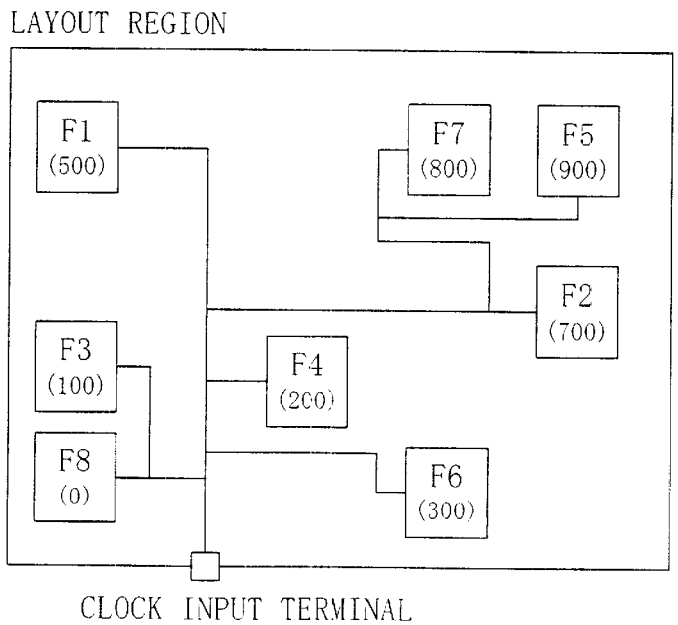

FIG. 4(a) shows an example of the selected clock delay values allocated to the eight synchronous devices F1 to F8 in Step SB by using the expression (11). FIG. 4(b) shows an example of a clock circuit for supplying a clock signal to each of the synchronous devices F1 to F8 in accordance with the selected clock delay values shown in FIG. 4(a).

As shown in FIG. 4(a), the selected clock delay value (900 ps) allocated to the synchronous device F5, e.g., is close to the selected clock delay value (800 ps) allocated to the synchronous device F7 or to the selected clock delay value (700 ps) allocated to the synchronous device F2, which are the adjacent synchronous devices of the synchronous device F5. Accordingly, the synchronous devices F1 to F8 can be connected with short wires, as shown in FIG. 4(b).

In the second variation of the third embodiment, an evaluation function value obtained by replacing the second term on the right side of the expression (11) with the total sum of the absolute values of the ratios of the differences between the clock delay values S(i) and the clock delay values S(j) to the distances L(i, j) may also be used instead of the expression (11). Alternatively, an evaluation function value obtained by multiplying the first and second terms on the right side of the expression (11) by respective proportional constants (may have the same value or different values) or an evaluation function value including the expression (11) may also be used instead of the expression (11).

Variation 3 of Embodiment 3

A clock circuit and a method of designing the same according to a third variation of the third embodiment of the present invention will be described.

The third variation of the third embodiment is different from the third embodiment in that the synchronous device F(j) (j is a given number specified among the integers from 1 to M (however, i≠j)) adjacent to each of the synchronous devices F(i) (hereinafter referred to as an adjacent synchronous device) is determined based on the arrangement of the synchronous devices F(i) prior to Step SB, that a power source branch line (hereinafter referred to as a connection power source line) connected to each of the synchronous devices F(i) is determined based on power source line data, and that an evaluation function value composed of a linear combination of the following expression (12) and the expression (9), (10), or (11) or an evaluation function value obtained by replacing the second term on the right side of the expression (9), (10), or (11) with the expression (12) is used as the evaluation function value in Step SB:

$$COST\_GP = \Sigma_i \Sigma_j \delta(P(i) - P(j)) \times ((S(i) - S(j))) \qquad (12).$$

In the expression (12), S(i) is a clock delay value selected from the group GS of discrete clock delay values and allocated to each of the synchronous devices F(i), S(j) is a clock delay value selected from the group GS of discrete clock delay values and allocated to the adjacent synchronous device F(j), P(i) is a power source line number for identifying the connection power source line of the synchronous device F(i), and P(j) is a power source line number for identifying the connection power source line of the adjacent synchronous device F(j), while $\Sigma_i$ indicates a summing operation for i, $\Sigma_j$ indicates a summing operation for j, and $\delta(x)$ indicates the Kronecker's delta function in which $\delta(x)=1$ is satisfied when the factor thereof x is 0 and $\delta(x)=0$ is satisfied when the factor x is not 0.

Thus; the evaluation function value given by the expression (12) is the total sum of function values each of which assumes a specified value (e.g., 1) at the time when the power source line number P(i) is the same as the power source line number P(j) and the clock delay value S(i) is the same as the clock delay value S(j) and assumes 0 at all other times.

The third variation of the third embodiment achieves the following effect in addition to the effects achieved by the first embodiment. Since the third variation of the third embodiment performs skew scheduling such that the evaluation function value composed of a linear combination of the expression (12) and the expression (9), (10), or (11) or the evaluation function value obtained by replacing the second term on the right side of the expression (9), (10), or (11) with the expression (12), it can improve circuit performance by reducing the circuit operation time T and prevent a situation where clock delay values, which are either the same or close to each other, are allocated to the synchronous devices connected to the same power source branch line and adjacent to each other. If such a situation is prevented, the synchronous devices connected to the same power source branch line and adjacent to each other are prevented from operating simultaneously so that a local increase in the amount of consumed current is inhibited. In the case of using the evaluation function value composed of a linear combination of the expression (12) and the expression (10) or (11), clock delay values which are either the same or close to each other are allocated to the synchronous devices connected to different power source branch lines and adjacent to each other, so that the wiring length of a clock circuit, i.e., the wiring capacitance thereof is reduced.

Figure 5:
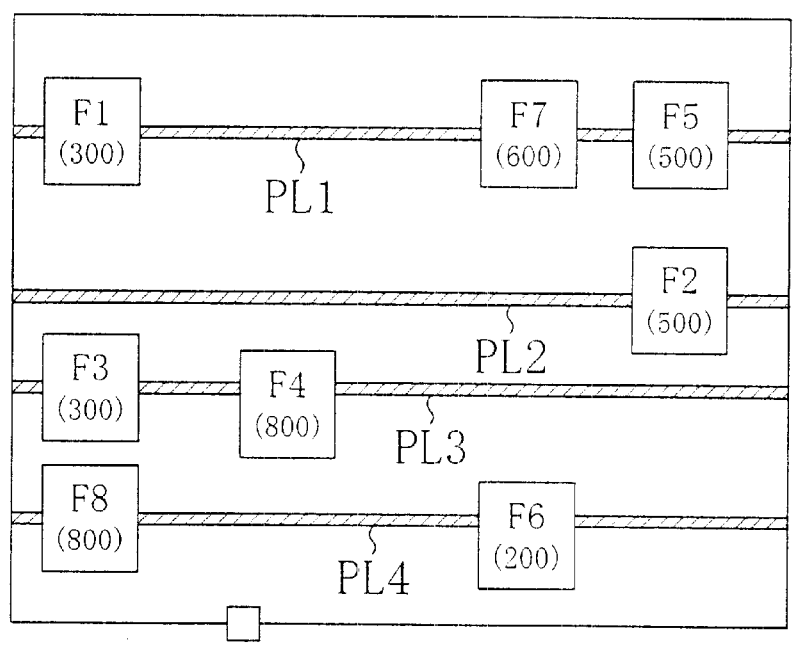
FIG. 5 shows an example of selected clock delay values allocated to eight synchronous devices by using a method of designing a clock circuit according to a third variation of the third embodiment of the present invention.

FIG. 5 shows an example of the selected clock delay values allocated to the eight synchronous devices F1 to F8 by using the expression (12) in Step SB.

As shown in FIG. 5, the synchronous devices F1, F5, and F7 are connected to the power source branch line PL1, the synchronous device F2 is connected o the power source branch line PL2, the synchronous devices F3 and F4 are connected to the power source branch line PL3, and the synchronous devices F6 and F8 are connected to the power source branch line PL4. Since the synchronous devices F5 and F7 are adjacent to each other and connected to the same power source branch line (PL1), the selected clock delay value (500 ps) allocated to the synchronous device F5 is different from the selected clock delay value (600 ps) allocated to the synchronous device F7. By contrast, since the synchronous devices F2 and F5 are adjacent to each other and connected to the different power source branch lines (PL1 and PL2), the selected clock delay value (500 ps) allocated to the synchronous device F2 is the same as the selected clock delay value (500 ps) allocated to the synchronous device F5.

In the third variation of the third embodiment, a numerical expression obtained by multiplying the expression (12) by a proportional constant may also be used instead of the expression (12).

If at least one of the synchronous devices connected to the same power source branch line and adjacent to each other is in proximity to a basic power source line (located within a specified distance from the basic power source line), the expression (12) may also be used to permit the allocation of clock delay values which are either the same or close to each other to the synchronous devices, i.e., to permit simultaneous operation of the synchronous devices. Specifically, prior to Step SB, the adjacent synchronous device F(j) is determined among the synchronous devices located at a specified distance or farther away from the basic power source line based on the power source line data and the expression (12) is used for the adjacent synchronous device F(j). This eases constraints during skew scheduling and thereby allows easy skew scheduling.

Figure 6:
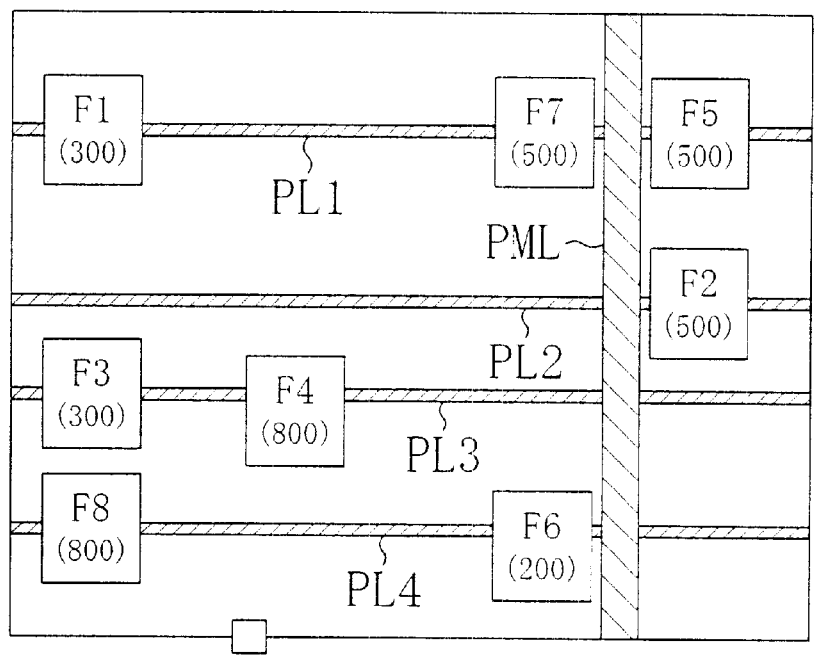
FIG. 6 shows another example of selected clock delay values allocated to eight synchronous devices by using the method of designing a clock circuit according to the third variation of the third embodiment.

FIG. 6 shows an example of the selected clock delay values allocated to the eight synchronous devices F1 to F8 by using the expression (12) under the constraints eased in Step SB, as described above.

As shown in FIG. 6, the synchronous devices F1, F5, and F7 are connected to the power source branch line PL1, the synchronous device F2 is connected to the power source branch line PL2, the synchronous devices F3 and F4 are connected to the power source branch line PL3, and the synchronous devices F6 and F8 are connected to the power source branch line PL4, while the synchronous devices F2, F5, F6, and F7 are in proximity to the basic power source line PML.

If the expression (12) is used without easing the constraints, the synchronous devices F5 and F7 adjacent to each other and connected to the same power source branch line (PL1) have different selected clock delay values (500 ps and 600 ps), as shown in FIG. 5. By contrast, the synchronous devices F5 and F7 have the same selected clock delay value (500 ps) when the expression (12) is used under the eased constraints, since each of the synchronous devices F5 and F7 is in proximity to the basic power source line PML.

Embodiment 4

A clock circuit and a method of designing the same according to a fourth embodiment of the present invention will be described with reference to the drawings.

The fourth embodiment is based on the method of designing the clock circuit according to the first embodiment and is different from the first embodiment in that, in Steps SC, at least one or more groups of synchronous devices (hereinafter referred to as a cluster) having the same selected clock delay value allocated thereto in Step SB are formed and a clock circuit is designed by using the cluster.

Figure 7:
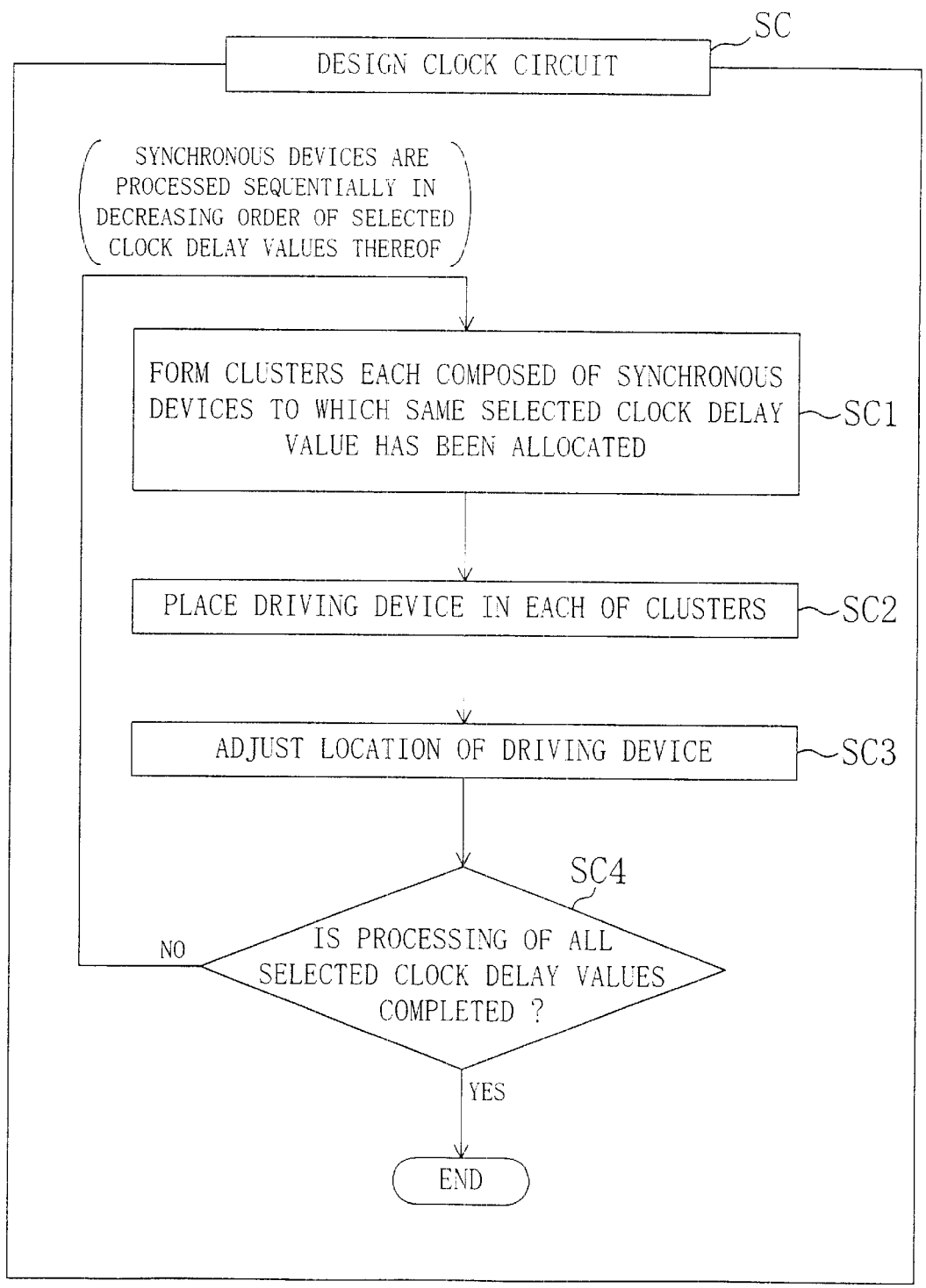
FIG. 7 is a flow chart illustrating the individual processes performed in Steps SC of a method of designing a clock circuit according to a fourth embodiment of the present invention.

FIG. 7 is a flow chart showing the individual processes performed in Steps SC (Clock Circuit Designing Step) of the method of designing a clock circuit according to the fourth embodiment. In the fourth embodiment, the synchronous devices are sequentially subjected to the individual processes performed in Steps SC in decreasing order of selected clock delay values thereof.

First, in Step SC1, at least one or more clusters FFG each composed of the synchronous devices having the same selected clock delay value allocated thereto in Step SB are formed from the plurality of synchronous devices F1 to FM such that a signal delay value when the synchronous devices contained in each of the clusters FFG are connected to each other with a minimum wiring length based on the arrangement of the synchronous devices F1 to FM and when the cluster FFG is driven by one driving device B (hereinafter referred to as a cluster delay value) is not more than a discrete clock delay value difference TUd (difference between one of the selected clock delay values corresponding to the cluster FFG and the selected clock delay value other than the one of the selected clock delay values which is smaller than and closest to the one of the selected clock delay values). The cluster delay value is produced when the total sum of the wiring capacitance and the input terminal capacitances of the synchronous devices in each of the clusters FFG (hereinafter referred to as a cluster total capacitance) is driven by the driving device B.

The discrete clock delay value difference TUd is equal to the basic clock delay unit time TU when the group GS of discrete clock delay values are composed of integral multiples of the basic clock delay unit time TU.

If the signal delay Tbc when the driving device B drives a capacitance is equal to TUd in the expression (3) (see the first embodiment), the following expression (13) is satisfied:

$$TUd = Tb + \Delta Tb \times Cb \quad (13).$$

In the expression (13), Tb is a specific delay of the driving device B, ΔTb is a driving delay per unit capacitance, and Cb is a capacitance driven by the driving device B. By the expression (13), the capacitance Cb that can be driven by the driving device B when the signal delay Tbc is equal to TUd is determined. If the total sum of the wiring capacitance when the synchronous devices to which the same selected clock delay value has been allocated are connected to each other with a minimum wiring length based on the arrangement of the synchronous devices F1 to FM and the respective input terminal capacitances of the synchronous devices is designated at Cg, a minimum number of clusters to be formed is given by the following expression (14):

$$Nc = Cg/Cb \text{ (round up the quotient to the decimal point)} \quad (14).$$

That is, the clusters FFG each of which is composed of the synchronous devices with the same selected clock delay value and the number of which is not less than the minimum number Nc of clusters given by the expression (14) are formed in Step SC1, whereby the cluster delay value in each of the clusters FFG is surely reduced to a value not more than the discrete clock delay value difference TUd.

Next, in Step SC2, one driving device B is placed in each of the clusters FFG and a wiring connection between the output terminal of the driving device B and each of the input terminals of the synchronous devices contained in the cluster FFG in which the driving device B is placed is determined by using redundant wiring such that the cluster delay value is equal to the discrete clock delay value difference TUd.

Next, in Step SC3, the location of the driving device B is adjusted by using redundant wiring such that it is closer to, of the synchronous devices to which the other of the selected clock delay values smaller than and closest to the one of the selected clock delay values corresponding to the cluster FFG driven by the driving device B has been allocated, that one closest to the driving device B. This reduces the redundant wiring in the cluster FFG.

Next, in Step SC4, it is determined whether or not each of the processes in Steps SC1 to SC3 has been performed with respect to all the selected clock delay values. If each of the processes in Steps SC1 to SC3 has been performed with respect to all the selected clock delay values, the whole process is completed. If not, each of the processes in Steps SC1 to SC3 is performed again with respect to a new selected clock delay value.

When one of the clusters FFG (hereinafter referred to as an upper-level cluster) is formed of the synchronous devices having the same selected clock delay value in Step SC1, the fourth embodiment regards the driving device B placed in the cluster FFG (hereinafter referred to as a lower-level cluster) other than the one of the clusters FFG which has the selected clock delay value larger than and closest to the selected clock delay value of the one of the clusters FFG as one of the synchronous devices that have the selected clock delay value of the one of the clusters FFG. When the wiring connection in the upper-level cluster is determined in Step SC2, the fourth embodiment also regards the driving device B placed in the lower-level cluster as one of the synchronous devices contained in the upper-level cluster.

Referring to FIGS. 8(a) to (d), a specific description will be given to the case where each of the processes in Steps SC1 to SC3 is performed with respect to the synchronous devices F2, F3, F4, F7, and F8 to which a selected clock delay value of 200 ps has been allocated.

Figure 8A:
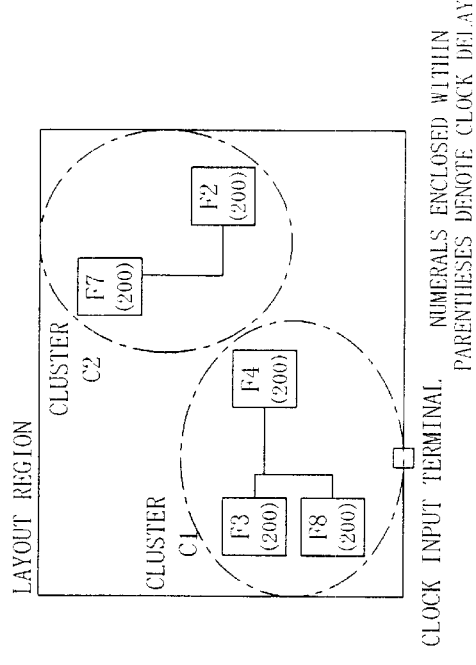
FIGS. 8(a) to (d) show the generation of a clock circuit in the individual processes performed in Steps SC of the method of designing a clock circuit according to the fourth embodiment.

FIG. 8(a) shows the two-dimensional layout arrangement of the synchronous devices F2, F3, F4, F7, and F8 which have been connected to each other with a minimum wiring length.

Figure 8B:
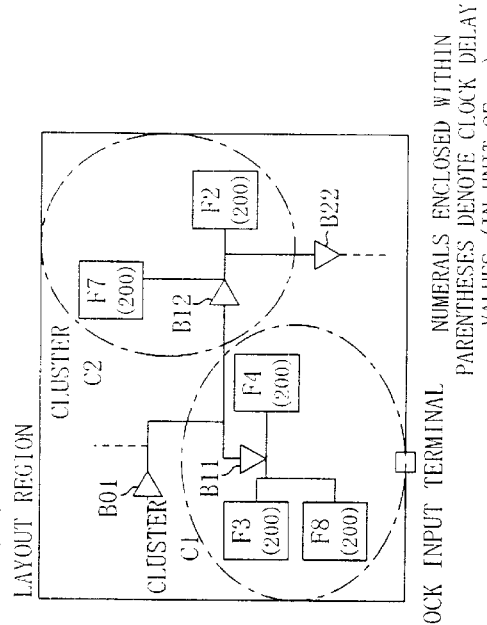

In Step SC1, a cluster C1 composed of the synchronous devices F3, F4, and F8 and a cluster C2 composed of the synchronous devices F2 and F7 are formed from the synchronous devices F2, F3, F4, F7, and F8, as shown in FIG. 8(b). The clusters C1 and C2 are formed such that the cluster delay value when the total capacitance (the total sum of the wiring capacitance and the input terminal capacitances of the synchronous devices) in each of the clusters C1 and C2 is driven by one driving device B is not more than the discrete clock delay value difference TUd.

Figure 8C:
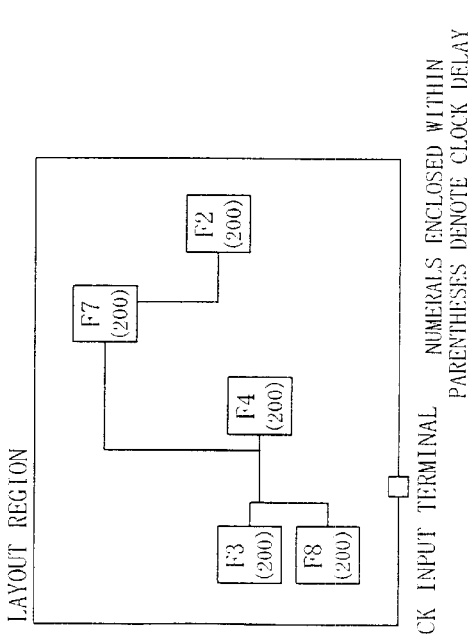

In Step SC2, respective driving devices B11 and B12 are placed in the clusters C1 and C2 and respective wiring connections in the clusters C1 and C2 are determined, as shown in FIG. 8(c). Specifically, the wiring connection between the output terminal of the driving device B11 and each of the input terminals of the synchronous devices F3, F4, and F8 is determined in the cluster C1 and the wiring connection between the output terminal of the driving device B12 and each of the input terminals of the synchronous devices F2 and F7 is determined in the cluster C2. At this time, the location of the driving device B11 or B12 is adjusted such that the cluster delay value in the cluster C1 or C2 is equal to the discrete clock delay value difference TUd, i.e., such that the charge capacitance driven by the driving device B11 or B12 is equal to Cb given by the expression (13). Alternatively, the wiring connection in the cluster C1 or C2 is adjusted by using redundant wiring.

In Step SC3, the location of the driving device B11 in the cluster C1 is adjusted, by using redundant wiring between the driving device B11 and the synchronous device F3, F4, or F8, to be closer to, of the synchronous devices (not shown) to which the selected clock delay value (100 ps when the discrete clock delay value difference TUd is 100 ps) smaller than and closest to 200 ps has been allocated, that one closest to the driving device B11. The location of the driving device B12 is also adjusted in the same manner.

Figure 8D:
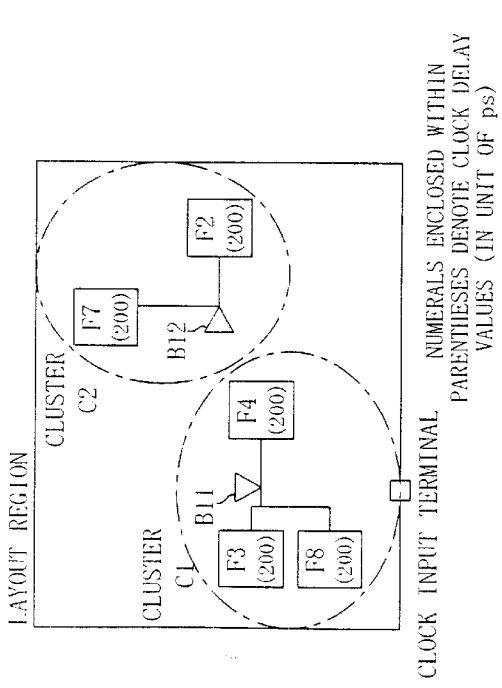

FIG. 8(d) shows the result of also performing each of the processes in Steps SC1 to SC3 with respect to the synchronous devices to which a selected clock delay value other than 200 ps has been allocated.

As shown in FIG. 8(d), a wiring connection between each of the driving devices B11 and B12 and a driving device B01 for driving a cluster (not shown) corresponding to a selected clock delay value smaller than 200 ps has been determined and a wiring connection between the driving device B12 and a driving device B22 for driving a cluster (not shown) corresponding to a selected clock delay value larger than 200 ps has been determined.

The fourth embodiment achieves the following effect in addition to the effects achieved by the first embodiment. The fourth embodiment forms at least one or more clusters FFG each composed of the synchronous devices having the same selected clock delay value allocated thereto such that the cluster delay value when the synchronous devices contained in each of the clusters FFG are connected to each other with a minimum wiring length and when the cluster FFG is driven by one driving device B is not more than the discrete clock delay value difference Tud, places one driving device B in each of the clusters FFG, and determines the wiring connection between the output terminal of the driving device B and the input terminals of the synchronous devices contained in the cluster FFG in which the driving device B is placed such that the cluster delay value is equal to the discrete clock delay value difference TUd. As a result, a clock circuit implementing the result of skew scheduling can surely be generated by connecting the driving devices B placed in the individual clusters FFG to each other.

As the driving devices B placed in the respective clusters FFG in Step SC2, the fourth embodiment preferably uses the same type of driving devices B0 in all the clusters FFG. This allows easy calculation of the minimum number Nc of clusters using the expression (13), the expression (14), and the like and thereby allows easy formation of the clusters FFG.

In the fourth embodiment, the process in Step SC3 may also be omitted.

Embodiment 5

A clock circuit and a method of designing the same according to a fifth embodiment of the present invention will be described with reference to the drawings.

The fifth embodiment is based on the method of designing a clock circuit according to the fourth embodiment and is different from the fourth embodiment in that it comprises the step of additionally inserting the synchronous device in each of the clusters FFG formed in Step SC1 between Steps SC1 and SC2 (see FIG. 7) of the fourth embodiment and thereby reduces redundant wiring in each of the clusters FFG.

Figure 9:
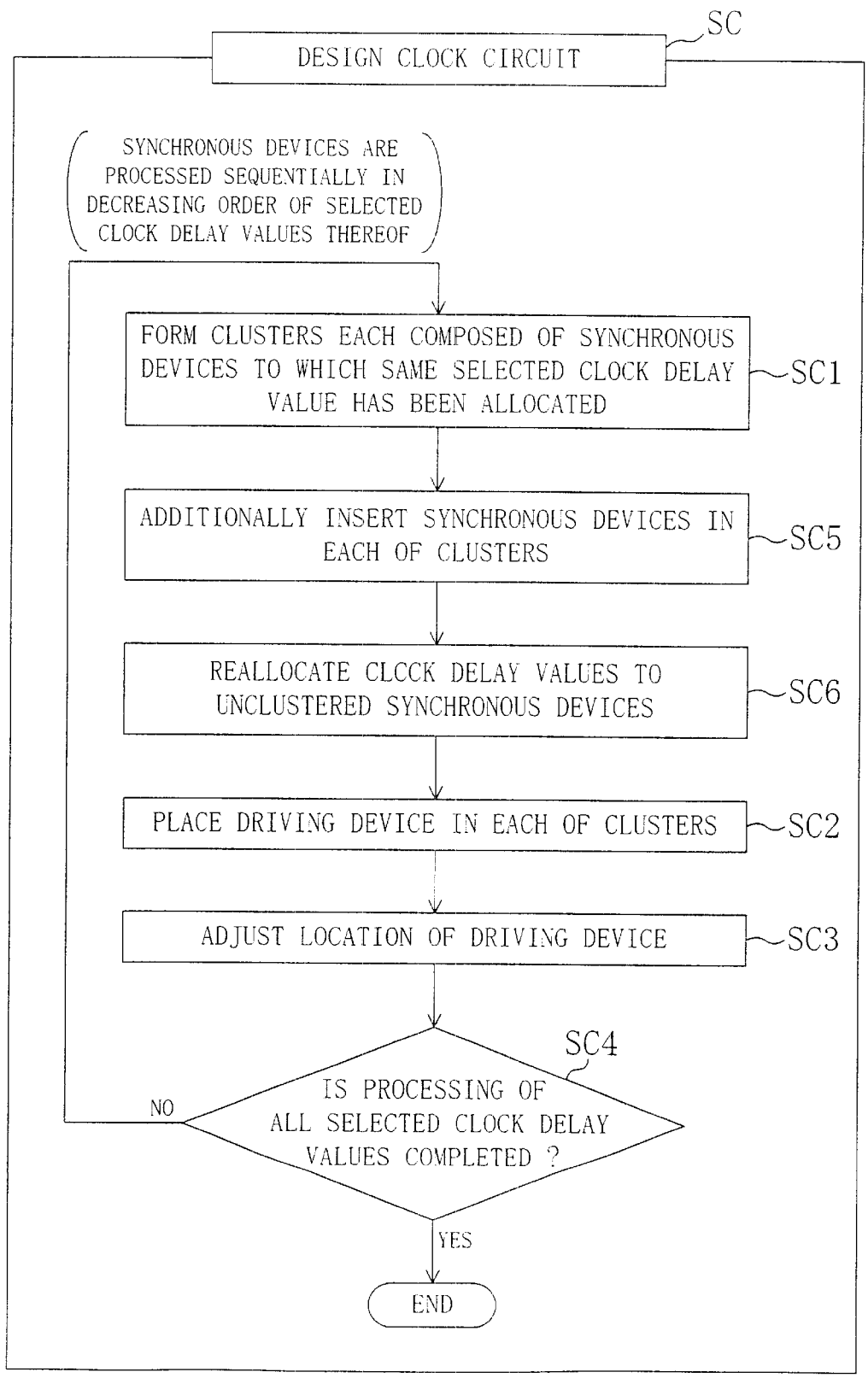
FIG. 9 is a flow chart illustrating the individual processes performed in Steps SC of a method of designing a clock circuit according to a fifth embodiment of the present invention.

FIG. 9 is a flow chart showing the individual processes performed in Steps SC (Clock Circuit Designing Step) of the method of designing a clock circuit according to the fifth embodiment. In the fifth embodiment, the synchronous devices are sequentially subjected to the individual processes performed in Steps SC in decreasing order of selected clock delay values thereof.

First, in Step SC1 similarly to the fourth embodiment, at least one or more clusters FFG each composed of the synchronous devices to which the same selected clock delay value has been allocated in Step SB are formed from the plurality of synchronous devices F1 to FM such that a signal delay value when the synchronous devices contained in each of the clusters FFG are connected to each other with a minimum wiring length based on the arrangement of the synchronous devices F1 to FM and when the cluster FFG is driven by one driving device B (hereinafter referred to as a cluster delay value) is not more than a discrete clock delay value difference TUd (difference between one of the selected clock delay values corresponding to the cluster FFG and the selected clock delay value other than the one of the selected clock delay values which is smaller than and closest to the one of the selected clock delay values).

Next, in Steps SC5, the synchronous device is inserted additionally in each of the clusters FFG formed in Step SC1.

Figure 10:
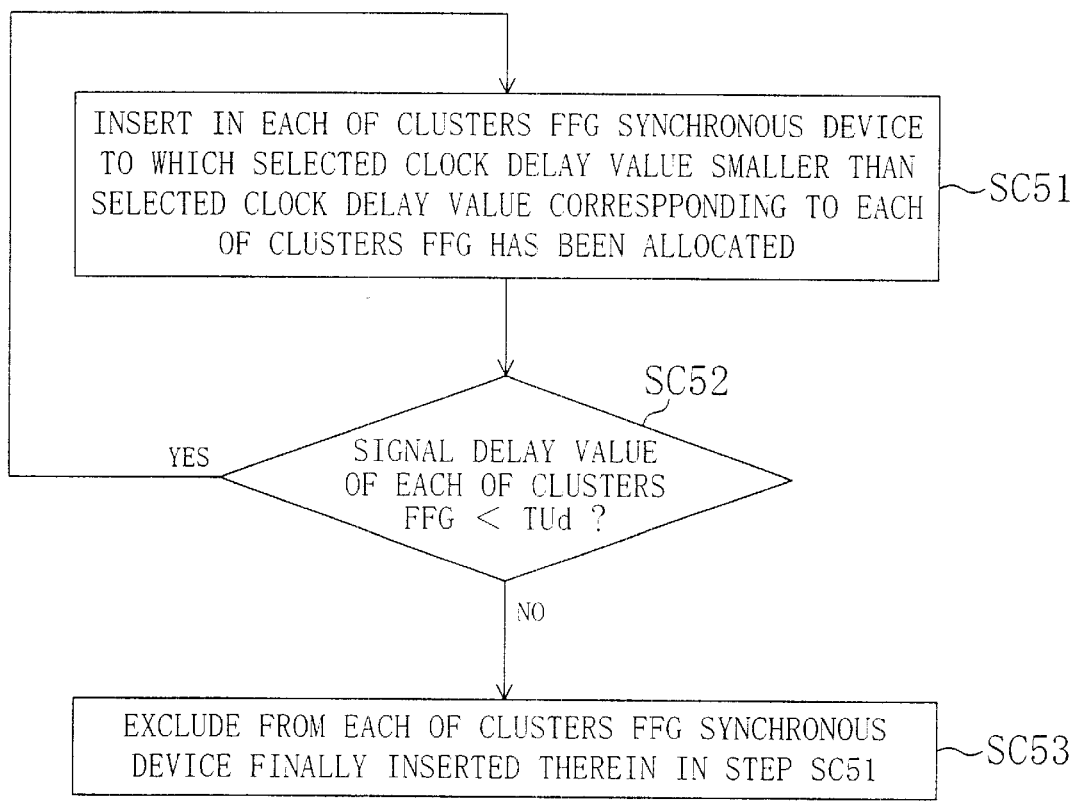
FIG. 10 is a flow chart illustrating the individual processes performed in Steps SC5 of the method of designing a clock circuit according to the fifth embodiment.

Referring to the flow chart shown in FIG. 10, the processes performed in Steps SC5 will be described in detail.

In Step SC51, if the operation of the circuit is ensured, specifically if the expressions (5) and (6) are satisfied, the selected clock delay value corresponding to the cluster FFG formed in Step SC1 is reallocated to the synchronous device having a selected clock delay value a smaller than the selected clock delay value corresponding to the cluster FFG and the synchronous device to which the selected clock delay value has been reallocated is inserted in the cluster FFG.

In Step SC52, it is determined whether or not the cluster delay value in the cluster FFG in which the synchronous device has been inserted additionally in Step SC51 is smaller than the discrete clock delay value difference TUd. If the cluster delay value in the cluster FFG is smaller than the discrete clock delay value difference TUd, the process in Step SC51 is performed again. If not, the process in Step SC53 is performed.

In Step SC53, the synchronous device finally inserted in the cluster FFG in Step SC51 is excluded from the cluster FFG and the selected clock delay value of the synchronous device is restored to the pre-change value.

Next, in Step SC6, the clock delay value selected from the group GS of discrete clock delay values is allocated to that one of the synchronous devices with the selected clock delay value smaller than the selected clock delay value corresponding to the cluster FFG which is not contained yet in any of the clusters FFG, i.e., to the unclustered synchronous device such that the operation of the circuit is ensured, specifically that the expressions (5) and (6) are satisfied. At this time, a value smaller than the selected clock delay value corresponding to the cluster FFG is used as the maximum value of the clock delay values newly allocated to the unclustered synchronous device.

Next, in Step SC2 similarly to the fourth embodiment, one driving device B is placed in each of the clusters FFG and a wiring connection between the output terminal of the driving device B and each of the input terminals of the synchronous devices contained in the cluster FFG in which the driving device B has been placed is determined by using redundant wiring such that the cluster delay value is equal to the discrete clock delay value difference TUd.

Next, in Step SC3 similarly to the fourth embodiment, the location of the driving device B is adjusted by using redundant wiring such that it is closer to, of the synchronous devices to which the other of the selected clock delay values smaller than and closest to the one of the selected cluster delay values corresponding to the cluster FFG driven by the driving device B has been allocated, that one closest to the driving device B.

Next, in Step SC4 similarly to the fourth embodiment, it is determined whether or not each of the processes in Steps SC (Steps SC1, SC5, SC6, SC2, and SC3) has been performed with respect to all the selected clock delay values and the whole process is completed if each of the processes in Steps SC has been performed with respect to all the selected clock delay values. If not, each of the processes in Steps SC is performed again with respect to a new selected clock delay value.

The fifth embodiment achieves the following effects in addition to the effect achieved by the fourth embodiment.

If the operation of the circuit is ensured, the fifth embodiment reallocates the selected clock delay value corresponding to the cluster FFG formed in Step SC1 to the synchronous device having a selected clock delay value smaller than the selected clock delay value corresponding to the cluster FFG and inserts, in the cluster FFG, the synchronous device to which the selected clock delay value has been allocated. The additional insertion of the synchronous device brings the cluster delay value in the cluster FFG closer to the discrete clock delay value difference TUd, so that redundant wiring within the cluster FFG is reduced and power consumption and layout area are also reduced. Since the number of synchronous devices contained in each of the clusters FFG is increased, the total number of clusters FFG, i.e., the total number of driving devices B placed in the respective clusters FFG is reduced, which further reduces power consumption and layout area.

The fifth embodiment further allocates the clock delay value selected from the group GS of discrete clock delay values to that one of the synchronous devices having the selected clock delay value smaller than the selected clock delay value corresponding to the cluster FFG which has not been inserted in the cluster FFG in Steps SC5, i.e., the synchronous device still unclustered, while ensuring the operation of the circuit. This allows the selected clock delay value allocated to the unclustered synchronous device to be improved by using, e.g., the evaluation function values given by the expressions (9) to (12) and the like so that easier clustering of the synchronous devices is performed.

Figure 11A:
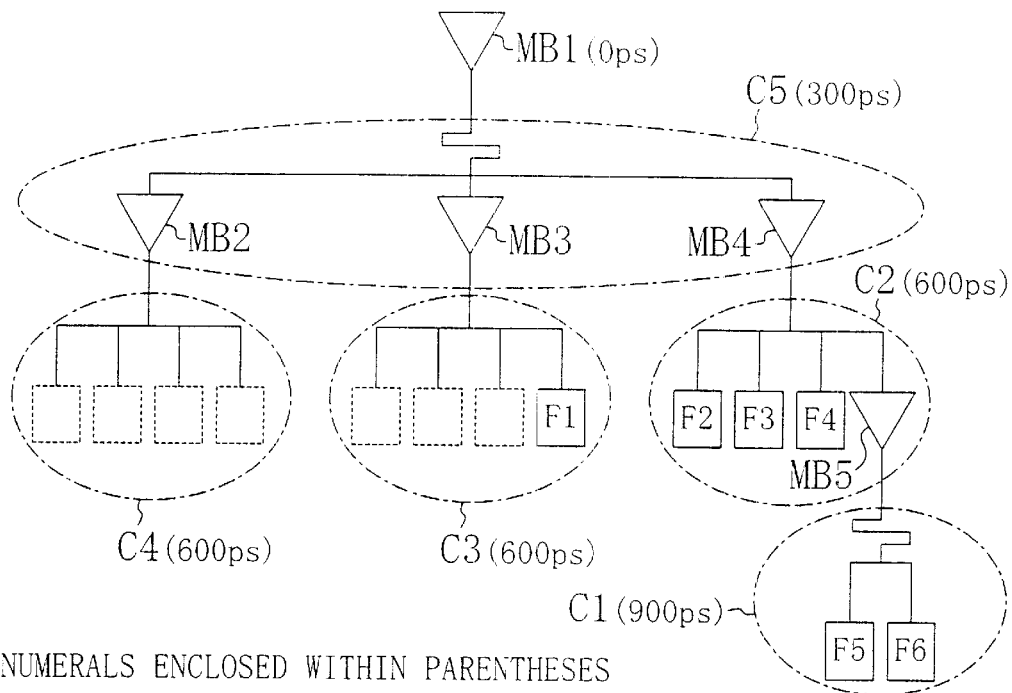
FIG. 11(a) shows, as a first comparative example, an example of a clock circuit generated when Steps SC5 and SC6 are not performed in the method of designing a clock circuit according to the fifth embodiment
Figure 11B:
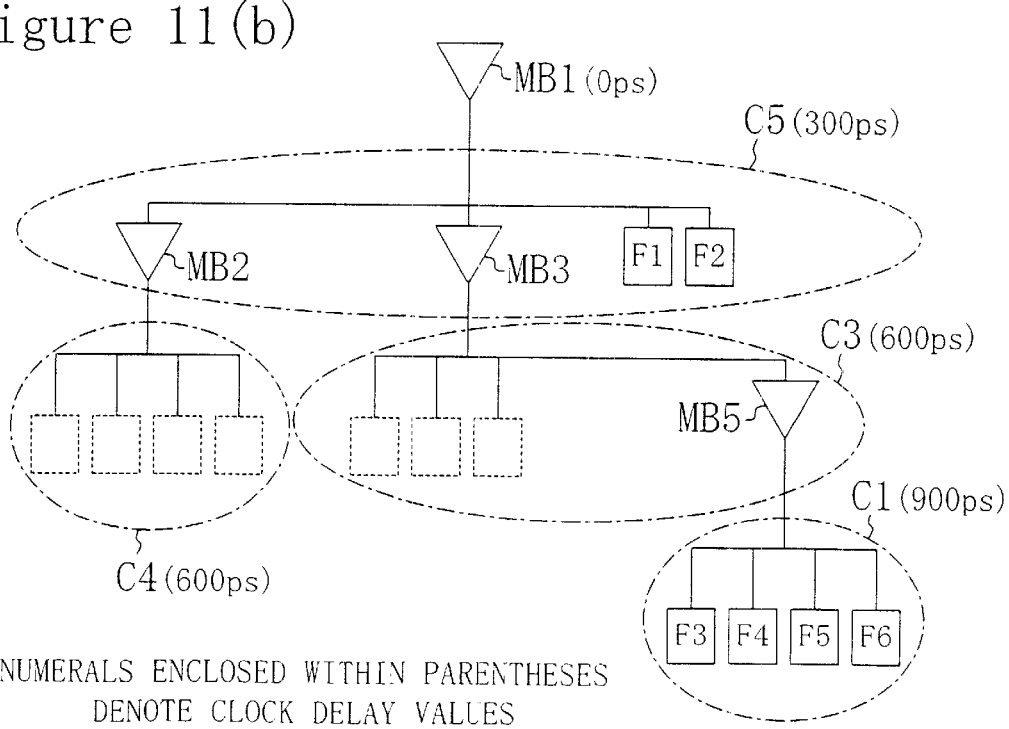
FIG. 11(b) shows an example of a clock circuit generated by the method of designing a clock circuit according to the fifth embodiment.

FIG. 11(a) shows, as a first comparative example, an example of a clock circuit generated in the case where Steps SC5 and SC6 of Steps SC are not performed. FIG. 11(b) shows an example of a clock circuit generated in the case where Steps SC5 and SC6 of Steps SC are performed, i.e., a clock circuit generated in accordance with the method of designing a clock circuit according to the present embodiment.

As shown in FIG. 11(a), the cluster C1 contains the synchronous devices F5 and F6 to each of which a selected clock delay value of 900 ps has been allocated. The cluster C2 contains the synchronous devices F2 to F4 to each of which a selected clock delay value of 600 ps has been allocated and the driving device MB5 for driving the cluster C1. The cluster C3 contains the plurality of synchronous devices including the synchronous devices F1 to each of which a selected clock delay value of 600 ps has been allocated. The cluster C4 contains the plurality of synchronous devices to each of which a selected clock delay value of 600 ps has been allocated. The cluster C5 contains the driving device MB4 for driving the cluster C2, the driving device MB3 for driving the cluster C3, and the driving device MB2 for driving the cluster C4. The driving devices MB2 to MB4 correspond to a selected clock delay value of 300 ps. The driving devices MB2 to MB4, i.e., the cluster C5 is driven by the driving device MB1 corresponding to a selected clock delay value of 0 ps.

As also shown in FIG. 11(a), redundant wiring is used in the cluster C1 or C5 such that the cluster delay value therein is equal to the discrete clock delay value difference Tud (which is specifically 300 ps).

As shown in FIG. 11(b), on the other hand, the cluster C1 contains the synchronous devices F3, F4, F5, and F6 to each of which a selected clock delay value of 900 ps has been allocated. The cluster C3 contains a plurality of synchronous devices to each of which a selected clock delay value of 600 ps has been allocated and the driving device MB5 for driving the cluster C1. The cluster C4 contains a plurality of synchronous devices to each of which a selected clock delay value of 600 ps has been allocated. The cluster C5 contains the synchronous devices F1 and F2 to each of which a selected clock delay value of 300 ps has been allocated, the driving device MB3 for driving the cluster C3, and the driving device MB2 for driving the cluster C4. The cluster C5 is driven by the driving device MB1 corresponding to a selected clock delay value of 0 ps.

From a comparison between FIGS. 11(a) and (b), it will be understood that the present embodiment can eliminate the redundant wiring in the cluster C1 since the cluster delay value in the cluster C1 is made equal to the discrete clock delay value difference TUd by changing the selected clock delay value allocated to each of the synchronous devices F3 and F4 from 600 ps to 900 ps and inserting the synchronous devices F3 and F4 in the cluster C1 in Steps SC5. As a result of reallocating, in Step SC6, a selected clock delay value of 300 ps to the synchronous devices F1 and F2 to which a selected clock delay value of 600 ps has been allocated, the present embodiment can eliminate the cluster C2 corresponding to a selected clock delay value of 600 ps, i.e., the driving device MB4 and eliminate the redundant wiring in the cluster C5.

In Steps SC5 in the fifth embodiment, the synchronous device to which the selected clock delay value corresponding to the cluster FFG is reallocated is determined preferably from the synchronous devices located adjacent the synchronous device contained in the cluster FFG. This reduces the wiring length of the clock circuit and suppresses increased power consumption and increased layout area.

In the fifth embodiment, the process in Step SC6 or SC3 may also be omitted.

Variation of Embodiment 5

A clock circuit and a method of designing the same according to a variation of the fifth embodiment of the present invention will be described with reference to the drawings.

The variation of the fifth embodiment is different from the fifth embodiment in that, in contrast to the fifth embodiment which comprises, between Steps SC1 and SC2 of the fourth embodiment, the step of additionally inserting the synchronous device in each of the clusters FFG formed in Step SC1, the variation of the fifth embodiment comprises, after Steps SC (see FIGS. 1 and 7) of the fourth embodiment, the step of moving the locations of the synchronous devices between the clusters FFG formed in Step SC1 (hereinafter referred to as Cluster Changing Step).

Specifically, if the operation of the circuit is ensured, i.e., if the expressions (5) and (6) are satisfied, the cluster changing step according to the variation of the fifth embodiment includes reallocating the selected clock delay value corresponding to one of the clusters FFG formed in Step SC1 to the synchronous device contained in another of the clusters FFG formed in Step SC1 and inserting, in the one of the clusters FFG, the synchronous device to which the selected clock delay value has been reallocated.

The variation of the fifth embodiment achieves the following effects in addition to the effect achieved by the fourth embodiment. Since the cluster delay value in each of the clusters FFG can be brought closer to the discrete clock delay value difference TUd by moving the locations of the synchronous devices between the clusters FFG, the redundant wiring in each of the clusters FFG is reduced so that power consumption and layout area are reduced. In the case where all the synchronous devices contained in the other of the clusters FFG can be inserted in the one of the clusters FFG, the total number of clusters FFG, i.e., the total number of driving devices B placed in the respective clusters FFG is reduced so that power consumption and layout area are further reduced.

Figure 12A:
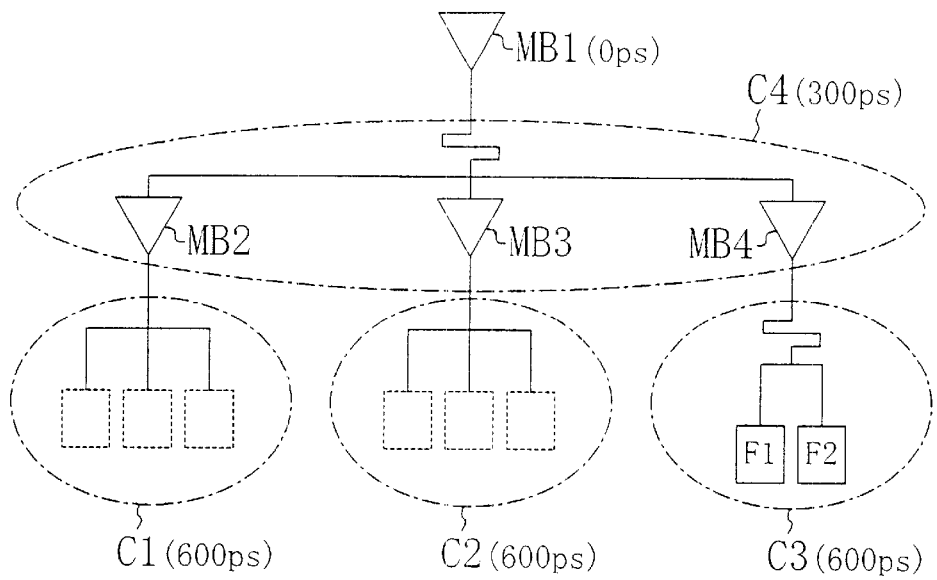
FIG. 12(a) shows, as a second comparative example, an example of a clock circuit generated when a cluster changing step is not performed in a method of designing a clock circuit according to a variation of the fifth embodiment of the present invention
Figure 12B:
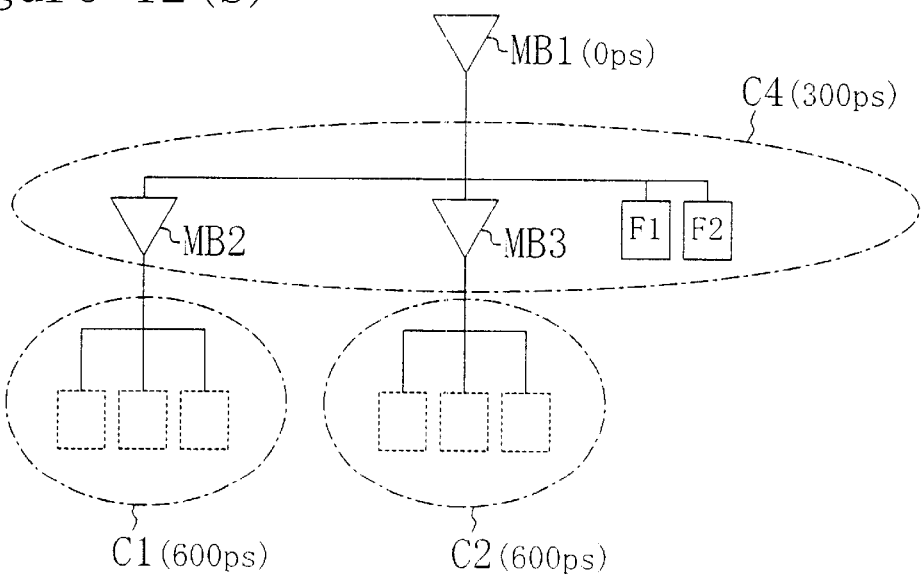
FIG. 12(b) shows an example of a clock circuit generated by the method of designing a clock circuit according to the variation of the fifth embodiment.

FIG. 12(a) shows, as a second comparative example, an example of a clock circuit generated when the cluster changing step is not performed. FIG. 12(b) shows an example of a clock circuit generated when the cluster changing step is performed, i.e., a clock circuit generated in accordance with the method of designing a clock circuit according to the present variation.

As shown in FIG. 12(a), each of the clusters C1 and C2 contains the plurality of synchronous devices to each of which a selected clock delay value of 600 ps has been allocated. The cluster C3 contains the synchronous devices F1 and F2 to each of which a selected clock delay value of 600 ps has been allocated. The cluster C4 contains the driving device MB2 for driving the cluster C1, the driving device MB3 for driving the cluster C2, and the driving device MB4 for driving the cluster C3. The driving devices MB2 to MB4 correspond to a selected clock delay value of 300 ps. The driving devices MB2 to MB4, i.e., the cluster C4 is driven by the driving device MB1 corresponding to a selected clock delay value of 0 ps.

As also shown in FIG. 12(a), redundant wiring is used in the cluster C1 or C4 such that the cluster delay value is equal to the discrete clock delay value difference TUd (which is specifically 300 ps).

As shown in FIG. 12(b), on the other hand, each of the clusters C1 and C2 contains a plurality of synchronous devices to each of which a selected clock delay value of 600 ps has been allocated. The cluster C4 contains the synchronous devices F1 and F2 to each of which a selected clock delay value of 300 ps has been allocated, the driving device MB2 for driving the cluster C1, and the driving device MB3 for driving the cluster C2. The cluster C4 is driven by the driving device MB1 corresponding to a selected clock delay value of 0 ps.

From a comparison between FIGS. 12(a) and 12(b), it will be understood that the present variation can eliminate the cluster C3 corresponding to a selected clock delay value of 600 ps, i.e., the driving device MB4 and eliminate the redundant wiring in the cluster C4 by changing the selected clock delay value allocated to each of the synchronous devices F1 and F2 contained in the cluster C3 from 600 ps to 300 ps and inserting the synchronous devices F1 and F2 in the cluster C4 in the cluster changing step.

Although the variation of the fifth embodiment has moved the locations of the synchronous devices between the clusters in the clock circuit for which skew scheduling has been performed, the locations of the synchronous devices may also be moved between the clusters in a zero skew clock circuit.

Embodiment 6

A clock circuit and a method of designing the same according to a sixth embodiment of the present invention will be described with reference to the drawings.

Figure 13:
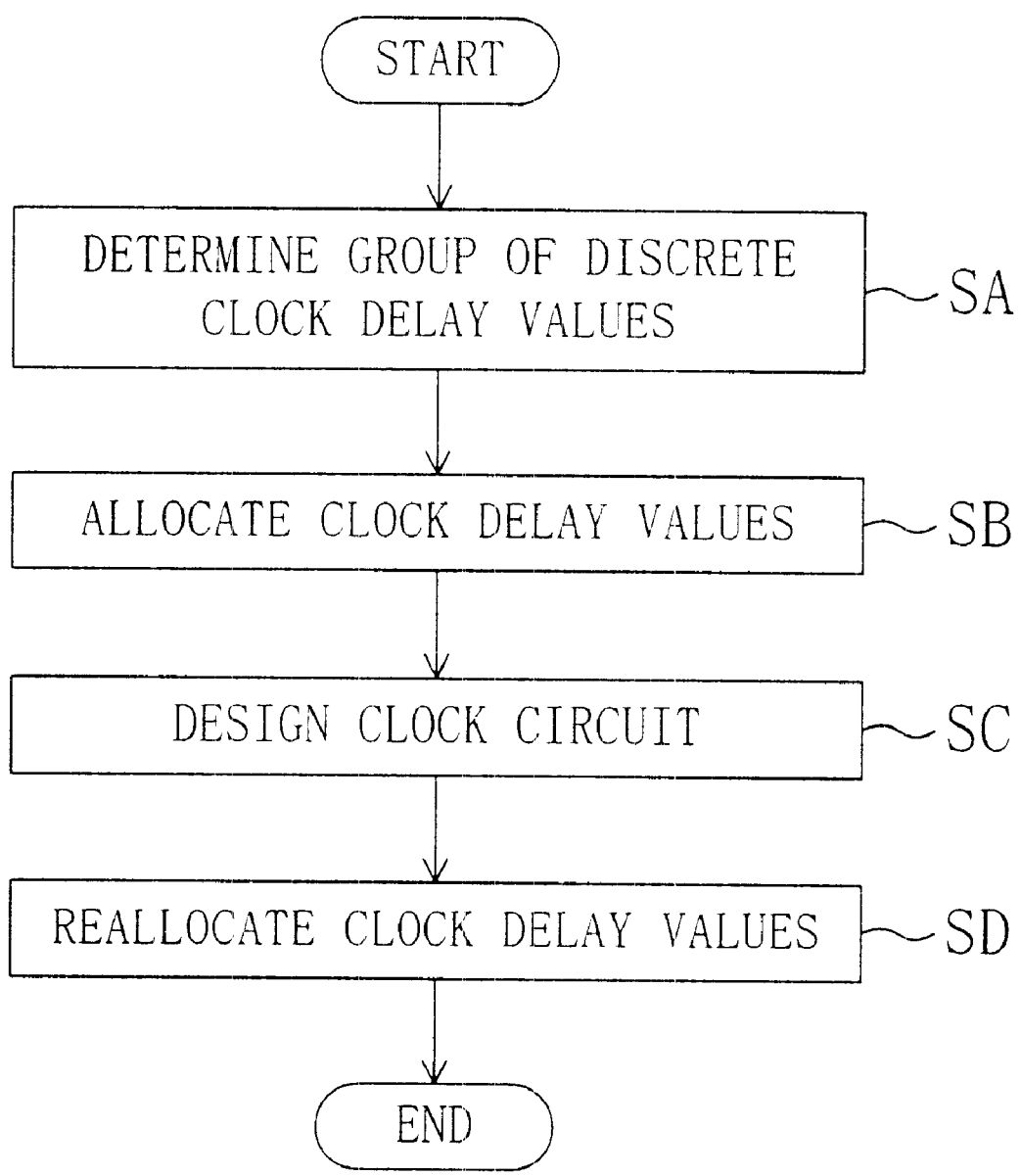
FIG. 13 is a flow chart illustrating the individual steps of a method of designing a clock circuit according to a sixth embodiment of the present invention.

The sixth embodiment is based on the method of designing a clock circuit according to the fourth embodiment and is different from the fourth embodiment in that, after Steps SC of the fourth embodiment (see FIGS. 1 and 7), the clock delay value is reallocated to each of the clusters FFG and a wiring connection within each of the clusters FFG is redetermined in Steps SD, as shown in the flow chart of FIG. 13.

Figure 14:
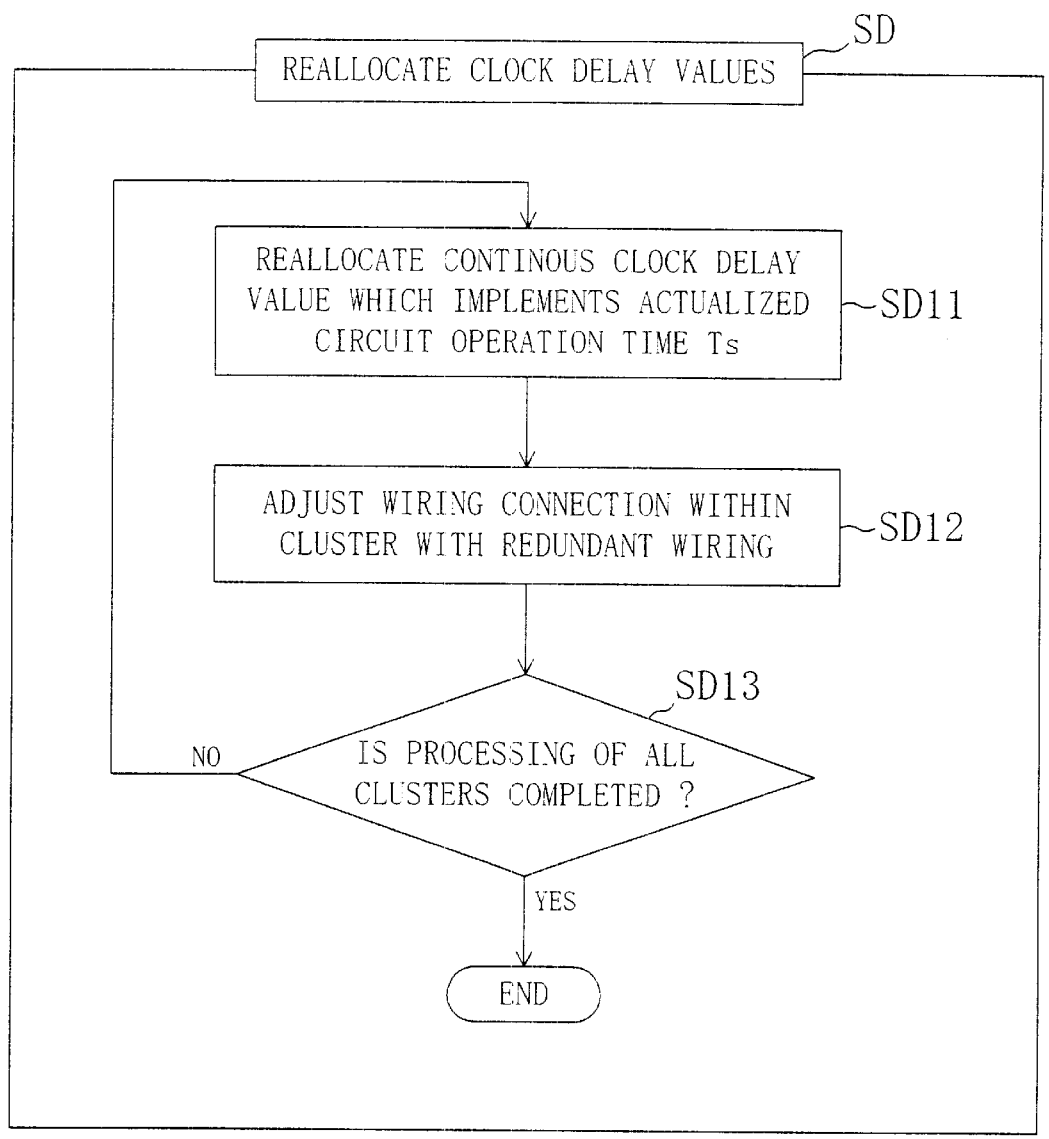
FIG. 14 is a flow chart illustrating the individual processes performed in Steps SD in the method of designing a clock circuit according to the sixth embodiment.

FIG. 14 is a flow chart showing the individual processes performed in Steps SD of the method of designing a clock circuit according to the sixth embodiment.

First, in Step SD11, a continuous clock delay value, which is one of the continuous values from a cluster minimum clock delay value to a cluster maximum clock delay value, is reallocated to a target cluster FFG (hereinafter referred to as a reallocation target cluster) such that an actualized circuit operation time Ts, which is a circuit operation time T implemented when the clock signal is supplied to each of the synchronous devices F1 to FM in accordance with the selected clock delay values (discrete clock delay values) allocated to the respective synchronous devices F1 to FM in Step SB (see FIG. 1), is implemented. The cluster minimum clock delay value is the clock delay value when a wiring connection in the reallocation target cluster is achieved with a minimum wiring length and the cluster maximum clock delay value is the selected clock delay value corresponding to the reallocation target cluster.

Since a wiring connection within each of the clusters FFG has been determined in Step SC by using redundant wiring such that the clock signal is supplied to each of the synchronous devices F1 to FM in accordance with the selected clock delay values, an arbitrary continuous clock delay value can be provided by adjusting the length of the redundant wiring.

The reallocation of the continuous clock delay value is performed such that the expressions (5) and (6) (see the first embodiment) are satisfied for the synchronous device contained in the reallocation target cluster and for the synchronous device contained in a lower-level cluster (cluster driven by the driving device contained in the reallocation target cluster) of the reallocation target cluster. When the circuit operation time T is the actualized circuit operation time Ts and s(u) or s(v) in the expression (5) or (6) is the cluster minimum clock delay value of the reallocation target cluster, if the expression (5) or (6) is not satisfied, a minimum required delay value is added to the cluster minimum clock delay value of the reallocation target cluster, such that the expressions (5) and (6) are satisfied. The result of the addition is used as the continuous clock delay value to be reallocated to the reallocation target cluster. In short, a minimum required delay value is added to s(v) when the expression (5) is not satisfied such that the result of the addition is used as the continuous clock _delay value to be reallocated to the reallocation target cluster. On the other hand, the minimum required delay value is added to s(u) when the expression (6) is not satisfied such that the result of the addition is used as the continuous clock delay value to be reallocated to the reallocation target cluster.

Since the actualized circuit operation time Ts is implemented when the continuous clock delay value allocated to each of the clusters FFG is equal to the cluster maximum clock delay value, the continuous clock delay value which implements the actualized circuit operation time Ts certainly exists in the range of the cluster minimum clock delay value to the cluster maximum clock delay value for each of the clusters FFG.

The process performed in Step SD11 will be described by using the case of the clock circuit shown in FIG. 15 as an example.

Figure 15:
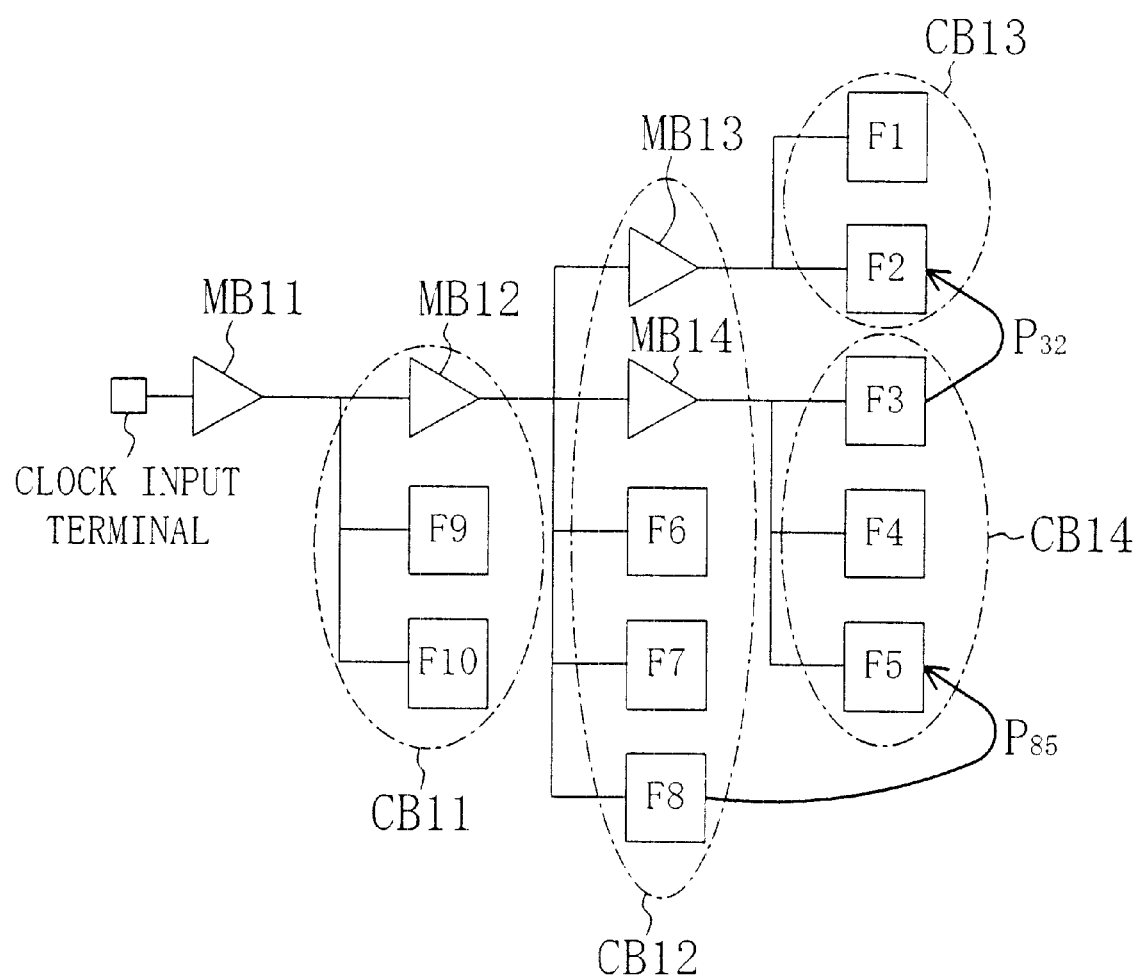
FIG. 15 shows a clock circuit for illustrating the individual processes performed in Steps SD in the method of designing a clock circuit according to the sixth embodiment.

As shown in FIG. 15, the synchronous devices F9 and F10 and the driving device MB12 each driven by the driving device MB11 constitute the cluster CB11, the synchronous devices F6, F7, and F8 and the driving devices MB13 and MB14 each driven by the driving device MB12 constitute the cluster CB12, the synchronous devices F1 and F2 each driven by the driving device MB13 constitute the cluster CB13, and the synchronous devices F3, F4, and F5 each driven by the driving device MB14 constitute the cluster CB14. The respective selected clock delay values allocated to the synchronous devices F1 to F5 are the same. The respective selected clock delay values allocated to the synchronous devices F6 to F8 are the same. The respective selected clock delay values allocated to the synchronous devices F9 and F10 are the same.

In the clock circuit shown in FIG. 15, if the cluster CB12 is selected as the reallocation target cluster, the synchronous devices contained in the cluster CB12 and the lower-level clusters of the cluster CB12, i.e., the clusters CB13 and CB14 are the synchronous devices F1 to F8. At this time, if the expression (5) is not satisfied for a signal propagation path P85 for transferring a signal from the synchronous device F8 to the synchronous device F5, the clock delay value (corresponding to s(v) of the expression (5)) in the synchronous device F5 is increased, specifically the length of a wire driven by the driving device MB14 is adjusted, whereby the expression (5) is satisfied for the signal propagation path P85. Since the reallocation of the continuous clock delay value is performed on a cluster basis, the continuous clock delay value which is equal to the continuous clock delay value allocated to the synchronous device F5 is allocated to each of the synchronous devices F3 and F4 in the cluster CB14 containing the synchronous device F5.

Next, in Step SD12, the wiring connection in the reallocation target cluster is redetermined such that the clock signal is supplied to the synchronous devices contained in the reallocation target cluster in accordance with the continuous clock delay value reallocated to the reallocation target cluster in Step SD11.

Specifically, the following expression (13') is derived by replacing TUd (discrete clock delay value difference) on the left side of the foregoing expression (13) with a continuous clock delay value difference SRD which is the difference between the continuous clock delay value reallocated to the reallocation target cluster in Step SD11 and the cluster maximum clock delay value corresponding to an upper-level cluster (cluster containing a driving device for driving the synchronous device contained in the reallocation target cluster) of the reallocation target cluster:

$$SRD = Tb + \Delta Tb \times Cb \tag{13'}$$

(where Tb is a specific delay of the driving device B, $\Delta Tb$ is a driving delay per unit capacitance, and Cb is a capacitance driven by the driving device).

A new capacitance Cb is determined by using the expression (13') and a wiring connection within the reallocation target cluster is adjusted by using redundant wiring such that the capacitance Cb determined is implemented.

Next, in Step SD13, it is determined whether or not each of the processes in Steps SD11 and SD12 has been performed with respect to all the clusters FFG. If each of the processes in Steps SD11 and SD12 has been performed with respect to all the clusters FFG, the whole process is completed. If not, each of the processes in Steps SD11 and SD12 is performed again with respect to a new reallocation target cluster.

The sixth embodiment reallocates the continuous clock delay values to all the clusters FFG and redetermines the wiring connection within each of the clusters FFG by performing, only once, each of the processes in Steps SD11 and SD12 with respect to each of the clusters FFG in decreasing order of the selected clock delay values corresponding to the respective clusters FFG. In the clock circuit shown in FIG. 15, e.g., each of the processes in Steps SD11 and SD12 is performed in the order of the cluster CB13 or CB14, the cluster CB12, and the cluster CB11.

If the respective cluster delay values (signal delay values when the total sum of the wiring capacitance and the respective input terminal capacitances of the synchronous devices in each of the clusters is driven by one driving device B) of the clusters CB13 and CB14 of the clock circuit shown in FIG. 15 are designated at Cd13 and Cd14, e.g., signal propagation between the synchronous devices contained in the respective clusters CB13 and CB14 encounters no problem provided that the cluster delay values CD13 and CD14 are the same. even if the cluster delay values CD13 and CD14 are not more than the discrete clock delay value difference TUd (Cd13=Cd14<TUd), as in a signal propagation path $P_{32}$ for transferring a signal from the synchronous device F3 to the synchronous device F2. This is because the synchronous device contained in the cluster CB13 (such as the synchronous device F2) and the synchronous device contained in the cluster CB14 (such as the synchronous device F3) have the same clock delay value since the respective selected clock delay values corresponding to the clusters CB13 and CB14 are the same and the respective cluster delay values (Cd13 and Cd14) corresponding to the clusters CB13 and CB14 are the same.

As a consequence, a problem occurs when the cluster delay value is adjusted equal to or smaller than the discrete clock delay value difference TUd only in the case of signal propagation between the synchronous devices to which different selected clock delay values are allocated, as in the signal propagation path P85 mentioned above. In other words, there are cases where the cluster delay values in all the clusters FFG need not be adjusted equal to the discrete clock delay value difference TUd depending on the circumstances.

As described above, the sixth embodiment achieves the following effect in addition to the effect achieved by the fourth embodiment.

In Steps SD after Steps SC of the sixth embodiment, the continuous clock delay value in the range of the cluster minimum clock delay value to the cluster maximum clock delay value is reallocated to each of the clusters FFG by using, as the minimum clock delay value, the clock delay value when the wiring connection within each of the clusters FFG is achieved with the minimum wiring length and using, as the cluster maximum clock delay value, the selected clock delay value corresponding to each of the clusters FFG and the wiring connection within each of the clusters FFG is redetermined such that the clock signal is supplied to the synchronous devices contained in each of the clusters FFG in accordance with the continuous clock delay value reallocated to each of the clusters FFG. This provides the wiring connection within each of the clusters FFG with the minimum wiring length except for the case where the actualized circuit operation time Ts is not implemented and prevents increased power consumption and increased layout area resulting from clock wiring by reducing unnecessary redundant wiring.

In the sixth embodiment, each of the processes in Steps SD is performed only once with respect to each of the clusters FFG in decreasing order of the selected clock delay values corresponding to the respective clusters FFG. This allows easy reallocation of the continuous clock delay value to each of the clusters FFG.

Although the sixth embodiment has reallocated the continuous clock delay value to each of the clusters FFG and redetermined the wiring connection within each of the clusters FFG in Steps SD after Steps SC, it is also possible to reallocate the continuous clock delay value to each of the clusters FFG and redetermines the wiring connection within each of the clusters FFG when the clock circuit is generated in Steps SC. Specifically, each of the processes in Steps SC1, SC2, and SC3 of Steps SC and each of the processes in Steps SD11 and SD12 of Steps SD can be performed with respect to the synchronous devices in decreasing order of the selected clock delay values thereof.

Variation 1 of Embodiment 6

A method of designing a clock circuit according to a first variation of the sixth embodiment of the present invention will be described with reference to the drawings.

The first variation of the sixth embodiment is different from the sixth embodiment in that, in contrast to the sixth embodiment which has performed the processes in Steps SD only once with respect to each of the clusters FFG in decreasing order of the selected clock delay values corresponding to the respective clusters FFG, the first variation of the sixth embodiment performs the processes in Steps SD at least once in an arbitrary order with respect to each of the clusters FFG.

Figure 16:
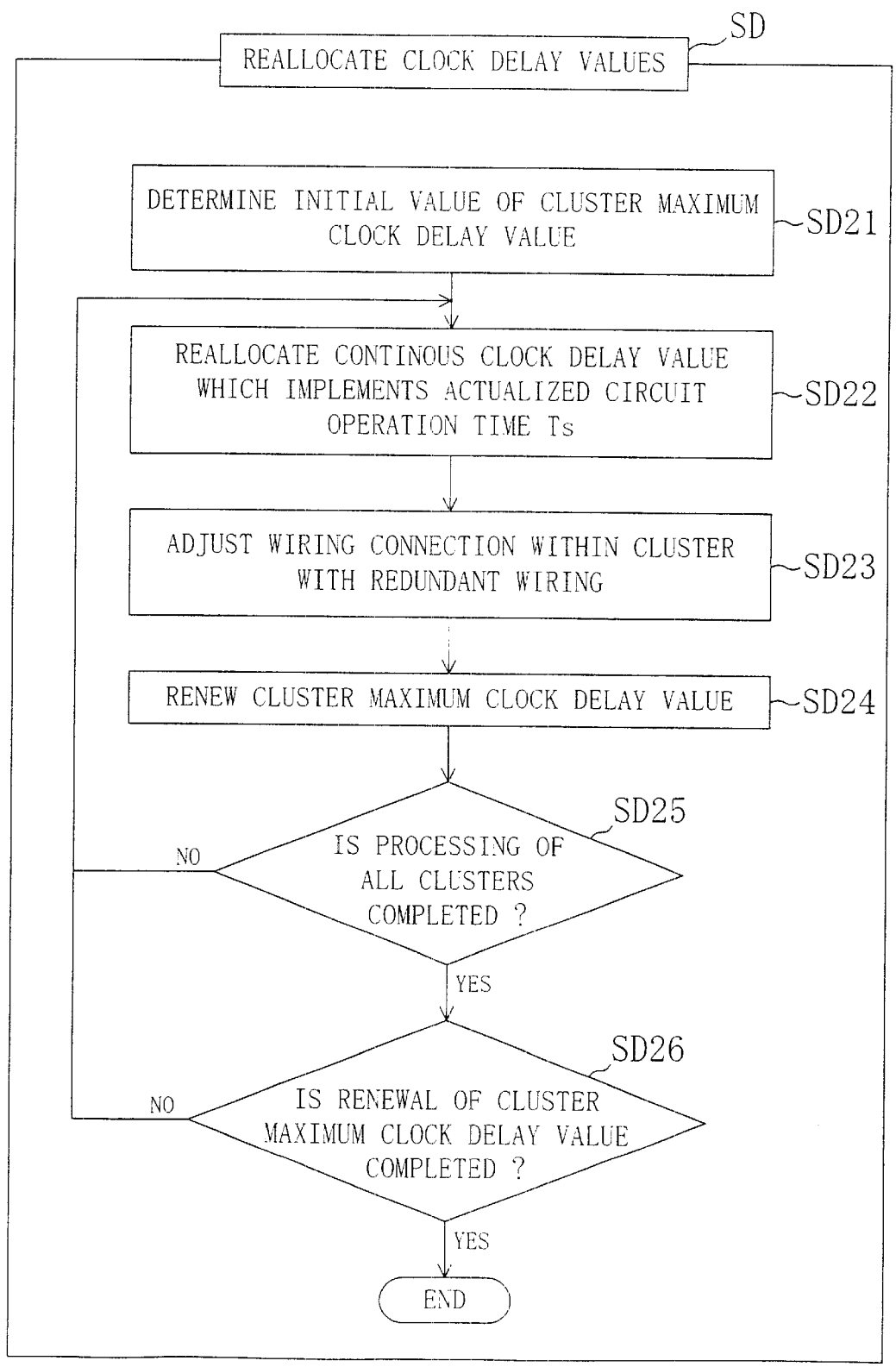
FIG. 16 is a flow chart illustrating the individual processes performed in Steps SD in a method of designing a clock circuit according to a first variation of the sixth embodiment of the present invention.

FIG. 16 is a flow chart showing the individual processes in Steps SD in the method of designing a clock circuit according to the first variation of the sixth embodiment.

First, in Steps SD21, the selected clock delay values corresponding to the individual clusters FFG are determined as the respective initial values of the cluster maximum clock delay values of the clusters FFG.

Next, in Step SD22 similarly to Step SD11 of the sixth embodiment, the continuous clock delay value which is one of the continuous values from the cluster minimum clock delay value (clock delay value when the wiring connection within each of the clusters is achieved with a minimum wiring length) to the cluster maximum clock delay value in Step SD22, is reallocated to the reallocation target cluster such that actualized circuit operation time Ts is implemented.

The process in Step SD22 will be described by using the case of the clock circuit shown in FIG. 15 as an example, similarly to the sixth embodiment.

If the cluster CB13 is selected as the reallocation target cluster in the clock circuit shown in FIG. 15, the synchronous devices contained in the cluster CB13 are the synchronous devices F1 and F2. If the expression (5) is not satisfied for the signal propagation path $P_{32}$ for transferring a signal from the synchronous device F3 to the synchronous device F2, the clock delay value (corresponding to s(v) in the (5)) in the synchronous device F2 is increased, specifically the length of a wire driven by the driving device MB13 is adjusted, whereby the expression (5) is satisfied for the signal propagation path $P_{32}$. Since the reallocation of the continuous clock delay value is performed on a cluster basis, the continuous clock delay value which is equal to the continuous clock delay value allocated to the synchronous device F2 is allocated to the synchronous device F1 in the cluster CB13 containing the synchronous device F2.

Next, the wiring connection within the reallocation target cluster is redetermined in Step SD23 such that the clock signal is supplied to the synchronous devices contained in the reallocation target cluster in accordance with the continuous clock delay value reallocated to the reallocation target cluster in Step SD22, similarly to Step SD12 of the sixth embodiment. Specifically, a new capacitance Cb is determined by using the expression (13') and the wiring connection within the reallocation target cluster is adjusted by using redundant wiring such that the capacitance Cb determined is implemented, similarly to the sixth embodiment.

Next, in Step SD24, the cluster maximum clock delay value corresponding to the reallocation target cluster is renewed with the continuous clock delay value reallocated to the reallocation target cluster in Step SD22.

Next, in Step SD25, it is determined whether or not each of the processes in Steps SD22 to SD24 has been performed with respect to all the clusters FFG. If each of the processes in Steps SD22 to SD24 has been performed with respect to all the clusters FFG, the process in Step SD26 is performed. If not, each of the processes in Steps SD22 to SD24 is performed again with respect to a new reallocation target cluster.

Next, in Step SD26, it is determined whether or not the cluster maximum clock delay value has been renewed with a new value in Step SD24. If the cluster maximum clock delay value has not been renewed with a new value, the whole process is completed. If the cluster maximum clock delay value has been renewed with a new value, each of the processes in Steps SD22 to SD24 is performed again with respect to a new reallocation target cluster.

Thus, the first variation of the sixth embodiment reallocates the continuous clock delay values to all the clusters FFG and redetermines the wiring connection within each of the clusters FFG by performing, at least once, each of the processes in Steps SD22 to SD24 with respect to each of the clusters FFG in an arbitrary order till the cluster maximum clock delay value of each of the clusters FFG is no more renewed with a new value.

The individual processes in Steps SD22 to SD24 will be described by using the case of the clock circuit shown in FIG. 17 as an example.

Figure 17:
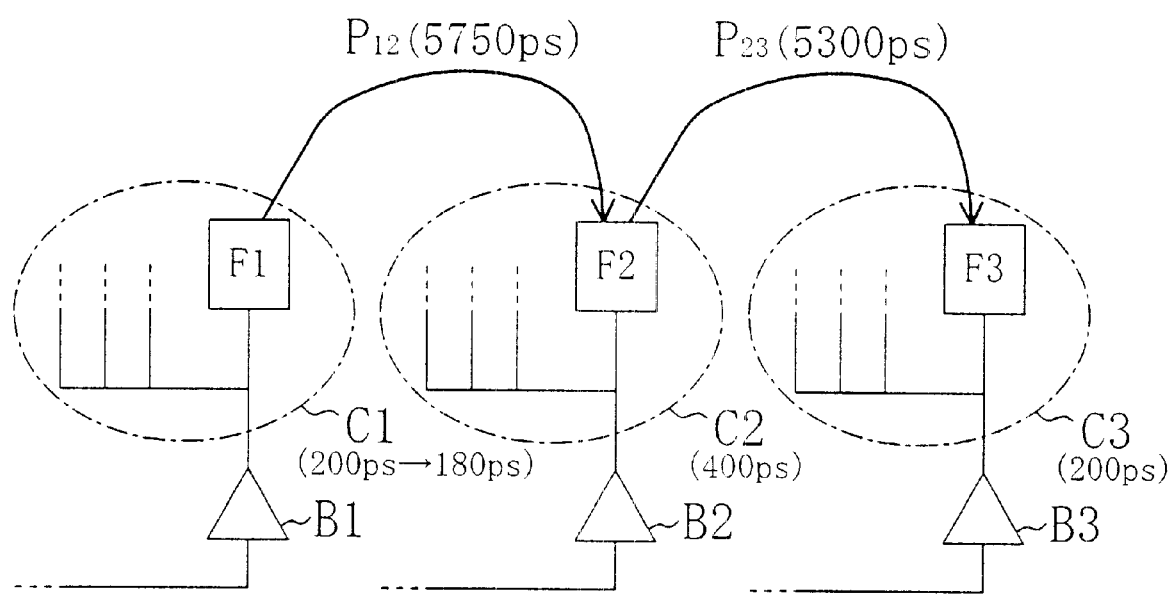
FIG. 17 shows a clock circuit for illustrating the individual processes performed in Steps SD in the method of designing a clock circuit according to the first variation of the sixth embodiment.

As shown in FIG. 17, the cluster C1 is driven by the driving device B1 and contains the synchronous device F1, the cluster C2 is driven by the driving device B2 and contains the synchronous device F2, and the cluster C3 is driven by the driving device B3 and contains the synchronous device F3. The maximum signal delay value in the signal propagation path $P_{12}$ for transferring a signal from the synchronous device F1 to the synchronous device F2 is 5750 ps. The maximum signal delay value in the signal propagation path $P_{23}$ for transferring a signal from the synchronous device F2 to the synchronous device F3 is 5300 ps.

It is assumed here that the selected clock delay values (discrete clock delay values) of 200 ps, 400 ps, and 200 ps have been allocated to the synchronous devices F1 to F3 in Steps SB. At this time, the selected clock delay values corresponding to the clusters C1 to C3 are 200 ps, 400 ps, and 200 ps, respectively, and the actualized circuit operation time Ts is 5550 ps.

A consideration will be given to the case where each of the processes in Steps SD22 to SD24 has been performed with respect to the cluster C1 with the result that the cluster maximum delay value of the cluster C1 has been renewed from 200 ps to 180 ps and the process in Step SD22 is performed with respect to the cluster C2.

If the cluster minimum clock delay value of the cluster C2 is 350 ps, 350−200+5300=5450<5550 is satisfied for the signal propagation path $P_{23}$ so that the expression (5) is satisfied. For the signal propagation path $P_{12}$, on the other hand, 180−350+5750=5580>5550 is satisfied so that the expression (5) is not satisfied. However, if 30 ps as the difference between 5580 ps and 5550 ps is added to 350 ps as the cluster minimum clock delay value of the cluster C2 and 380 ps as the result of the addition is used as the continuous clock delay value in the expression (5), the expression (5) is also satisfied for the signal propagation path $P_{12}$ (in this case also, the expression (5) is satisfied for the signal propagation path $P_{23}$). That is, a load capacitance corresponding to 20 ps, i.e., redundant wiring is reduced in the cluster C2 by reallocating, to the cluster C2, the continuous clock delay value 380 ps which is smaller than the selected clock delay value 400 ps by 20 ps.

As described above, the first variation of the sixth embodiment achieves the following effect in addition to the effect of the fourth embodiment.

In Steps SD after Steps SC of the first variation of the sixth embodiment, the continuous clock delay value in the range of the cluster minimum clock delay value to the cluster maximum clock delay value is reallocated to each of the clusters FFG by using, as the cluster minimum clock delay value, the clock delay value when the wiring connection within each of the clusters FFG is achieved with the minimum wiring length and using, as the cluster maximum clock delay value, the selected clock delay value corresponding to each of the clusters FFG such that the actualized circuit operation time Ts is satisfied and the wiring connection within each of the clusters FFG is redetermined such that the clock signal is supplied to the synchronous devices contained in each of the clusters FFG in accordance with the continuous clock delay value reallocated to each of the clusters FFG. This provides the wiring connection within each of the clusters FFG with the minimum wiring length except for the case where the actualized circuit operation time Ts is not satisfied and prevents increased power consumption and increased layout area resulting from clock wiring by reducing unnecessary redundant wiring.

In the first variation of the sixth embodiment, Steps SD include the step of setting the selected clock delay value corresponding to each of the clusters FFG as the initial value of the cluster maximum clock delay value and renewing the cluster maximum clock delay value with the continuous clock delay value reallocated to each of the clusters FFG and each of the processes in Steps SD is performed at least once with respect to each of the clusters FFG till the cluster maximum clock delay value is no more renewed with a new value. This achieves a further reduction in the continuous clock delay value reallocated to each of the clusters FFG and a further reduction in unnecessary redundant wiring.

Variation 2 of Embodiment 6

A method of designing a clock circuit according to a second variation of the sixth embodiment of the present invention will be described with reference to the drawings.

The second variation of the sixth embodiment is different from the sixth embodiment (or the first variation of the sixth embodiment) in that, in contrast to the sixth embodiment which has reallocated the continuous clock delay value to each of the clusters FFG such that the actualized circuit operation time Ts is implemented, the second variation of the sixth embodiment reallocates the continuous clock delay value to each of the clusters FFG such that the circuit operation time T (see the expression (5)) is minimized.

Figure 18:
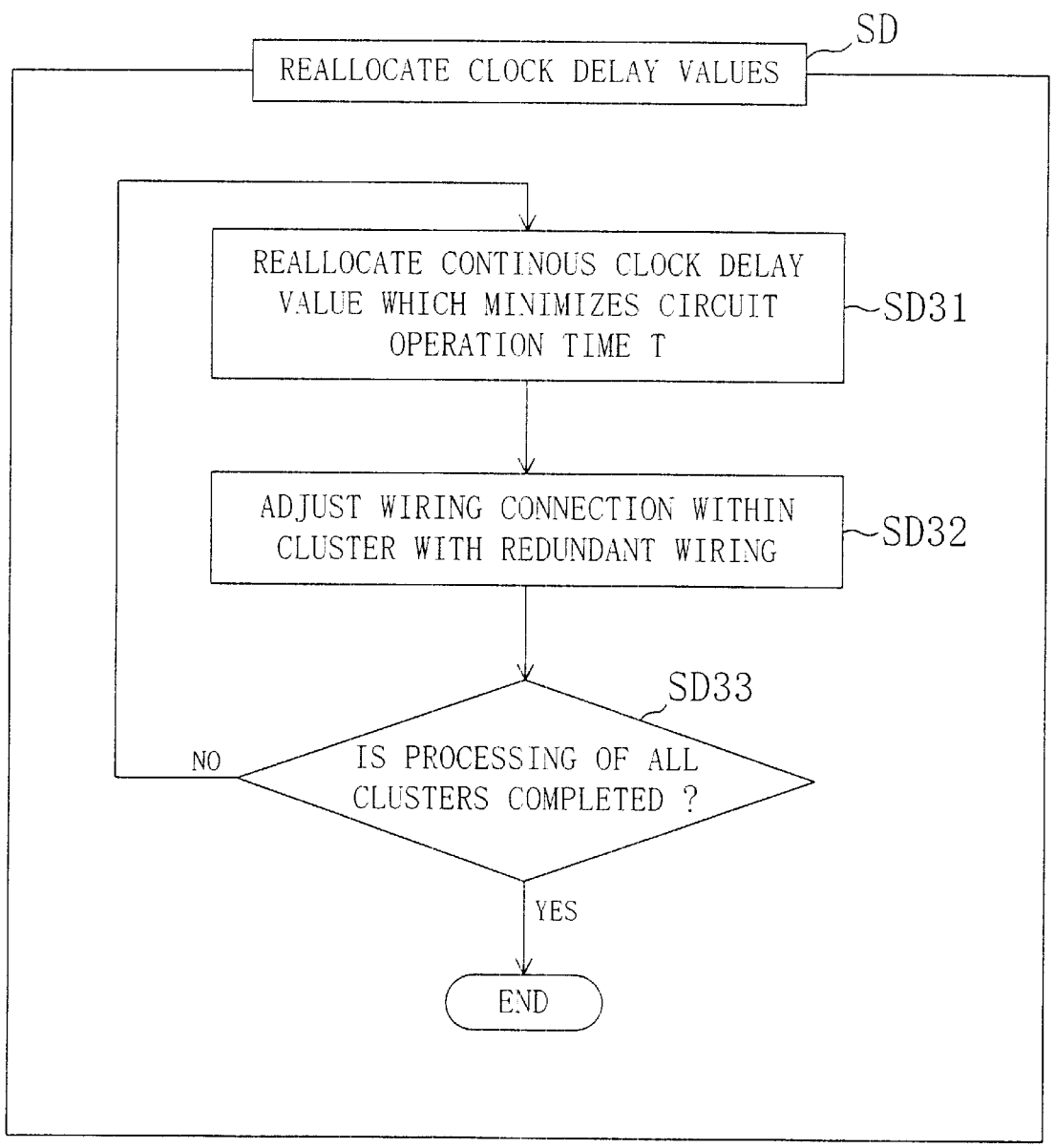
FIG. 18 is a flow chart illustrating the individual processes performed in Steps SD in a method of designing a clock circuit according to a second variation of the sixth embodiment of the present invention.

FIG. 18 is a flow chart showing the individual processes in Steps SD in the method of designing a clock circuit according to the second variation of the sixth embodiment.

First, in Step SD31, a continuous clock delay value, which is one of the continuous values from the cluster minimum clock delay value to the cluster maximum clock delay value, is reallocated to the target cluster FFG (hereinafter referred to as the reallocation target cluster) such that the circuit operation time T is minimized. The cluster minimum clock delay value is the clock delay value when the wiring connection in the reallocation target cluster is achieved with a minimum wiring length and the cluster maximum clock delay value is the selected clock delay value corresponding to the reallocation target cluster.

Since the wiring connection within each of the clusters FFG has been determined in Steps SC (see FIGS. 1 and 7) by using redundant wiring such that the clock signal is supplied to each of the synchronous devices F1 to FM in accordance with the selected clock delay value, an arbitrary continuous clock delay value can be implemented by adjusting the length of the redundant wiring.

The reallocation of the continuous clock delay value is performed such that the expressions (5) and (6) (see the first embodiment) are satisfied for the synchronous devices contained in the reallocation target cluster and that the right side of the expression (5), i.e., the circuit operation time T is minimized. In contrast to the sixth embodiment which has increased s(u) or s(v) from the cluster minimum clock delay value toward the cluster maximum clock delay value by using the circuit operation time T as the actualized circuit operation time Ts till the expressions (5) and (6) are satisfied, the second variation of the sixth embodiment increases s(u) or s(v) from the cluster minimum clock delay value toward the cluster maximum clock delay value till the circuit operation time T becomes smaller than at least the actualized circuit operation time Ts.

Since the actualized circuit operation time Ts is satisfied when the continuous clock delay value allocated to each of the clusters FFG is equal to the cluster maximum clock delay value, the continuous clock delay value which adjusts the circuit operation time T equal to or smaller than the actualized circuit operation time Ts certainly exists in the range of the cluster minimum clock delay value to the cluster maximum clock delay value for each of the clusters FFG.

Next, in Step SD32 similarly to Step SD12 of the sixth embodiment, the wiring connection within the reallocation target cluster is redetermined such that the clock signal is supplied to the synchronous devices contained in the reallocation target cluster in accordance with the continuous clock delay value reallocated to the reallocation target cluster in Step SD31. Specifically, a new capacitance Cb is determined by using the expression (13') and the wiring connection within the reallocation target cluster is adjusted by using redundant wiring such that the capacitance Cb determined is implemented.

Next, in Step SD33, it is determined in Step SD33 whether or not the individual processes in Steps SD31 and SD32 have been performed with respect to all the clusters FFG. If the individual processes in Steps SD31 and SD32 have been performed with respect to all the clusters FFG, the whole process is completed. If not, the individual processes in Steps SD31 and SD32 are performed again with respect to a new reallocation target cluster.

Thus, the second variation of the sixth embodiment reallocates the continuous clock delay value to each of the clusters FFG and redetermines the wiring connection within each of the clusters FFG by performing, at least once, each of the processes in Steps SD31 and SD32 with respect to each of the clusters FFG in an arbitrary order.

The individual processes in Steps SD31 and SD32 will be described by using the case of the clock circuit shown in FIG. 17 as an example, similarly to the first variation of the sixth embodiment.

A consideration will be given to the case where each of the processes in Steps SD31 and SD32 has been performed with respect to the cluster C1 with the result that a continuous delay value of 180 ps has been reallocated to the cluster C1 and the process in Step SD31 is performed with respect to the cluster C2.

FIG. 19 shows the circuit operation times T determined to satisfy the expression (5) for the signal propagation path $P_{12}$ (between the synchronous devices F1 and F2) or for the signal propagation path $P_{23}$ (between the synchronous devices F2 and F3) when 350 ps (cluster minimum clock delay value), 380 ps, and 400 ps (cluster maximum clock delay value) are reallocated as the continuous clock delay value to the cluster C2.

For each of the continuous clock delay values reallocated to the cluster C2, the larger one of the circuit operation times T shown in FIG. 19 becomes the circuit operation time of the whole circuit. That is, the circuit operation time T of the whole circuit is 5580 ps when 350 ps has been reallocated as the continuous clock delay value to the cluster C2. The circuit operation time T of the whole circuit is 5550 ps when 380 ps has been reallocated as the continuous clock delay value to the cluster C2. The circuit operation time T of the whole circuit is 5530 ps when 400 ps has been reallocated as the continuous clock delay time T to the cluster C2. Accordingly, the circuit operation time T of the whole circuit is minimized (5530 ps) when 400 ps is reallocated as the continuous clock delay value to the cluster C2.

In Step SD31, therefore, 400 ps (cluster maximum clock delay value) is reallocated as the continuous clock delay value to the cluster C2. This implements a circuit operation time T of 5530 ps which is smaller than the actualized circuit operation time Ts of 5550 ps (see the first variation of the sixth embodiment) corresponding to the clock circuit shown in FIG. 17.

As described above, the second variation of the sixth embodiment achieves the following effect in addition to the effect achieved by the fourth embodiment. In Steps SD after Steps SC of the second variation of the sixth embodiment, the continuous clock delay value in the range of the cluster minimum clock delay value to the cluster maximum clock delay value is reallocated to each of the clusters FFG by using, as the cluster minimum clock delay value, the clock delay value when the wiring connection within each of the clusters FFG is achieved with the minimum wiring length and using, as the cluster maximum clock delay value, the selected clock delay value corresponding to each of the clusters FFG such that the circuit operation time T is minimized and the wiring connection within each of the clusters FFG is redetermined such that the clock signal is supplied to the synchronous devices contained in each of the clusters FFG in accordance with the continuous clock delay value reallocated to each of the clusters FFG. This adjusts the circuit operation time T smaller than the actualized circuit operation time Ts and closer to the system limit operation time Trim, so that the performance of the circuit (LSI) is improved.

Embodiment 7

A clock circuit according to a seventh embodiment of the present invention will be described with reference to the drawings.

The seventh embodiment is based on the clock circuit according to the first embodiment.

That is, in the clock circuit according to the seventh embodiment, the clock signal is supplied to each of the plurality of synchronous devices in accordance with the selected clock delay values selected from the group GS of discrete clock delay values and allocated to the individual synchronous devices, as shown in FIG. 2(b).

The clock circuit according to the seventh embodiment is characterized in that it is composed of a plurality of driving devices B0 of the same type and that the total sum of the wiring capacitance and the respective input terminal capacitances of the synchronous devices driven by each of the driving device B0 (hereinafter referred to as a total charge capacitance) is set to an equal specific value within a 20% error.

Figure 20:
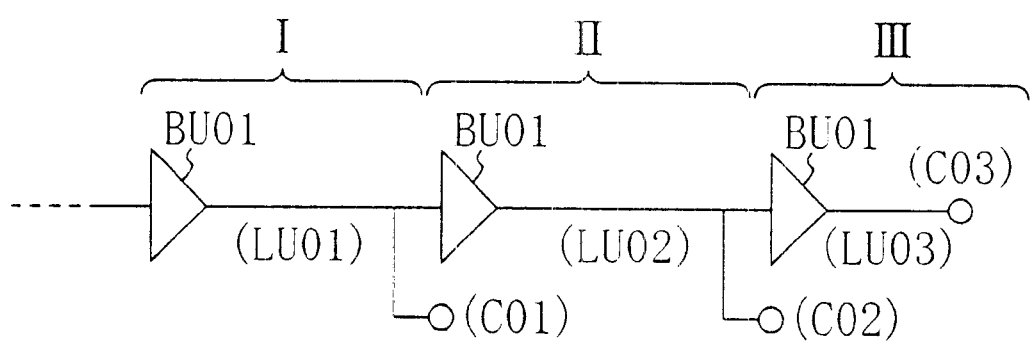
FIG. 20 shows an example of a clock circuit according to a seventh embodiment of the present invention.

FIG. 20 shows an example of the clock circuit according to the seventh embodiment.

As shown in FIG. 20, each of the stages (stages I, II, and III) of a clock signal supply path consists of the same type of driving devices BU01. Each of the total sum (a first total charge capacitance) of a wiring capacitance LU01 and the respective input terminal capacitances C01 of the synchronous devices driven by the driving device BU01 in the stage I, the total sum (a second total charge capacitance) of a wiring capacitance LU02 and the respective input terminal capacitances C02 of the synchronous devices driven by the driving device BU01 in the stage II, and the total sum (a third total charge capacitance) of a wiring capacitance LU03 and the respective input terminal capacitances C03 of the synchronous devices driven by the driving device BU01 in the stage III has been adjusted to an equal specified value within a 20% error.

According to the seventh embodiment, the clock circuit is composed of the plurality of driving devices B0 of the same type and the total charge capacitance driven by each of the driving devices B0 has been adjusted to an equal specified value within a 20% error. This reduces variations in signal delays produced in the individual stages of the clock signal supply path and thereby suppresses skew errors resulting from process variations or temperature variations.

The reason for considering an error of about 20% in adjusting the total charge capacitance to a specified value in each of the stages of the clock signal supply path is that a variation error of the wiring capacitance resulting from process variations or the like is about 5% at the maximum, a variation error of the input terminal capacitances of the synchronous devices resulting from process variations or the like is about 5% at the maximum, a variation error during RC extraction is about 5% at the maximum, and an error during signal delay calculation based on the approximation by Elmore or the like is about 5% at the maximum.

A specific description will be given to the effect of the seventh embodiment.

A signal delay T in one of the stages of the clock signal supply path is given by the following expression (15) by using, e.g., the approximation by Elmore(W. C. Elmore, "The Transient Response of Damped Linear Networks with Particular Regard to Wideband Amplifiers", Journal of Applied Physics, Vol.19, 1948, pp.55–63):

$$T = T0 + Tc \times Cc + Rw \times Cw \tag{15}$$

In the expression (15), T0 is an intrinsic delay of the driving device, Tc is a driving delay per unit capacitance, Cc is the total charge capacitance driven by the driving device, Rw is the resistance of a longest wire, and Cw is the wiring capacitance of the longest wire.

Similarly, a signal delay T' in another of the stages of the clock signal supply path is given by the following expression (16):

$$T' = T0' + Tc' \times Cc' + Rw' \times Cw' \tag{16}$$

In the expression (16), T0' is an intrinsic delay of the driving device, Tc' is a driving delay per unit capacitance, Cc' is the total charge capacitance driven by the driving device, Rw' is the resistance of a longest wire, and Cw' is the wiring capacitance of the longest wire.

Even if T given by the expression (15) and T' given by the expression (16) have been adjusted equal at a room temperature, the specific delays of the driving devices, the driving delays per unit capacitance, the total charge capacitances driven by the driving devices, and the resistances and wiring capacitances of the longest wires also vary with process variations, temperature characteristic variations, or the like, so that a difference is produced between T given by the expression (15) and T' given by the expression (16).

If a variation in each of the specific delays of the driving devices, the driving delays per unit capacitance, the total charge capacitances driven by the driving devices, and the resistances and wiring capacitances of the longest wires is proportional to the magnitude of each of the amounts, the expressions (15) and (16) can be varied into the following expressions (17) and (18):

$$T+\Delta T = T0 \times (1+\Delta tr) + Tc \times (1+\Delta tr) \times Cc \times (1+\Delta c) + Rw \times (1+\Delta r) \times Cw \times (1+\Delta c) \quad (17)$$

$$T'+\Delta T' = T0' \times (1+\Delta tr) + Tc' \times (1+\Delta tr) \times Cc' \times (1+\Delta c) + Rw' \times (1+\Delta r) \times Cw' \times (1+\Delta c) \quad (18).$$

In the expressions (17) and (18), each of $\Delta T$ and $\Delta T'$ is an amount of variation in signal delay in each of the stages of the clock signal supply path, $\Delta tr$ is a coefficient of variation for the specific delay of the driving device and for driving delay per unit capacitance, $\Delta c$ is a coefficient of variation for the total charge capacitance driven by the driving device and for the wiring capacitance of the longest wire, and $\Delta r$ is a coefficient of variation for the resistance of the longest wire.

By comparing the expressions (17) and (18) with the expressions (15) and (16), respectively, the following expressions (19) and (20) are obtained approximately.

$$\Delta T = T0 \times \Delta tr + Tc \times \Delta tr \times Cc + Tc \times Cc \times \Delta c + Rw \times \Delta r \times Cw + Rw \times Cw \times \Delta c \quad (19)$$

$$\Delta T' = T0' \times \Delta tr + Tc' \times \Delta tr \times Cc' + Tc' \times Cc' \times \Delta c + Rw' \times \Delta r \times Cw' + Rw' \times Cw' \times \Delta c \quad (20).$$

If T given by the expression (15) and T' given by the expression (16) have been adjusted equal at a room temperature (when T=T' is satisfied), therefore, a variation given by the following expression (21) occurs in signal delays produced in the individual stages of the clock signal supply path with process variations, temperature characteristic variations, or the like:

$$\Delta T - \Delta T' = \Delta tr \times \{(T0+Tc \times Cc)-(T0+Tc' \times Cc')\}$$
$$+\Delta c \times \{(Tc \times Cc+Rw \times Cw)-(Tc' \times Cc'+Rw' \times Cw')\}$$
$$+\Delta r \times (Rw \times Cw-Rw' \times Cw')-\Delta tr \times \{(T0+Tc \times Cc)-(T0'+Tc' \times Cc')\}$$
$$+\Delta c \times \{(T-T0)-(T'-T0')\}+\Delta r \times (Rw \times Cw-Rw' \times Cw')$$
$$=\Delta tr \times \{(T0+Tc \times Cc)-(T0'+Tc' \times Cc')\}+\Delta c \times (T0'-T0)+\Delta r \times (Rw \times Cw-Rw' \times Cw') \quad (21).$$

When the expression (21) is derived, the relationships shown in the expressions (15) and (16) are used.

As shown in the expression (21), if the coefficients $\Delta tr$, $\Delta c$, and $\Delta r$ are assumed to change independently, variations in signal delay produced in the individual stages of the clock signal supply path can be minimized when each of the coefficients $\Delta tr$, $\Delta c$, and $\Delta r$ is 0.

Since the seventh embodiment has used the driving devices of the same type in each of the stages of the clock signal supply path, T0=T0' is satisfied so that variations resulting from the coefficient $\Delta c$ are minimized. Since the seventh embodiment has used the driving devices of the same type in each of the stages of the clock signal supply path, Tc=Tc' is satisfied. In addition, since the total charge capacitance driven by the driving device in each of the stages of the clock signal supply path has been adjusted to a nearly equal specified value, variations resulting from the coefficient $\Delta tr$ are minimized.

As for variations resulting from $\Delta r$, the effective accuracy of signal delay is 100 ps, while the magnitude of Rw×Cw or Rw'×Cw' when a wiring length is 500 µm for a wire normally used in, e.g., a 0.25-µm process is about 20 ps.

By limiting the maximum wiring length in each of the stages of the clock signal supply path, therefore, variations in signal delay produced in the individual stages of the clock signal supply path can be suppressed with an accuracy of 20% or less.

Embodiment 8

A clock circuit according to an eighth embodiment of the present invention will be described with reference to the drawings.

The eighth embodiment is based on the clock circuit according to the first embodiment.

That is, in the clock circuit according to the eighth embodiment, the clock signal is supplied to each of the plurality of synchronous devices in accordance with the selected clock delay value selected from the group GS of discrete clock delay values and allocated to each of the synchronous devices, as shown in FIG. 2(b).

The clock circuit according to the eighth embodiment is assumed to have a plurality of clock signal delay paths for supplying the clock signal from a clock source to the individual synchronous devices.

Figure 25:
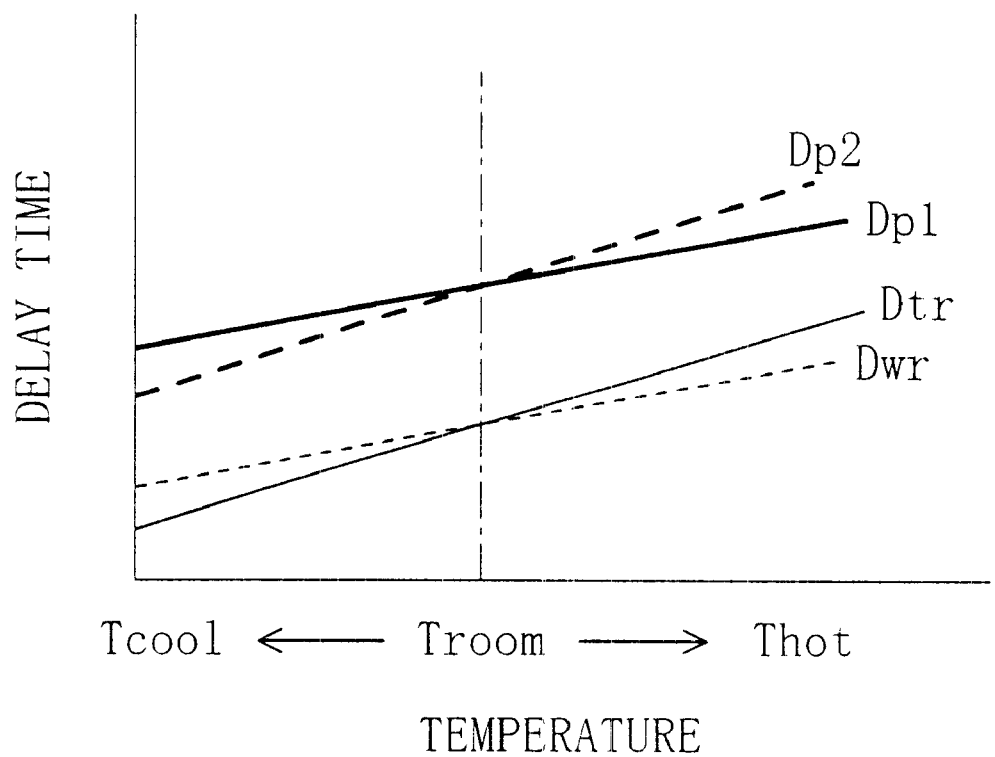
FIG. 25 shows variations in device delay, wiring delay, and signal delay resulting from temperature variations.
Figure 26A:
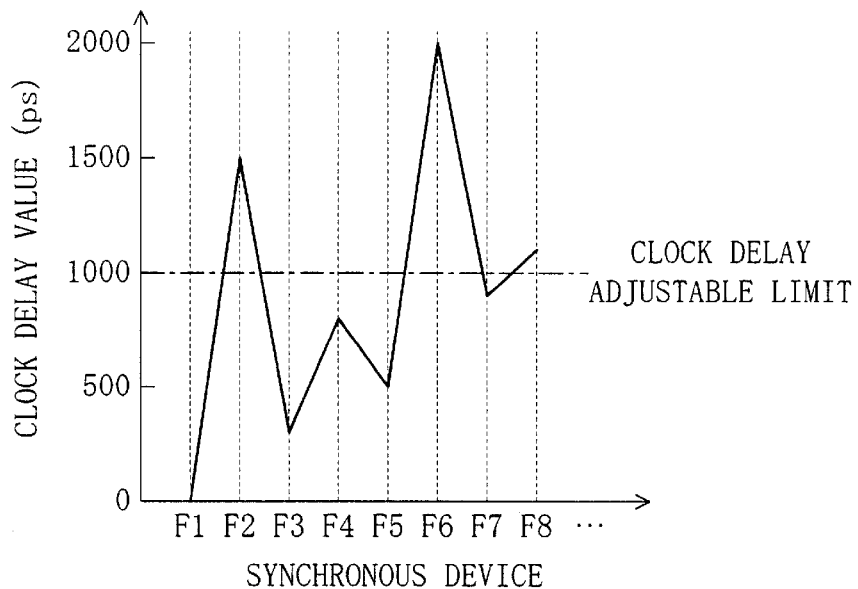
FIG. 26(a) shows an example of selected clock delay values allocated to eight synchronous devices by using a conventional method of designing a clock circuit and FIG. 26(b) shows an example of a clock circuit for supplying a clock signal to each of the eight synchronous devices in accordance with the selected clock delay values shown in FIG. 26(a)
Figure 26B:
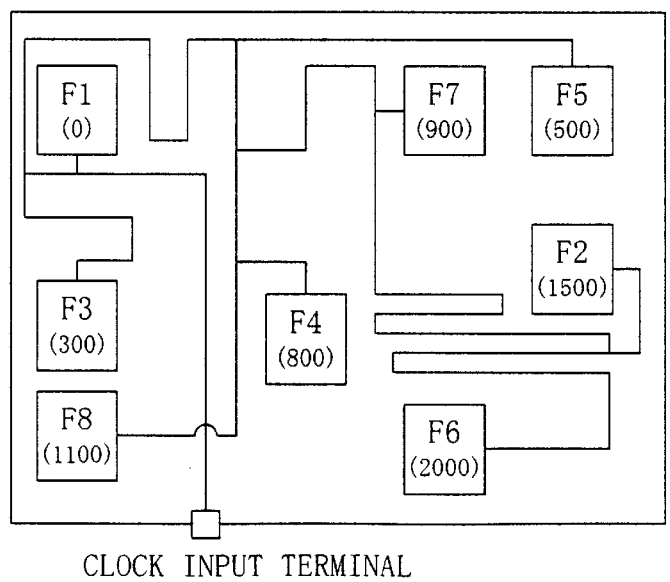
Figure 27:
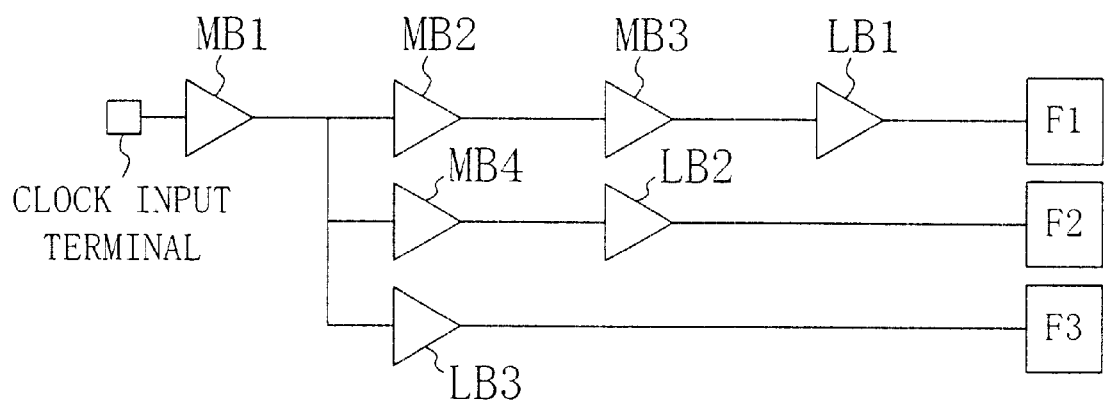
FIG. 27 shows an example of a conventional clock circuit.

If a transistor delay Dtr and a wiring delay Dwr at the temperature of T=0° C. in each of the clock signal supply paths are designated at Dtr0 and Dwr0 and the respective rates of change (proportional constants) of the transistor delay Dtr and the wiring delay Dwr to the temperature T are designated at g and f, respectively, the transistor delay Dtr and the wiring delay Dwr are given by the following expressions (22) and (23), respectively (see FIG. 25):

$$Dtr = g \times T + Dtr0 \quad (22)$$

$$Dwr = f \times T + Dwr0 \quad (23).$$

The values of g and f vary with process variations or the like and g≠f is satisfied since the proportional constants g and f have different temperature dependencies.

As shown in the expressions (5) and (6), operation should be compensated in a circuit (LSI) using a clock delay in consideration of the maximum value (dmax) and minimum value (dmin) of a signal delay between the synchronous devices.

To compensate the circuit operation for a temperature change, the eighth embodiment sets the ratio between the amount of wiring delay and the amount of transistor delay in each of the clock signal supply paths to an equal specified value within a 20% error based on the arrangement of the synchronous devices or on timing constraints.

Specifically, the amount of wiring delay (specifically, the third term Rw×Cw on the right side of the expression (15)) and the amount of transistor delay (specifically, the sum (T0+Tc×Cc) of the first and second terms on the right side of the expression (15)) are adjusted by adjusting the specific delay (T0) of the driving device or a driving delay (Tc) per unit capacitance, the total charge capacitance (Cc) driven by the driving device, or the resistance (Rw) or wiring capacitance (Cw) of a longest wire in the foregoing expression (15) (see the seventh embodiment), whereby the ratio between the amount of wiring delay and the amount of transistor delay in each of the clock signal supply paths is set to an equal specified value within a 20% error.

Figure 21:
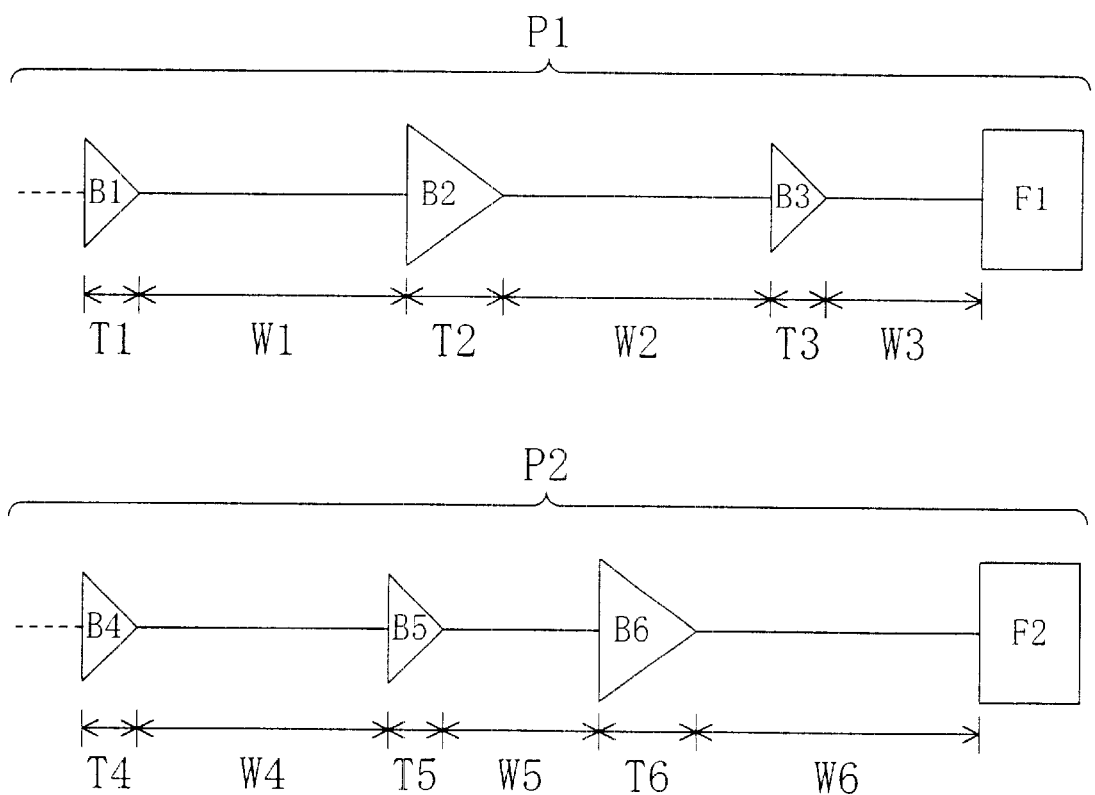
FIG. 21 shows an example of a clock circuit according to an eighth embodiment of the present invention.

FIG. 21 shows the respective amounts of wiring delay and the respective amounts of transistor delay in the two clock signal supply paths.

As shown in FIG. 21, the first clock signal supply path P1 is composed of the synchronous device F1, the driving device (specifically, the transistor) B1, the driving device B2, and the driving device B3. The respective amounts of transistor delay in the driving devices B1, B2, and B3 are designated at T1, T2, and T3. The respective amounts of wiring delay between the driving devices B1 and B2, between the driving devices B2 and B3, and between the driving device B3 and the synchronous device F1 are designated at W1, W2, and W3.

As also shown in FIG. 21, the second clock signal supply path P2 is composed of the synchronous device F2 and the driving devices B4, B5, and B6. The respective amounts of transistor delay in the driving devices B4, B5, and B6 are designated at T4, T5, and T6. The respective amounts of wiring delay between the driving devices B4 and B5, between the driving devices B5 and B6, and between the driving device B6 and the synchronous device F2 are designated at W4, W5, and W6.

Each of the ratio between the amount of transistor delay (Ti+T2+T3) and the amount of wiring delay (W1+W2+W3) in the first clock signal supply path P1 and the ratio between the amount of transistor delay (T4+T5+T6) and the amount of wiring delay (W4+W5+W6) in the second clock signal supply path P2 has been set to an equal specified value within a 20% error.

Since the eighth embodiment has set the ratio between the amount of wiring delay and the amount of transistor delay in each of the clock signal supply paths to a nearly equal specified value, the clock delays when the clock signal is supplied to each of the synchronous devices change in response to a temperature change, which allows compensation of the circuit operation over a wide temperature range.

Variation of Embodiment 8

A clock circuit according to a variation of the eighth embodiment of the present invention will be described with reference to the drawings.

The variation of the eighth embodiment is different from the eighth embodiment in that, in contrast to the eighth embodiment which has set the ratio between the amount of wiring delay and the amount of transistor delay in each of the clock signal supply paths to an equal specified value within a 20% error, the variation of the eighth embodiment uses, as the equal specified value, the ratio between the amount of wiring delay and the amount of transistor delay in the critical path (maximum delay path) of a circuit (LSI).

Specifically, the ratio between the amount of wiring delay and the amount of transistor delay in the critical path is predetermined as, e. g., $\lambda/\gamma$. Then, the amount of wiring delay (specifically, the third term on the right side of the expression (15)) and the amount of transistor delay (specifically, the sum of the first and second terms on the right side of the expression (15)) in each of the clock signal supply paths are adjusted by adjusting the specific delay (T0) of the driving device, driving delay (Tc) per unit capacitance, the total charge capacitance (Cc) driven by the driving device, the resistance (Rw) of the longest wire, or wiring capacitance (Cw) of the longest wire in the expression (15), whereby the ratio between the amount of wiring delay and the amount of transistor delay in each of the clock signal supply paths is set to the same value as $\lambda/\gamma$ within a 20% error.

Figure 22:
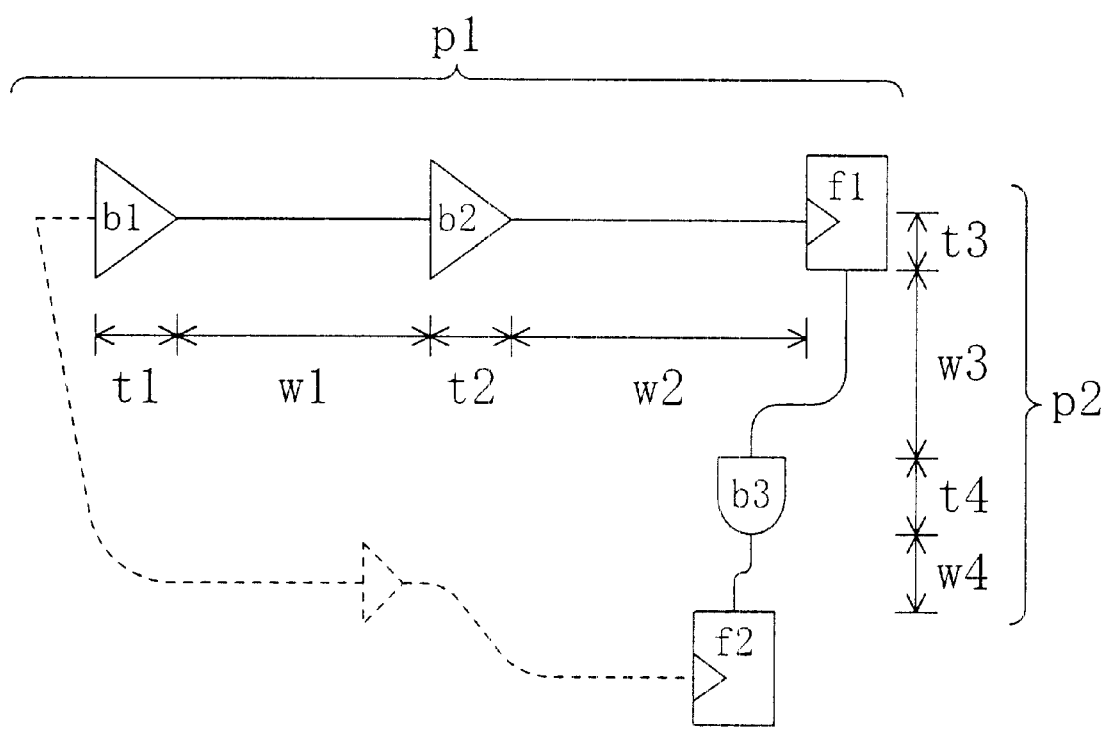
FIG. 22 shows an example of a clock circuit according to a variation of the eighth embodiment of the present invention.

FIG. 22 shows the respective amounts of wiring delay and the respective amounts of transistor delay in the clock signal supply path and in the critical path.

As shown in FIG. 22, a clock signal supply path p1 is composed of a synchronous device f1 and driving devices (specifically, a transistor) b1 and b2. The respective amounts of transistor delay in the driving devices b1 and b2 are t1 and t2. The respective amounts of wiring delay between the driving devices b1 and b2 and between the driving device b2 and the synchronous device f1 are w1 and w2.

As also shown in FIG. 22, a critical path p2 is composed of the synchronous devices f1 and f2 and a driving device f3. The respective amounts of transistor delay in the synchronous device f1 and the driving device b3 are t3 and t4. The respective amounts of wiring delay between the synchronous device f1 and the driving device b3 and between the driving device b3 and the synchronous device f2 are w3 and w4.

The ratio between the amount of transistor delay (t1+t2) and the amount of wiring delay (w1+w2) in the clock signal supply path p1 has been set to the same value as the ratio between the amount of transistor delay (t3+t4) and the amount of wiring delay (w3+w4) in the critical path p2 within a 20% error.

Since the variation of the eighth embodiment has set the ratio between the amount of wiring delay and the amount of transistor delay in each of the clock signal supply paths to a nearly equal value to the ratio between the amount of transistor delay and the amount of wiring delay in the critical path, the clock delays when the clock signal is supplied to each of the synchronous devices change in association with the signal delay in the critical path in response to the temperature change, so that the circuit operation is surely compensated over a wide temperature range.

Embodiment 9

A clock circuit and a method of designing the same according to a ninth embodiment of the present invention will be described with reference to the drawings.

A design target in the ninth embodiment is a clock circuit for supplying a clock signal to M (M is a natural number) synchronous devices F1 to FM (group FG of synchronous devices) in a circuit (LSI).

Figure 23:
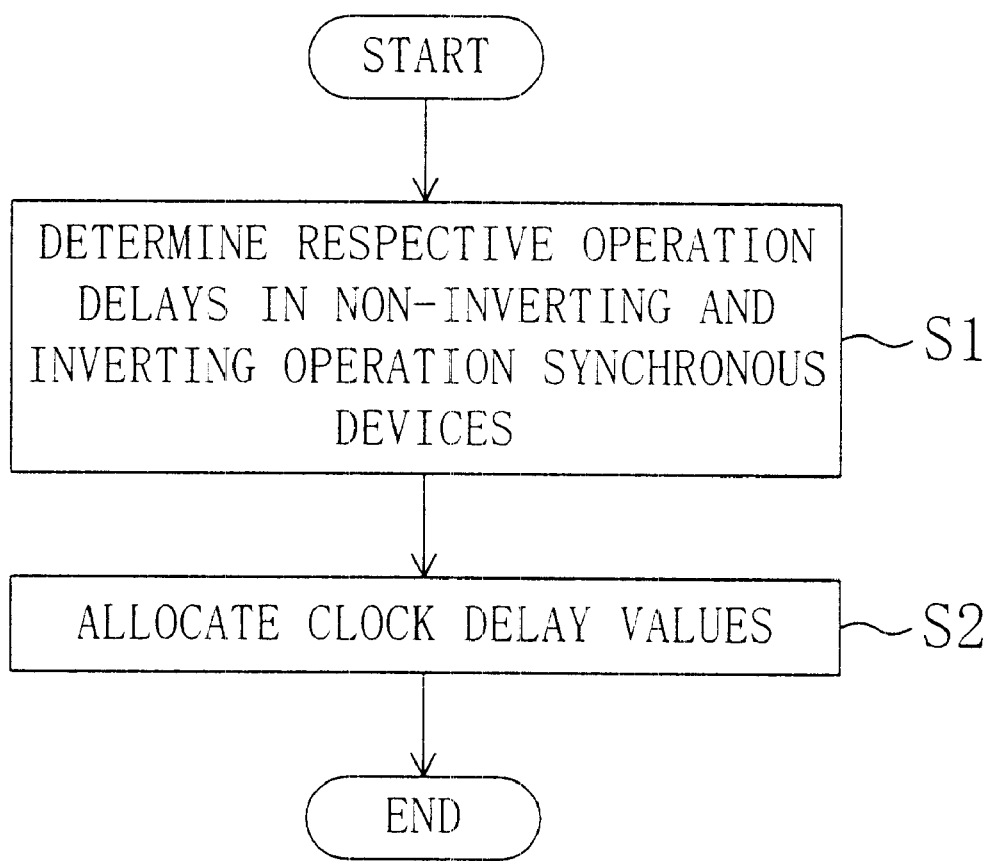
FIG. 23 is a flow chart illustrating the individual steps of a method of designing a clock circuit according to a ninth embodiment of the present invention.

In the ninth embodiment, it is assumed that, before the initiation of the process shown in FIG. 23, the design of functional specifications including timing constraints has been completed and the arrangement of the synchronous devices F1 to FM has been determined or estimated.

FIG. 23 is a flow chart showing the individual steps of a method of designing a clock circuit according to the ninth embodiment.

First, in Step S1, respective operation response times (operation delay after the inputting of a clock signal) of two types of synchronous devices prepared in a standard cell or the like, i.e., a non-inverting operation synchronous device FP which operates on the rising edge of the clock signal and an inverting operation synchronous device FN which operates on the falling edge of the clock signal, i.e., a first operation response time DFP and a second operation response time DFN are determined.

If an operation objective period of the circuit, i.e., a clock objective period is designated at Tt, DEP=0 and DFN=Tt/2, e.g., can be satisfied.

Next, in Step S2, either of the first and second operation response times DFP and DFN is allocated as a clock delay value to each of the synchronous devices F1 to FM such that the operation of the circuit is ensured, specifically the expressions (5) and (6) are satisfied.

If the clock delay values can be allocated to satisfy the expressions (5) and (6), that one of the synchronous devices F1 to FM to which the first operation response time DFP has been allocated as the clock delay value is replaced with the non-inverting operation synchronous device FP and that one of the synchronous devices F1 to FM to which the second operation response time DFN has been allocated as the clock delay value is replaced with the inverting operation synchronous device FN.

In the case of further improving circuit performance, the clock objective period Tt, i.e., the second operation response time DFN is reduced appropriately till the allocation of the clock delay values consistent with the expressions (5) and (6) becomes impossible.

To complement a clock delay, it has conventionally performed with respect to part of a circuit to replace some of the non-inverting operation synchronous devices FP with the inverting operation synchronous devices FN. In this case, however, an extremely small clock delay has been adjusted as the complementation of clock inverted inputting by combining the inverting operation synchronous device FN with a signal inverting device and the property of clock inverse inputting of the inverting operation synchronous device FN has not been used.

By contrast, since the ninth embodiment has disposed, in the entire circuit, the inverting operation synchronous devices FN as synchronous devices each having a delay corresponding to half the value of the clock objective period Tt, the clock delay can be adjusted over a wide range.

Figure 24A:
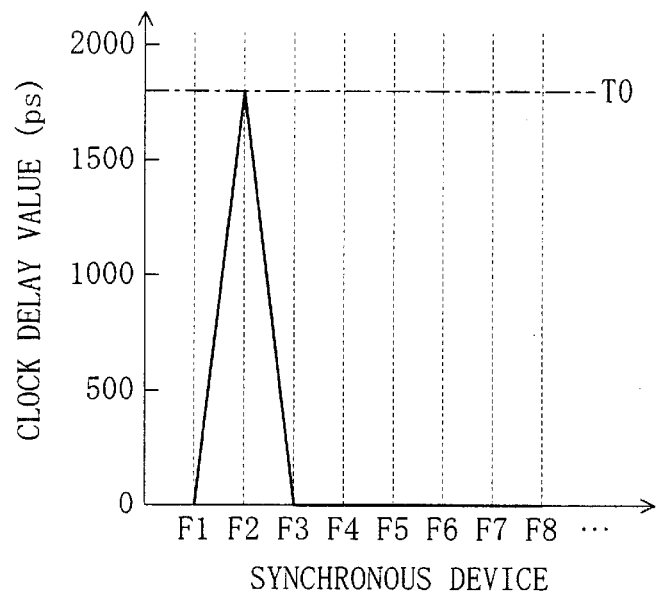
FIG. 24(a) shows an example of selected clock delay values allocated to eight synchronous devices by using the method of designing a clock circuit according to the ninth embodiment and FIG. 24(b) shows an example of a clock circuit for supplying a clock signal to each of the eight synchronous devices in accordance with the selected clock delay values shown in FIG. 24(a)
Figure 24B:
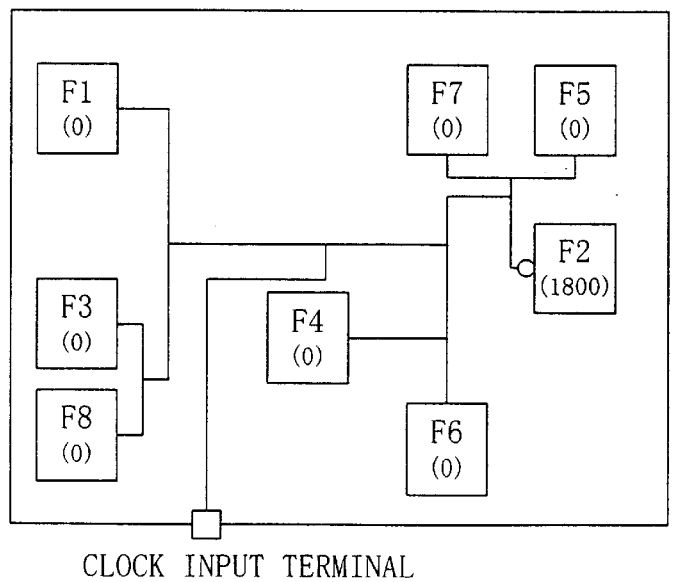

FIG. 24(a) shows an example of the clock delay values allocated to the eight synchronous devices F1 to F8 in Step S2. FIG. 24(b) shows an example of a clock circuit for supplying a clock signal to the synchronous devices F1 to F8 in accordance with the clock delay values shown in FIG. 24(a). It is assumed that, in each of FIGS. 24(a) and (b), the first operation response time DFP and the second operation response time DFN have been set to 0 and T0 (1800 ps), respectively.

As shown in FIG. 24(a), the first operation response time DFP (0 ps) has been allocated as the clock delay value to each of the synchronous devices except for the synchronous device F2, while the second operation response time DFN (1800 ps) has been allocated as the clock delay value to the synchronous device F2. As shown in FIG. 24(b), therefore, the synchronous devices other than the synchronous device F2 have been replaced with the non-inverting operation synchronous devices FP, while the synchronous device F2 has been replaced with the inverting operation synchronous device FN.

Thus, according to the ninth embodiment, the first operation response time DFP and the second operation response time DFN are set to the non-inverting operation synchronous device FP and the inverting operation synchronous device FN, respectively. Then, either of the first and second operation response times DFP and DFN is allocated as the clock delay value to each of the synchronous devices F1 to FM. Thereafter, each of the synchronous devices to which the first operation response time DFP has been allocated is replaced with the non-inverting operation synchronous device FP, while each of the synchronous devices to which the second operation response time DFN has been allocated is replaced with the inverting operation synchronous device FN. Since the clock delay values allocated to the individual synchronous devices F1 to FM are selected from the first and second operation response times DFP and DFN, the range in which the clock delay values are searched for is limited, so that skew scheduling is performed efficiently. Since the clock circuit is generated by replacing the synchronous devices to which the first operation response time DFP or the second operation response time DFN has been allocated with the positive or inverting operation synchronous devices FP or FN, the clock circuit which implements the result of skew scheduling can be generated positively without adjusting a delay in driving device and wiring capacitance, i.e., without changing the wiring connection in the clock circuit or the like. By changing the setting of the first and second operation response times DFP and DFN, circuit performance can be improved easily.

What is claimed is:

1. A method of designing a clock circuit for supplying a clock signal to each of a plurality of synchronous devices in an integrated circuit, the method comprising:

a discrete clock determining step of determining a group of discrete clock delay values composed of a finite number of discrete values to be allocated as respective clock delay values to the plurality of synchronous devices based on an arrangement of the synchronous devices or on timing constraints;

a clock allocating step of allocating, as a selected clock delay value, the clock delay value selected from the group of discrete clock delay values to each of the plurality of synchronous devices, while ensuring an operation of the integrated circuit; and a clock circuit designing step of designing the clock circuit for supplying the clock signal to each of the plurality of synchronous devices in accordance with the selected clock delay value.

2. The method of claim 1, wherein the group of discrete clock delay values is composed of integral multiples of a basic clock delay unit time determined based on the arrangement of the plurality of synchronous devices or on the timing constraints.

3. The method of claim 2, wherein the basic clock delay unit time is a signal delay value produced when a driving device used in the clock circuit drives a specified capacitance, the specified capacitance being determined based on a total charge capacitance which is a total sum of a wiring capacitance when the plurality of synchronous devices are connected to each other with a shortest wiring length based on the arrangement of the synchronous devices and respective input terminal capacitances of the synchronous devices or on the timing constraints.

4. The method of claim 1, wherein the discrete clock determining step includes the step of:

calculating maximum and minimum values of implementable clock delay values as a maximum clock delay value and a minimum clock delay value based on the number of driving devices used in the clock circuit or on an area of the integrated circuit and determining the group of discrete clock delay values within a range from the minimum clock delay value to the maximum clock delay value.

5. The method of claim 1, further comprising, prior to the discrete clock determining step, the step of:

calculating a shortest operation period for the integrated circuit, wherein the discrete clock determining step includes the step of:

calculating maximum and minimum values of the clock delay values which can implement the shortest operation period as a maximum clock delay value and a minimum clock delay value and determining the group of discrete clock delay values within a range from the minimum clock delay value to the maximum clock delay value.

6. The method of claim 1, further comprising, prior to the clock allocating step, the step of:

determining a clock delay objective value which is an <objective value of the clock delay value to be allocated to each of the plurality of synchronous devices, wherein the clock allocating step includes the step of:

minimizing an evaluation function value determined based on a difference between the clock delay value selected from the group of discrete clock delay values and allocated to each of the synchronous devices and the clock delay objective value and on an operation time of the integrated circuit.

7. The method of claim 6, wherein the clock delay objective value is a constant common to each of the plurality of synchronous devices.

8. The method of claim 1, further comprising, prior to the clock allocating step, the step of:

determining, for each of the plurality of synchronous devices, the synchronous device adjacent thereto based on the arrangement of the synchronous devices, wherein the clock allocating step includes the step of:
minimizing an evaluation function value determined based on a difference between the clock delay value selected from the group of discrete clock delay values and allocated to each of the plurality of synchronous devices and the clock delay value selected from the group of discrete clock delay values and allocated to the adjacent synchronous device thereof and on an operation time of the integrated circuit.

9. The method of claim 1, further comprising, prior to the clock allocating step, the step of:

determining, for each of the plurality of synchronous devices, the synchronous device adjacent thereto based on the arrangement of the synchronous devices, wherein the clock allocating step includes the step of:
minimizing an evaluation function value determined based on a ratio of a difference between the clock delay value selected from the group of discrete clock delay values and allocated to each of the plurality of synchronous devices and the clock delay value selected from the group of discrete clock delay values and allocated to the adjacent synchronous device thereof to a distance between each of the synchronous devices and the adjacent synchronous device thereof and on an operation time of the integrated circuit.

10. The method of claim 1, further comprising, prior to the clock allocating step, the step of:

determining, for each of the plurality of synchronous devices, the synchronous device adjacent thereto based on the arrangement of the synchronous devices and determining a power source line connected to each of the synchronous devices based on power source line data, wherein the clock allocating step includes the step of:

minimizing an evaluation function value determined based on an operation time of the integrated circuit and on a function value which assumes a specified value other than zero at the time when the power source line connected to each of the plurality of synchronous devices is coincident with the power source line connected to the adjacent synchronous device thereof and the clock delay value selected from the group of discrete clock delay values and allocated to each of the synchronous devices is the same as the clock delay value selected from the group of discrete clock delay values and allocated to the adjacent synchronous device thereof and assumes zero at all other times.

11. The method of claim 10, wherein the adjacent synchronous device is determined among those of the plurality of synchronous devices which are positioned at a specified distance or farther away from a basic power source line based on the power source line data.

12. The method of claim 1, wherein the clock circuit designing step includes:

a cluster forming step of forming at least one or more clusters each composed of those of the plurality of synchronous devices to which the same selected clock delay value has been allocated in the clock allocating step such that a signal delay value when the synchronous devices contained in each of the clusters are connected to each other with a minimum wiring length based on the arrangement of the synchronous devices and when the cluster is driven by one driving device is not more than a discrete clock delay value difference which is a difference between one of the selected clock delay values corresponding to the cluster and the other of the selected clock delay values smaller than and closest to the one of the selected clock delay values; and a driving device placing step of placing one driving device in each of the clusters and determining a wiring connection between an output terminal of the driving device and an input terminal of each of the synchronous devices contained in the cluster in which the driving device has been placed such that a signal delay value when the cluster is driven by the driving device is equal to the discrete clock delay value difference.

13. The method of claim 12, wherein the cluster forming step includes the step of:

determining the number of clusters to be formed by using a total sum of a wiring capacitance when the synchronous devices to which the same selected clock delay value has been allocated are connected to each other with a minimum wiring length based on the arrangement of the plurality of synchronous devices and respective input terminal capacitance of the synchronous devices to which the same selected clock delay value has been allocated.

14. The method of claim 12, wherein the driving device placing step includes the step of:

placing the same type of driving devices in the individual clusters.

15. The method of claim 12, wherein the clock circuit designing step further includes, after the driving device placing step, the step of:

adjusting a location of the driving device such that the driving device is closer to, of the synchronous devices to which the other of the selected clock delay values has been allocated, that one closest to the driving device.

16. The method of claim 12, wherein the clock circuit designing step further includes, between the cluster forming step and the driving device placing step:

a cluster changing step of reallocating, if an operation of the integrated circuit is ensured, the selected clock delay value corresponding to the one of the clusters formed in the cluster forming step to the synchronous device to which the selected clock delay value is smaller than the selected clock delay value corresponding to the one of the clusters has been allocated and inserting, in the one of the clusters, the synchronous device to which the selected clock delay value has been reallocated.

17. The method of claim 16, wherein the cluster changing step includes the step of:

reallocating the selected clock delay value corresponding to the one of the clusters to, of the plurality of synchronous devices, that one which is located adjacent the synchronous device contained in the one of the clusters and to which the smaller selected clock delay value has been allocated.

18. The method of claim 16, wherein the clock circuit designing step includes, between the cluster changing step and the driving device placing step, the step of:

allocating the clock delay value selected from the group of discrete clock delay values to an unclustered one of the synchronous devices to which the smaller selected clock delay value has been allocated, while ensuring the operation of the integrated circuit.

19. The method of claim 12, further comprising, after the clock circuit designing step:

a cluster changing step of reallocating, if an operation of the integrated circuit is ensured, the selected clock delay value corresponding to one of the clusters formed in the cluster forming step to the synchronous device contained in another of the clusters formed in the cluster forming step and inserting, in the one of the clusters, the synchronous device to which the selected clock delay value has been reallocated.

20. The method of claim 12, further comprising, after the clock circuit designing step:

a clock reallocating step of reallocating, to each of the clusters, a continuous clock delay value which is one of continuous values from a cluster minimum clock delay value to a cluster maximum clock delay value by using, as the cluster minimum clock delay value, the clock delay value when the wiring connection within each of the clusters is achieved with the minimum wiring length and using, as the cluster maximum clock delay value, the selected clock delay value corresponding to each of the clusters so as to implement an actualized circuit operation time which is an operation time of the integrated circuit implemented when the clock signal is supplied to each of the plurality of synchronous devices in accordance with the selected clock delay value and redetermining the wiring connection within each of the clusters such that the clock signal is supplied to the synchronous device contained in each of the clusters in accordance with the continuous clock delay value reallocated to each of the clusters.

21. The method of claim 20, wherein the clock reallocating step is performed once with respect to each of the clusters in decreasing order of the selected clock delay values corresponding to the respective clusters.

22. The method of claim 20, wherein the clock reallocating step includes the step of:

setting the selected clock delay value corresponding to each of the clusters as an initial value of the cluster maximum clock delay value and renewing the cluster maximum delay value with the continuous clock delay value reallocated to each of the clusters, the step being performed at least once with respect to each of the clusters until the cluster maximum clock delay value is no more renewed with a new value.

23. The method of claim 12, further comprising, after the clock circuit designing step:

a clock reallocating step of reallocating, to each of the clusters, a continuous clock delay value which is one of continuous values from a cluster minimum clock delay value to a cluster maximum clock delay value by using, as the cluster minimum clock delay value, the clock delay value when the wiring connection within each of the clusters is achieved with the minimum wiring length and using, as the cluster maximum clock delay value, the selected clock delay value corresponding to each of the clusters so as to minimize an operation time of the integrated circuit and redetermining the wiring connection within each of the clusters such that the clock signal is supplied to the synchronous device contained in each of the clusters in accordance with the continuous clock delay value reallocated to each of the clusters.

24. A method of designing a clock circuit for supplying a clock signal to each of a plurality of synchronous devices in an integrated circuit, the method comprising:

a first step of determining, for a non-inverting operation synchronous device which operates on a rising edge of the clock signal, a first operation response time between inputting of the clock signal and the operation of the non-inverting operation synchronous device and determining, for an inverting operation synchronous device which operates on a falling edge of the clock signal, a second operation response time between the inputting of the clock signal and the operation of the inverting operation synchronous device; and a second step of allocating, as a clock delay value, either of the first and second operation response times to each of the plurality of synchronous devices, while ensuring an operation of the integrated circuit, and replacing that one of the plurality of synchronous devices to which the first operation response time has been allocated as the clock delay value with the non-inverting operation synchronous device, while replacing that one of the plurality of synchronous devices to which the second operation response time has been allocated as the clock delay value with the inverting operation synchronous device.

25. A clock circuit for supplying a clock signal to each of a plurality of synchronous devices in an integrated circuit, wherein the clock signal is supplied to each of the plurality of synchronous devices in accordance with a selected clock delay value which is a clock delay value allocated to each of the synchronous devices, while an operation of the integrated circuit is ensured, the selected clock delay value being selected from a group of discrete clock delay values composed of a finite number of discrete values to be allocated as the respective clock delay values to the plurality of synchronous devices.

26. The clock circuit of claim 25, wherein at least one or more clusters are formed from the plurality of the synchronous devices, each of the clusters being composed of the synchronous devices to which the same selected clock delay value has been allocated, one driving device is placed in each of the clusters, and a wiring connection between an output terminal of the driving device and an input terminal of each of the synchronous devices contained in the cluster in which the driving device has been placed is determined such that a signal delay value when the cluster is driven by the driving device is equal to a discrete clock delay value difference which is a difference between one of the selected clock delay values corresponding to the cluster and the other of the selected clock delay values being smaller than and closest to the one of the selected clock delay values.

27. The clock circuit of claim 26, wherein the same type of driving devices are placed in the individual clusters.

28. The clock circuit of claim 25, wherein the clock circuit is composed of a plurality of driving devices of the same type and a total charge capacitance which is a total sum of respective wiring capacitances and respective input terminal capacitances of the synchronous devices driven by each of the plurality of driving devices is adjusted to an equal specified value within a 20% error.

29. The clock circuit of claim 25, wherein the clock circuit has a plurality of clock signal supply path for supplying the clock signal from a clock source to each of the plurality of synchronous devices and a ratio between an amount of wiring delay and an amount of transistor delay in each of the plurality of clock signal supply paths is adjusted to an equal specified value within a 20% error based on an arrangement of the plurality of synchronous devices or on timing constraints.

30. The clock circuit of claim 29, wherein the equal specified value is a ratio between an amount of wiring delay and an amount of transistor delay in a critical path of the integrated circuit.

* * * * *

UNITED STATES PATENT AND TRADEMARK OFFICE
CERTIFICATE OF CORRECTION

PATENT NO. : 6,473,890 B1
DATED : October 29, 2002
INVENTOR(S) : Takuya Yasui et al.

It is certified that error appears in the above-identified patent and that said Letters Patent is hereby corrected as shown below:

<u>Title page,</u>
Insert Item -- [73] Assignee: Matsushita Electric Industrial Co., LTD., Osaka (JP); Atsushi Takahashi, Kanagawa (JP); Yoji Kajitani, Kanagawa (JP) --

Signed and Sealed this

Twenty-first Day of June, 2005

JON W. DUDAS
*Director of the United States Patent and Trademark Office*